US012124247B2

(12) United States Patent
Zhou et al.

(10) Patent No.: US 12,124,247 B2
(45) Date of Patent: Oct. 22, 2024

(54) IMPLEMENTATION OF DEEP NEURAL NETWORKS FOR TESTING AND QUALITY CONTROL IN THE PRODUCTION OF MEMORY DEVICES

(71) Applicant: SanDisk Technologies LLC, Addison, TX (US)

(72) Inventors: Fei Zhou, San Jose, CA (US); Cheng-Chung Chu, Milpitas, CA (US); Raghuveer Makala, Campbell, CA (US)

(73) Assignee: SanDisk Technologies LLC, Addison, TX (US)

( * ) Notice: Subject to any disclaimer, the term of this patent is extended or adjusted under 35 U.S.C. 154(b) by 654 days.

(21) Appl. No.: 17/465,305

(22) Filed: Sep. 2, 2021

(65) Prior Publication Data
US 2021/0397170 A1 Dec. 23, 2021

Related U.S. Application Data

(63) Continuation-in-part of application No. 16/870,070, filed on May 8, 2020, now Pat. No. 11,947,890.
(Continued)

(51) Int. Cl.
*G05B 19/418* (2006.01)
*G05B 13/02* (2006.01)
*H01L 21/66* (2006.01)

(52) U.S. Cl.
CPC ..... *G05B 19/41875* (2013.01); *G05B 13/027* (2013.01); *H01L 22/20* (2013.01);
(Continued)

(58) Field of Classification Search
USPC ......................................................... 700/121
See application file for complete search history.

(56) References Cited

U.S. PATENT DOCUMENTS 11,022,966 B1\* 6/2021 Kulkarni ................. G03F 1/70
11,099,137 B2 8/2021 Rosenberg et al.
(Continued)

FOREIGN PATENT DOCUMENTS

KR 10-2018-0090385 A 8/2018
WO WO2021/001109 A1 1/2021

OTHER PUBLICATIONS

International Preliminary Report on Patentability dated Mar. 14, 2024, International Application No. PCT/US2022/030628.
(Continued)

*Primary Examiner* — Bryce M Aisaka
(74) *Attorney, Agent, or Firm* — Vierra Magen Marcus LLP

(57) ABSTRACT

Techniques are presented for the application of neural networks to the fabrication of integrated circuits and electronic devices, where example are given for the fabrication of non-volatile memory circuits and the mounting of circuit components on the printed circuit board of a solid state drive (SSD). The techniques include the generation of high precision masks suitable for analyzing electron microscope images of feature of integrated circuits and of handling the training of the neural network when the available training data set is sparse through use of a generative adversary network (GAN).

19 Claims, 42 Drawing Sheets

Related U.S. Application Data

(60) Provisional application No. 62/846,171, filed on May 10, 2019.

(52) U.S. Cl.
CPC ............ *G05B 2219/32335* (2013.01); *G05B 2219/32368* (2013.01); *G05B 2219/45031* (2013.01)

(56) References Cited

U.S. PATENT DOCUMENTS

| | | | |
|---|---|---|---|
| 2006/0216857 | A1 | 9/2006 | Zhao |
| 2013/0195346 | A1 | 8/2013 | Wataru et al. |
| 2018/0322234 | A1* | 11/2018 | Cao .................. G06F 30/39 |
| 2019/0080036 | A1* | 3/2019 | Dai .................. G06F 30/327 |
| 2019/0197368 | A1 | 6/2019 | Madani et al. |
| 2020/0356718 | A1 | 11/2020 | Chu et al. |
| 2021/0397170 | A1 | 12/2021 | Zhou et al. |

OTHER PUBLICATIONS

Notice of Allowance dated Feb. 12, 2024, U.S. Appl. No. 16/870,070, filed May 8, 2020.
Non-final Office Action dated Sep. 12, 2023, U.S. Appl. No. 16/870,070, filed May 8, 2020.
Response to Office Action dated Nov. 29, 2023, U.S. Appl. No. 16/870,070, filed May 8, 2020.
He, Kaiming, et al., "Mask R-CNN," Facebook AI Research (FAIR), [https://arxiv.org/abs/1703.06870], Jan. 24, 2018, 12 pages.
Girshick, Ross, et al., "Rich feature hierarchies for accurate object detection and semantic segmentation," Tech report (v5), [https://arxiv.org/abs/1311.2524], Oct. 22, 2014, 21 pages.
Ren, Shaoqing, et al., "Faster R-CNN: Towards Real-Time Object Detection with Region Proposal Network," [https://arxiv.org/abs/1506.01497], Jan. 6, 2016, 14 pages.
Girshick, Ross, "Fast R-CNN," [https://arxiv.org/abs/1504.08083], Sep. 27, 2015, 9 pages.
Goodfellow, Ian J., et al., "Generative Adversarial Nets," [https://arxiv.org/abs/1406.2661], Jun. 10, 2014, 9 pages.
Abdulla, Waleed, "Splash of Color: Instance Segmentation with Mask R-CNN and TensorFlow," [https://engineering.matterport.com/splash-of-color-instance-segmentation-with-mask-r-cnn-and-tensorflow-7c761e238b46], Mar. 20, 2018, 29 pages.
Hitachi, "CD-SEM—What is a Critical Dimension SEM?" [https://www.hitachi-hightech.com/global/products/device/semiconductor/cd-sem.html], downloaded on May 7, 2020, 7 pages.
Restriction Requirement dated Jul. 24, 2023, U.S. Appl. No. 16/870,070, filed May 8, 2020.
International Search Report & The Written Opinion of the International Searching Authority dated Sep. 27, 2022, International Application No. PCT/US2022/030628.
English Abstract of KR Publication No. KR10-2018-0090385 published Aug. 10, 2018.

* cited by examiner

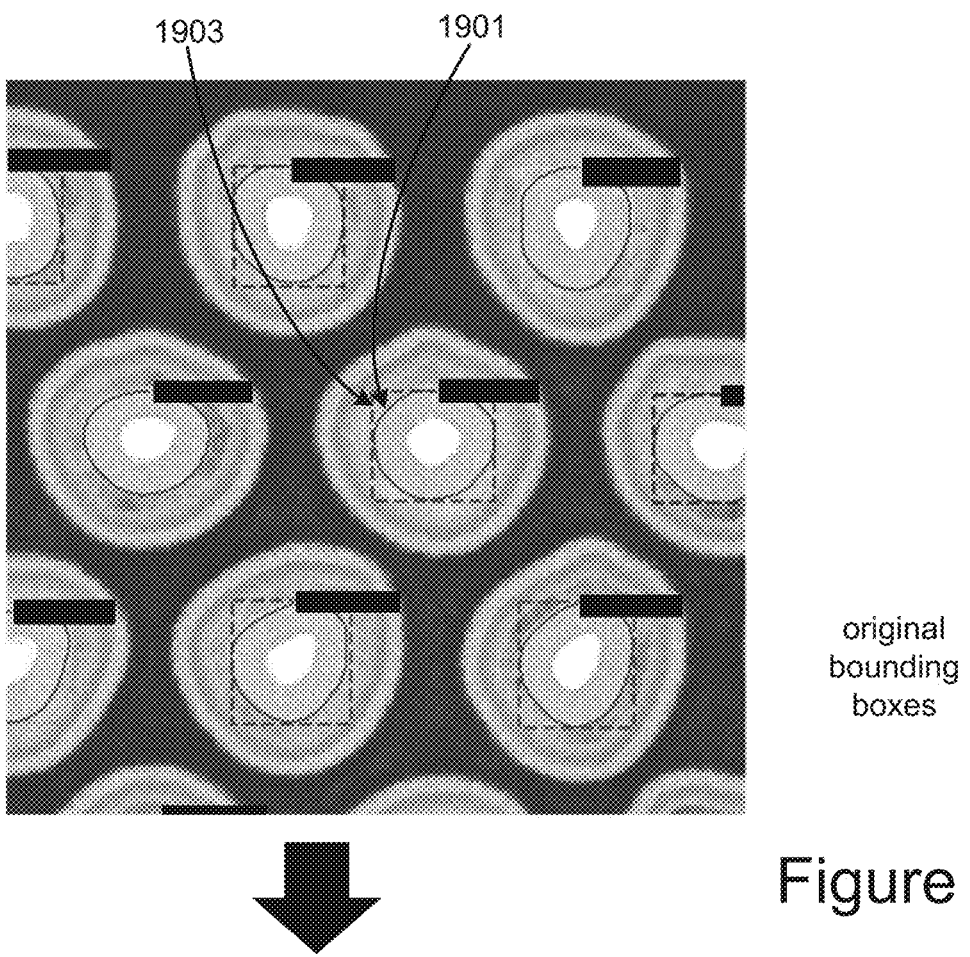
original bounding boxes
Figure 19A
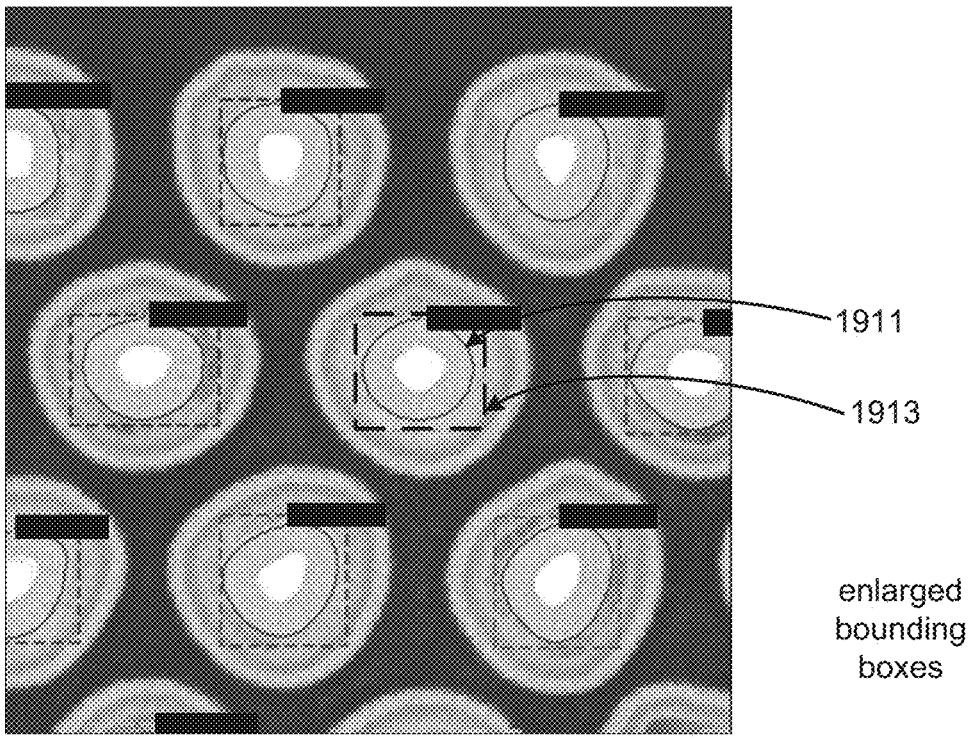
enlarged bounding boxes

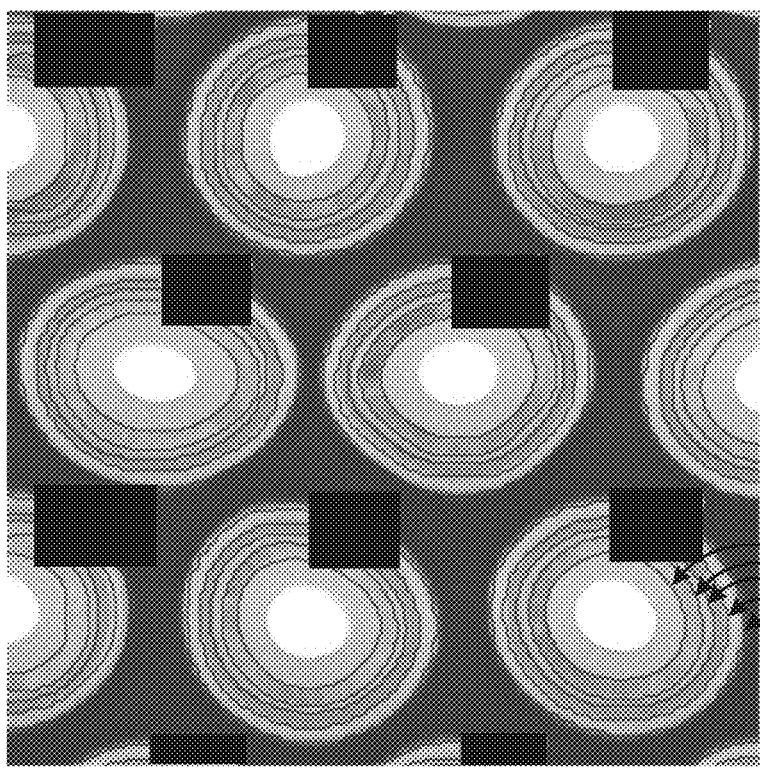
original mask predication
1921
Figure 19B
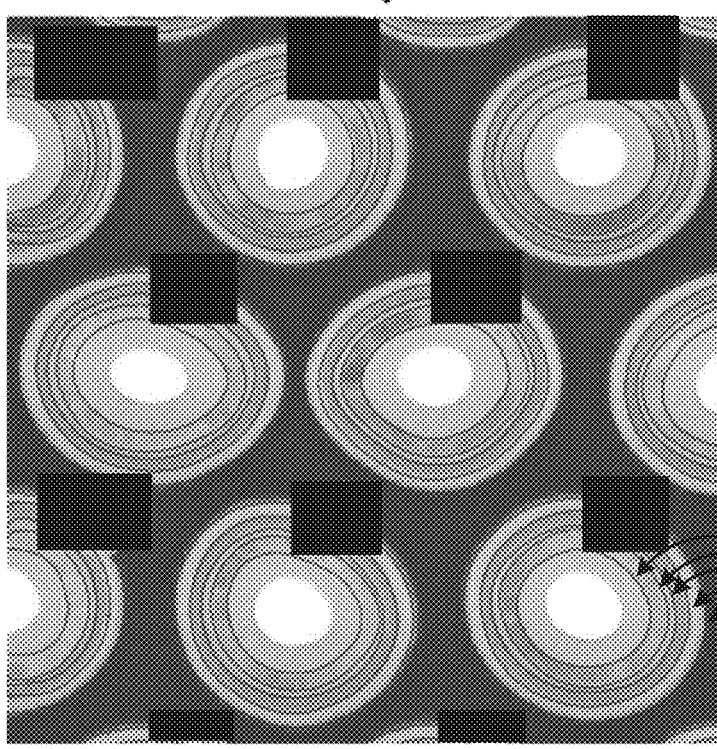
larger mask and/or more convolutional steps
1923

IMPLEMENTATION OF DEEP NEURAL NETWORKS FOR TESTING AND QUALITY CONTROL IN THE PRODUCTION OF MEMORY DEVICES

CROSS-REFERENCE TO RELATED APPLICATIONS

This application is a Continuation-in-Part of U.S. patent application Ser. No. 16/870,070, filed May 8, 2020, and issued as U.S. Pat. No. 11,947,890 on Apr. 2, 2024, which claims priority from U.S. Provisional Application No. 62/846,171, filed May 10, 2019, both of which are incorporated herein by reference.

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. The manufacture of memory devices and other electronics can involve large amounts of testing for the purpose of quality control, both to determine defective devices and to determine adjustments of manufacturing parameters. Consequently, there are a number of areas in the fabrication process where neural network might be successfully applied.

BRIEF DESCRIPTION OF THE DRAWING

FIGS. 19A and 19B illustrate the effect of the extension to a P-Mask R-CNN on the bounding box prediction error and the insufficient mask resolution error, respectively.

DETAILED DESCRIPTION

In the course of manufacturing of memory devices or, more generally other integrated circuits and electronic devices, many testing and inspection operations are typically performed. The testing can occur at many stages during manufacturing and also afterwards to determine defects and process variations. The testing results can be used to determine defective, or potentially defective, devices, sort devices according to their characteristics, or to adjust processing parameters. To be able to perform these test processes more accurately and efficiently, the following presents a number of techniques using Convolution Neural Networks (CNNs).

In a first set of embodiments, the use of neural networks is applied to integrated circuits, specifically using an example of non-volatile memory chips. To analyze the detail of the integrated circuits, images can be taken by electron microscope and analyzed by a CNN at the pixel level. To examine the chips at various processing levels, a chip can be prepared for the imaging by paring back a finished chip to the desired level or by examining a partially completed chip. Other embodiments for the use of neural networks consider analyzing the placement of circuit elements onto a printed circuit board, where techniques are described to more accurately train a neural network when the training data sets are sparse.

The name "convolutional neural network" in convolutional neural networks or CNNs indicates that the neural network employs a mathematical operation called convolution, that is a specialized kind of linear operation. Convolutional neural networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 1:
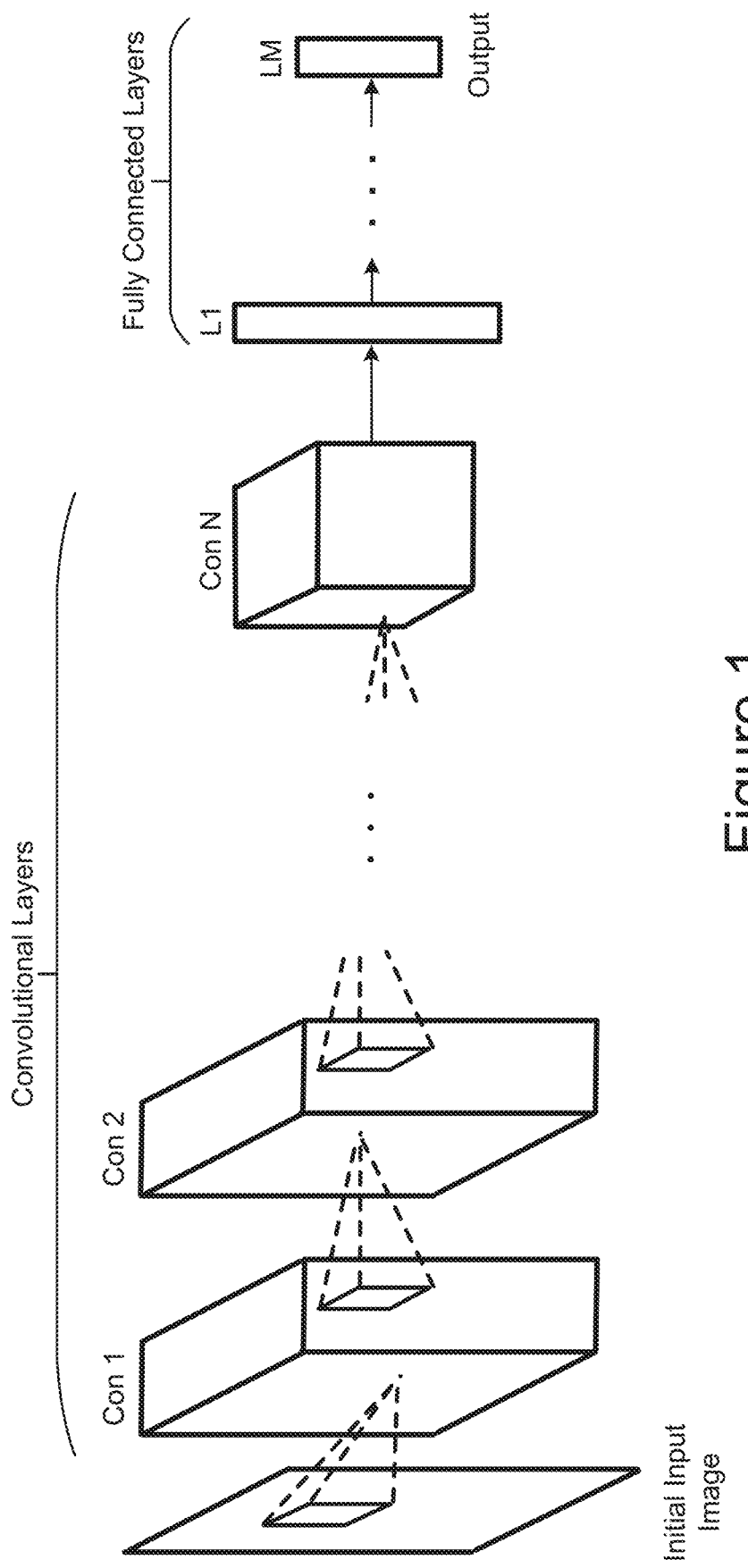
FIG. 1 is a schematic representation of an example of a convolutional neural network (CNN).

FIG. 1 is a schematic representation of an example of a CNN. FIG. 1 illustrates an initial input image of an array of pixel values, followed by a number convolutional layers that are in turn followed by a number of fully connected layers, the last of which provides the output. Each neuron in the first convolutional layer (Con 1) takes as input data from an n x n pixel sub-region of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Con 1 to Con N) using each layer's learned weights, after which it is propagated through the fully connected layers (L1 to LM) using their learned weights.

Figure 2:
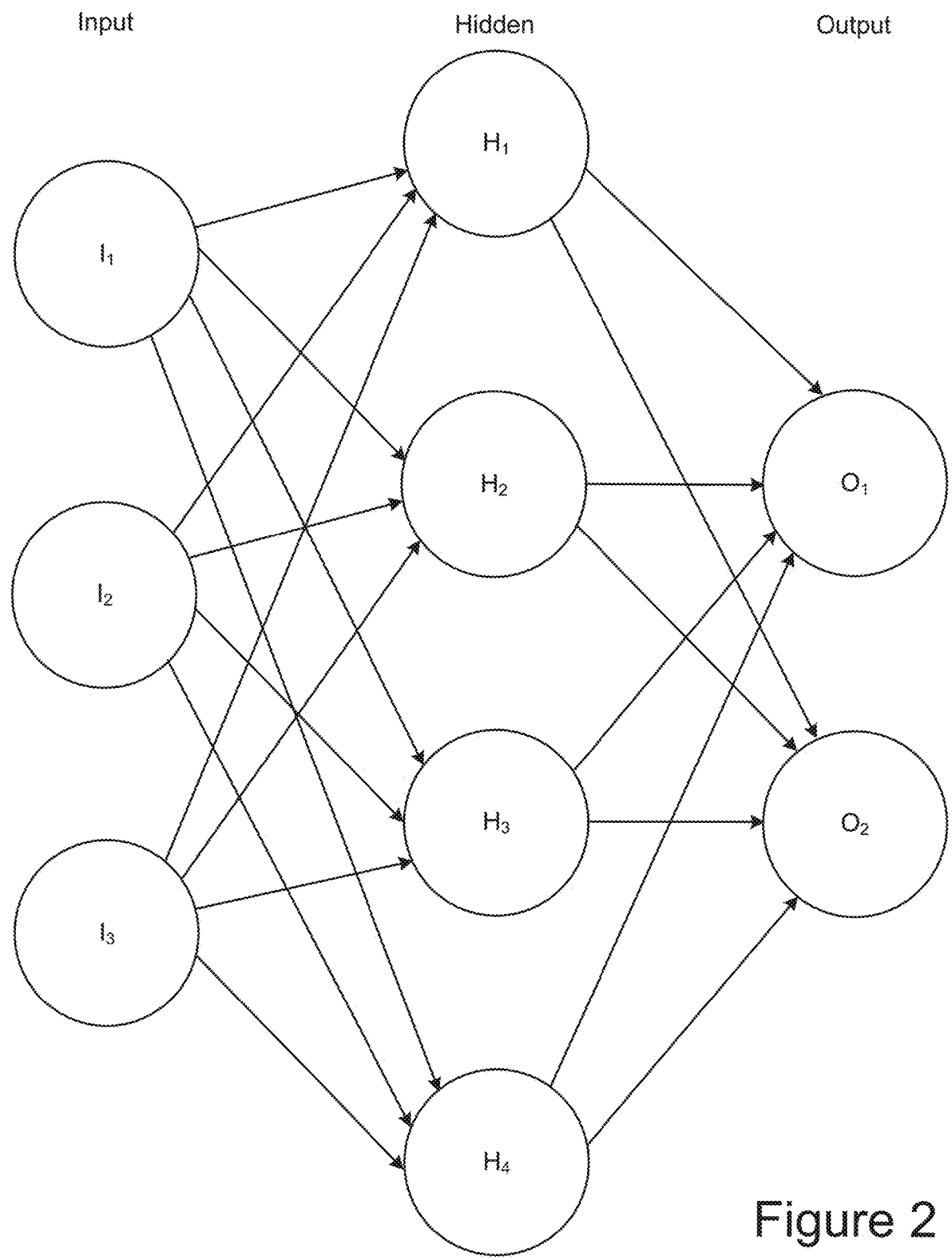
FIG. 2 represents several fully connected layers of a neural network in more detail.

FIG. 2 represents several fully connected layers of a neural network in more detail. In FIG. 2 the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually, each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer) to the last layer (the output layer), possibly after traversing the layers multiple times. Although FIG. 2 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the neural network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 3B:
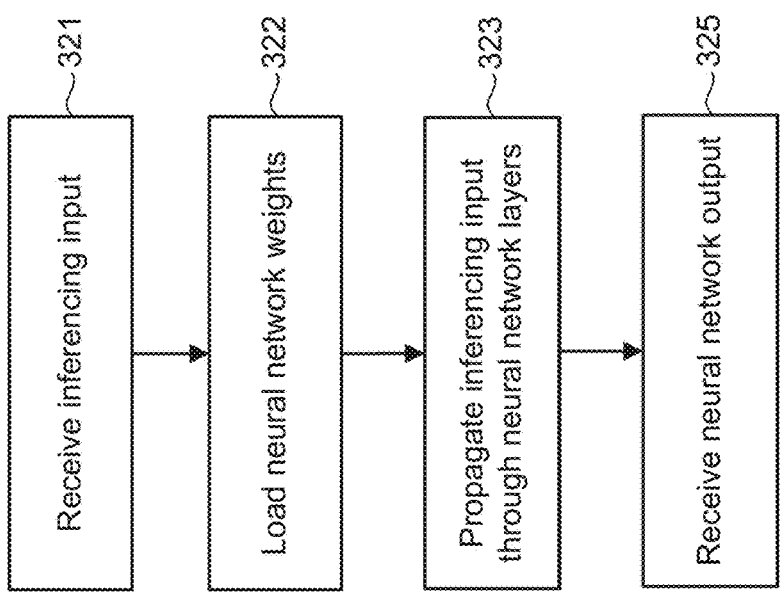
FIG. 3B is a flowchart describing one embodiment of a process for inference using a neural network.
Figure 3A:
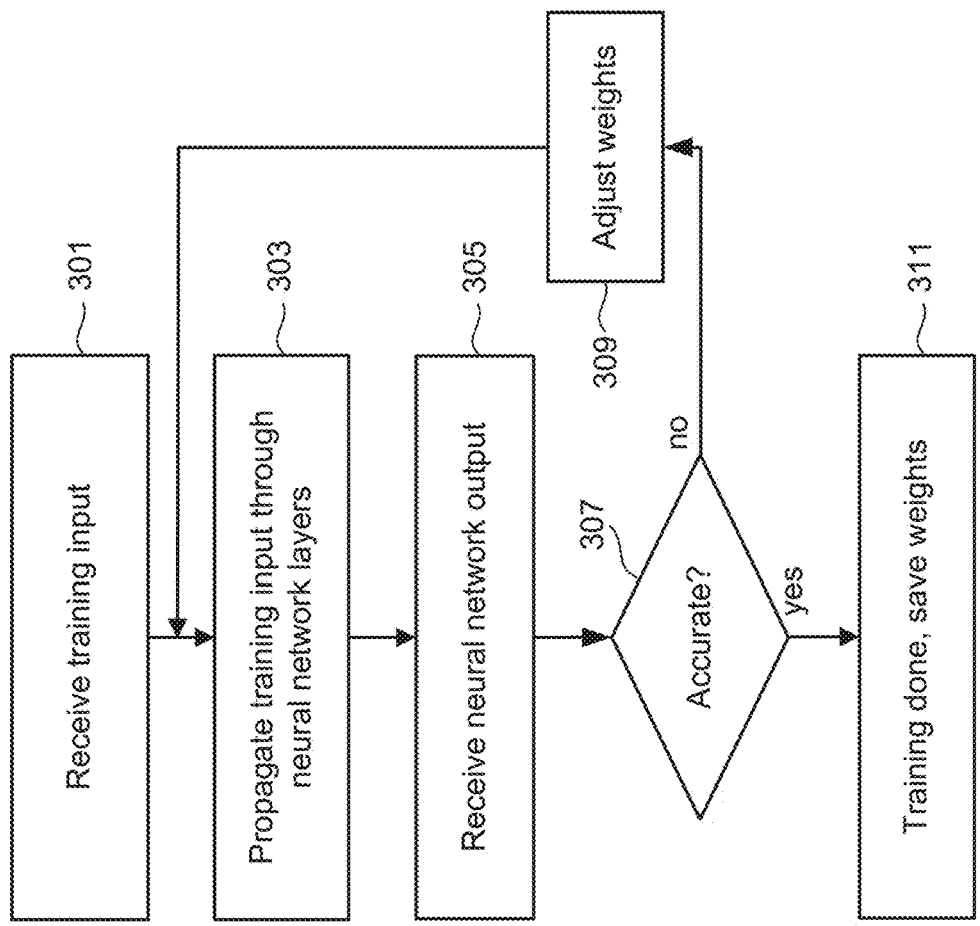
FIG. 3A is a flowchart describing one embodiment of a process for training a neural network to generate a set of weights.

FIG. 3A is a flowchart describing one embodiment of a process for training a neural network to generate a set of weights. The training process is often performed in the cloud, allowing additional or more powerful processing to be accessed. At step 301, the training input, such as a set of images, is received (e.g., the image input in FIG. 1). At step 303 the input is propagated through the layers connecting the input to the next layer (e.g., CON1 in FIG. 1 using the current filter, or set of weights. The neural network's output is then received at next layer (e.g., CON2 in in FIG. 1) in step 305, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 305. A user can then review the results at step 307 for accuracy so that the trainings system can select which probabilities the neural network should return and decide whether the current set of weights supply a sufficiently accurate labelling and, if so, the training is complete (step 311). If the result is not sufficiently accurate, the neural network adjusts the weights at step 309 based on the probabilities the user selected, followed by looping back to step 303 to run the input data again with the adjusted weights. Once the neural network's set of weights have been determined, they can be used to perform an "inference" process, which is the process of using the determined weights to generate an output result from data input into the neural network. Once the weights are determined at step 311, they can then be stored in non-volatile memory for later use, where the storage of these weights in non-volatile memory is discussed in further detail below.

FIG. 3B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 321, the inferencing input is received, such as the image of a dog in the example used above. If the previously determined weights are not present in the device running the neural network application, they are loaded at step 322. For example, on a host processor executing the neural network, the weight could be read out of an SSD in which they are stored and loaded into RAM on the host device. At step 323, the input data is then propagated through the neural network's layers. Step 323 will be similar to step 303 of FIG. 3A, but now using the weights established at the end of the training process at step 311. After propagating the input through the intermediate layers, the output is then provided at step 325.

Neural networks are typically feedforward networks in which data flows from the input layer, through the intermediate layers, and to the output layer without looping back. At first, in the training phase of supervised learning as illustrated by FIG. 3A, the neural network creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Looking now at the application of deep learning neural networks to process health monitoring from the fabrication of integrated circuits, the situation for the processing of a non-volatile memory circuit is considered. In process analysis, there is a lot of electron microscope work (such as a Scanning Electron Microscope (SEM) or Transmission Electron Microscope (TEM)) work that is involved in testing of the integrated circuits. One critical factor in determining process health of the fabrication process is feature uniformity. Inspection of electron microscope images and the analysis of the features in the resultant images can involve a large amount of manual labor, taking large amounts of time and effort to determine the health level of a process. To improve upon this situation, a deep learning neural network (such as a Mask Regional Convolution Neural Networks (Mask R-CNNs), as described below) that is trained in such a way as to detect the presence and absence of healthy process features in electron microscope images can be useful. Such a network determines healthy/unhealthy process features that can be tallied, and a healthy to unhealthy ratio provided to assess the process health. Previously, electron microscope images of process features were analyzed visually by people to determine healthy versus unhealthy process features, but the techniques presented here shift that determination process to a neural net to reduce the human effort and produce a scalable method of analysis of process health.

Considering the implementation of a deep learning neural net (Mask R-CNN), for instance segmentation of electron microscope images in more detail, the following looks at instance segmentation; the evolution of regional convolution neural networks; and a high level description of mask R-CNNs. The process is then illustrated for some image results and the applications of Mask R-CNN and is targeted towards training and implementing a deep learning convolution neural network for instance segmentation of electron microscope images. This technique can be used in various areas such memory hole uniformity/shape detection, physical failure analysis, electron microscope image segmentation, transistor gate uniformity, contact placement for the electrical contacts of bonded die pairs, and other aspects of memory chip processing.

Image segmentation is the task of identifying object outlines at the pixel level. Image segmentation begins with "classification", which identifies the type of objects (e.g., a person or a dog) in the image. After the objects are classified, "semantic segmentation" is performed, in which the pixels within the image that correspond to the object identified in classification phase (e.g., the person) are identified. Semantic segmentation is followed by "object detection", in which all of the instances of the classified objects (e.g., multiple people in the image), along their locations, are detected within the image. Each of these instances can then each be placed within a "bounding box", which encloses a region of the image that contains an instance. Image segmentation then moves on to "instance segmentation", placing each instance of the object at an identified locations determining the pixels of image that belong to each instance of the object.

Image segmentation is a challenging endeavor because it requires the correct detection of all examples of an object in an image, while also precisely segmenting each instance. A technique deployed to achieve this is called Mask R-CNN, which extends other techniques R-CNN by adding branching for predicting an object mask in parallel with the existing branch for bounding box recognition. FIG. 4-7 look at some aspects of these techniques in more detail.

Figure 4:
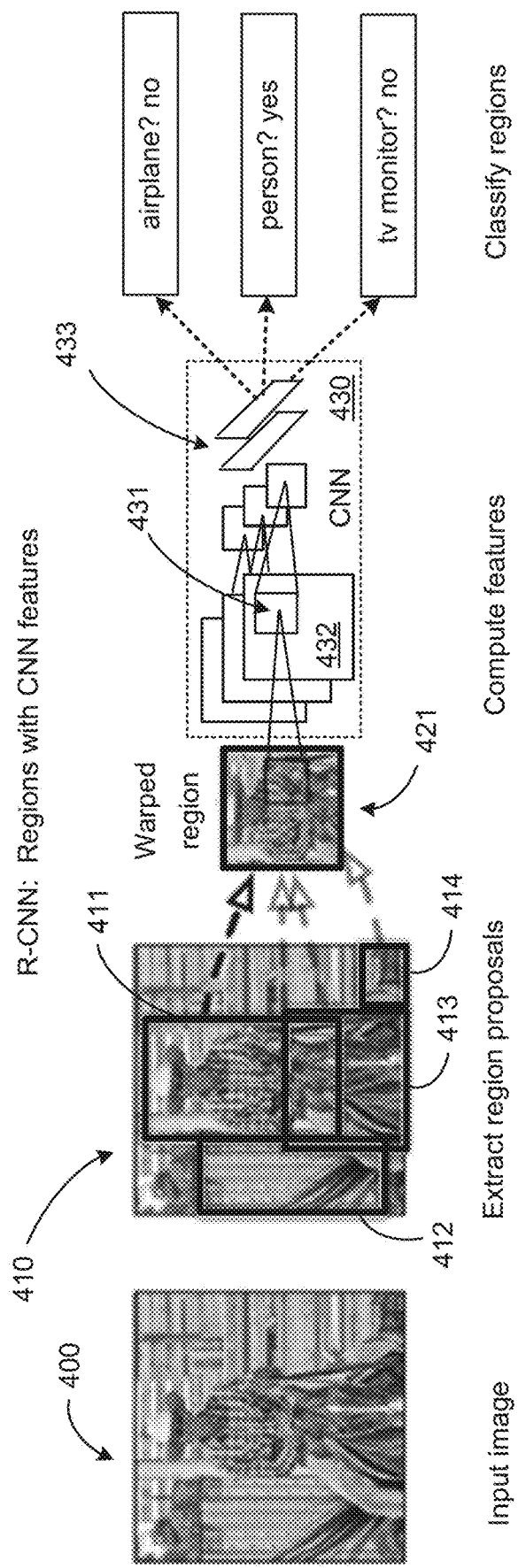
FIG. 4 illustrates the use of Regional Convolution Neural Networks (R-CNNs).

Before considering Mask R-CNNs, FIG. 4 looks at R-CNNs. More specifically, FIG. 4 illustrates some steps in the use of a R-CNN. An R-CNN is aimed at taking an input image 400, and correctly identifying where the principal objects in the image are located. An R-CNN performs this by use of bounding boxes that introduce a window around candidates for the principal objects in the image. R-CNN uses a process called "selective search" which looks at the image through windows of different sizes, as shown at 411, 412, 413, and 414 in the image 410 in order to extract region proposals, and for each size attempts to group adjacent pixels by properties such as texture, color, or intensity to identify objects. As CNNs typically work best with a standardized image size, once the proposals in image 410 are created, R-CNN warps the region to a standard size image 421 (corresponding the proposal 411) and runs it through a CNN 430, such as AlexNet or another publicly available CNN, to determine the object in the warped image and compute features. This is done for each of the extracted region proposal, as show for the warped image 421 being placed into the CNN layer 432. (CNNs typically use a standardized, or fixed, sized image so that the feature size matches the model size, which is fixed, so that if the input image size is different it can be re-sized to fit the model for the neural network.) Each of the other extracted region proposals is similarly treated. A final set of layers 433 of the CNN 430 classifies whether a region is an object and, if so, then what is the object. In this example, the identified object of proposal 411 is a person.

Figure 5:
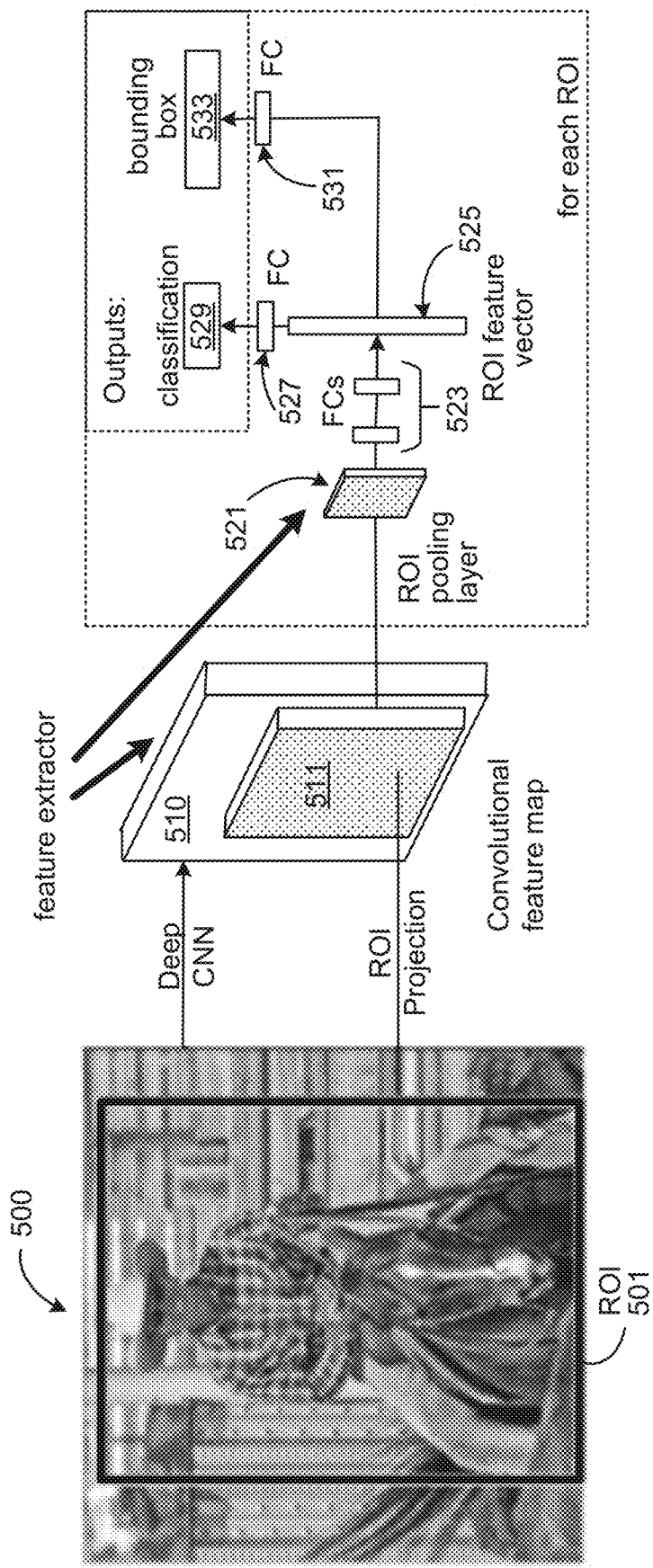
FIG. 5 illustrates the use of a Fast R-CNN.

The R-CNN approach can be further enhanced by the introduction of what are known as Fast R-CNN and Faster R-CNN, as represented in FIG. 5. FIG. 5 considers the same input image as in FIG. 4, but introduces the concept of generating proposals from an output of the layers, or "feature map", by applying weights within the layers of the R-CNN to filter the input image to determine locations for features within the image, instead of using methodologies such as selective search. In a Fast R-CNN as illustrated FIG. 5, the feature extractor, classifier, and regressor are joined together in as a combined propagation through the neural network, starting from the input image and generating classification and bounding boxes for the objects of the input image.

Starting from the input image 500, a Region Of Interest (ROI) 501 is determined for the input image. The input image 500 is the input for convolutional layers of the deep CNN 510, where the ROI 501 is projected into corresponding region 511 of the neural network's layers. The ROI is propagated through the convolutional layers of the deep CNN, that act as a feature extractor, leading to a pooling layer 521 for the propagation corresponding to the ROI 501. An image 500 may have several ROIs and the process is repeated for each ROI.

For each ROI, the pooling layer 521 is propagated through a number of fully connected (FC) layers 523 to generate a feature vector 525 for the ROI. The ROI feature vector 525 is then propagated through fully connected layers 531 of a bounding box path to provide a bounding box 533 for an object in ROI 501. The ROI feature vector 525 is also propagated through fully connected layers 527 of a classifier path to provide a classification 529 for an object within the bounding box 533 for the ROI 501.

Mask R-CNN techniques extend R-CNN by going one step further and locating each of the pixels belonging to each object instead of just the bounding boxes associated with each object. At a high level, Mask R-CNN accomplishes this location of the pixels belonging to each object by adding a branch to Faster R-CNN to carry out pixel level segmentation and provide input if a given pixel is part of an object. This is illustrated in FIG. 6.

Figure 6:
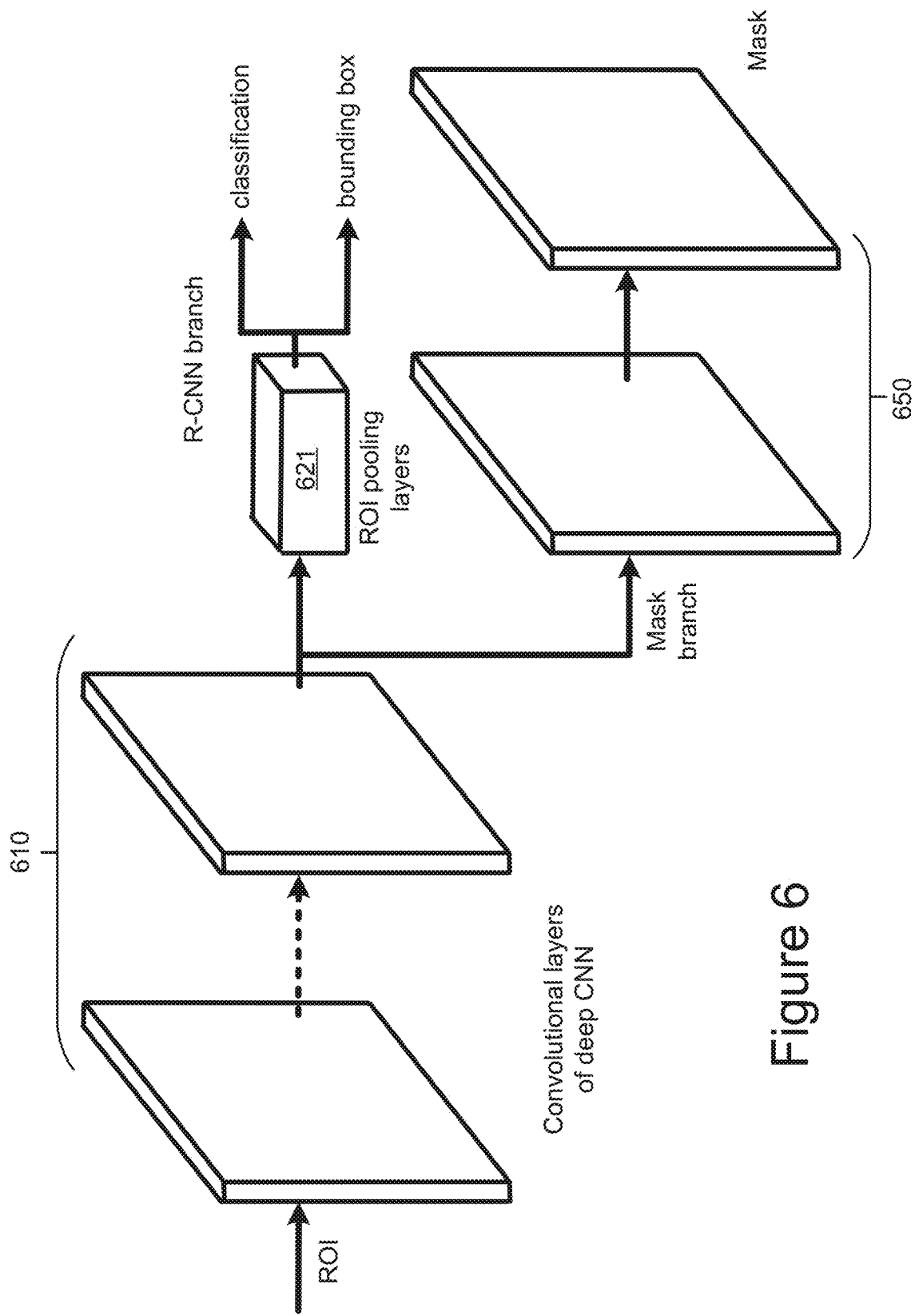
FIG. 6 illustrates a Mask R-CNN.

FIG. 6 illustrates the use of a Mask R-CNN. A region of interest (ROI) is propagated through several convolutional layers 610 of neural network, corresponding to those of the deep CNN 510 of FIG. 5. The region of interest is then processed by the R-CNN branch that goes to ROI pooling 621, which corresponds to the ROI pooling layer 521 and subsequent elements of FIG. 5 that provides both a classification result and a bounding box. The output of the convolutional layers 610 now also go into a mask branch represented by the convolutional or fully connected layers 650, which generate a mask. The Mask R-CNN architecture can be broken down into a feature extraction portion of the network, or "backbone", and a Regional Proposal Network (RPN), that can be included in the convolutional layers 510 or 610 of FIGS. 5 and 6. The R-CNN branch uses ROI pooling at 621 for classification and bounding box determination, while the mask branch performs alignment and mask determination, as illustrated by the flow of FIG. 7.

Figure 7:
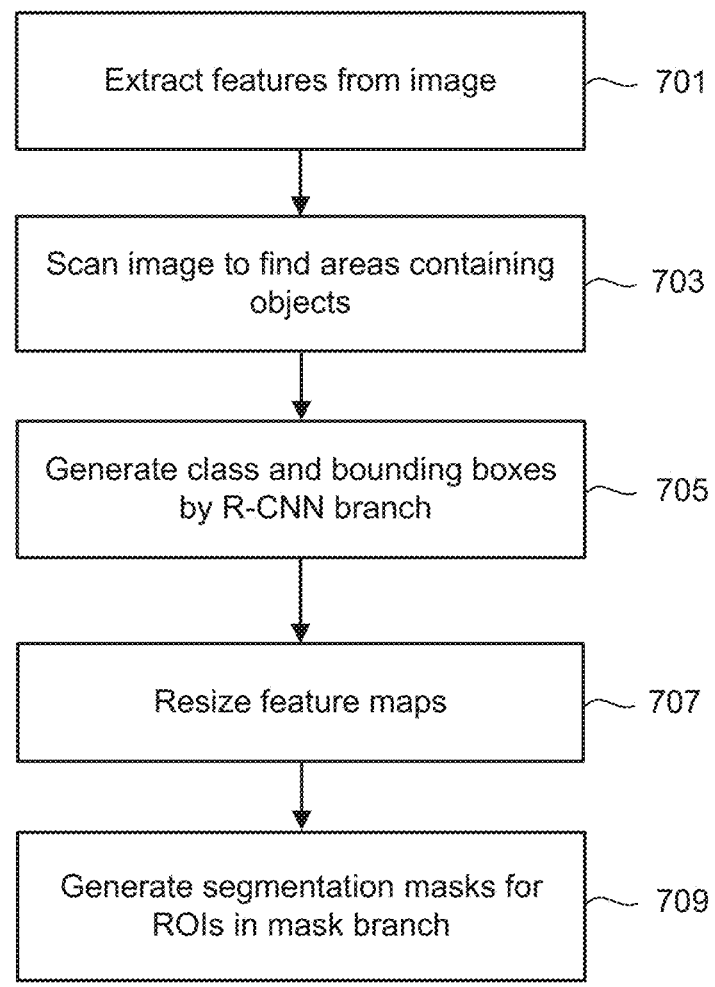
FIG. 7 is a flow of one embodiment for implementing of a Mask R-CNN.

FIG. 7 is a flow chart of one embodiment for implementing of a Mask R-CNN. At 701, the feature extraction layers of the deep CNN propagate the input image through the layers of the neural network, extract features (the outputs generated by the weights in each of the hidden layers) that form an image and create an input, or feature map, for the subsequent layer. The feature extraction portion of the Mask R-CNN can be a standard convolutional neural network. The feature maps generated in the early layers of the deep CNN can detect low level features (edges and corners), and later layers successively detect higher level features (car, person, sky).

The Regional Proposal Network (RPN) portion of the deep CNN can scan the image at step 703 in a sliding-window fashion and finds areas that contain objects. These regions are called anchors. The RPN scans all the regions in parallel (such as on a GPU). The RPN can scan over the feature map from step 701, allowing the RPN to reuse the extracted features efficiently and avoid duplicate calculations. The process can pick the top anchors that are most likely to contain objects and refine their location and size. The final proposals (for the ROI) are passed on to the R-CNN branch at step 705 and the mask branch of step 709.

At step 705 the R-CNN branch propagates on the ROIs proposed by the RPN. Like the RPN, it generates two outputs for each ROI, a class (e.g., Person, Car, Chair, etc.), and a bounding box that can further refine the location and size of the bounding box encapsulating the object. As classifiers do not handle variable input size very well and typically require a fixed input size for an image, step 707 the R-CNN can crop a part of the feature map and resizes it to a fixed size if needed. This allows for the input image to match the standardized, or fixed, image size of the model, if needed. Due to the possible refinement of the bounding box in the RPN at step 705, the ROI boxes can have different sizes, which is where the ROI pooling 521, 621 of FIGS. 5 and 6 can be applied. This process is similar in principle to cropping part of an image and then resizing it, although there may be differences in implementation details. Bounding boxes are considered in more detail below with respect to the P-Mask R-CNN discussion.

The Mask R-CNN, as shown in the lower, mask branch of FIG. 6, is a convolutional network that takes the positive regions selected by the ROI classifier and generates masks for them at step 709. The generated masks can be low resolution in some embodiments, or can be "soft" masks (represented by floating point values), so they hold more detail than binary-valued (or "hard") masks. Use of a small mask size can help keep the mask branch relatively light computationally.

Depending on the resolution of the image, the neural network can be trained to look for various markers within an electron microscope image and improve process feedback time. A first set of embodiment uses this methodology to look for uniformity of memory holes of a three dimensional memory circuit at various word line cross-sections. For example, the network can be trained to look for the circularity of the "memory hole" feature described with respect to FIG. 8-10. If the neural network cannot detect that the memory hole is circular (at the pixel level), it will not generate a bounding box and mask around it. The neural network can also be trained to look for other aspects, such as semi-circles or elliptical shapes. Statistics, such as expected Circular Memory holes per image vs. Expected Data, can be generated and fed back for improvements in the fabrication process.

Figure 8:
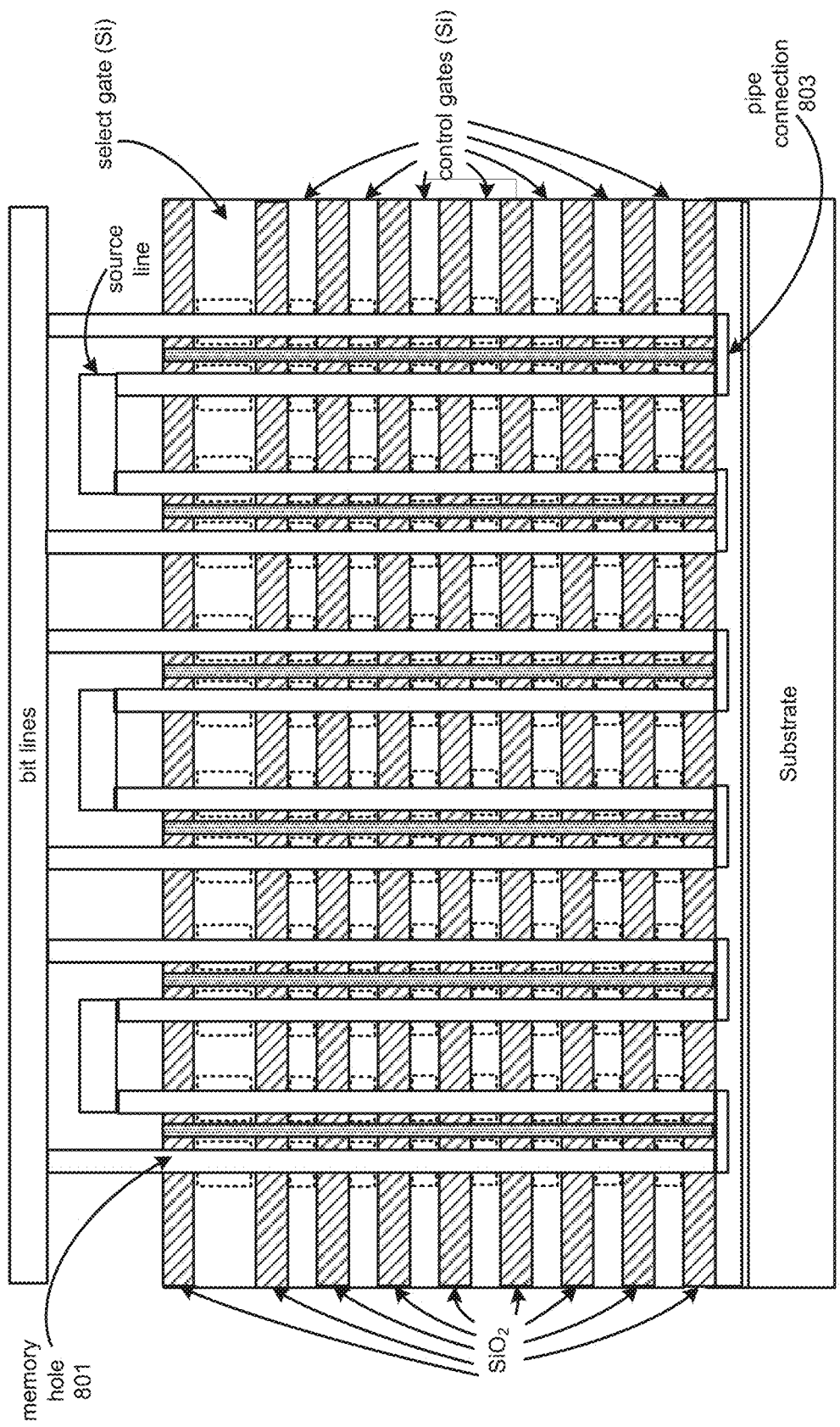
FIG. 8 is a drawing of a three dimensional non-volatile memory device of the BiCS type.

To provide some context for the primary example of an integrated circuit to which a neural network is applied in the following, FIG. 8 is a drawing of a three dimensional non-volatile memory device of the Bit Cost Scalable (BiCS) type. In FIG. 8, a number of memory holes, such as marked at 801, extend down from bit lines to a substrate, passing through silicon layers (Si) corresponding to the word lines that form the control gates layers surrounding the memory holes. In between the control gate layers are dielectric layers ($SiO_2$). The BiCS structure of FIG. 8 is of the U type, where a memory hole extends downward to a pipe connection, such as marked at 803, in the substrate that connects it to another memory hole that then extends upward to a source line. Together, the two sections form a NAND string between a bit line and a source line, where a select gate line is formed on the ends of the NAND strings between the memory cells and the bit lines on one end and the source lines on the other end. The memory cells are formed in the memory holes in the regions where the holes pass through the control gate layers.

In the illustration of FIG. 8, only a few control gate layers are shown and a U-type structure is used. A typical BiCS structure will have many more such layers and will often not use the U-type structure, but will have the source lines connected along the bottom of the memory hole/NAND string at the substrate end, as illustrated in FIG. 9.

Figure 9:
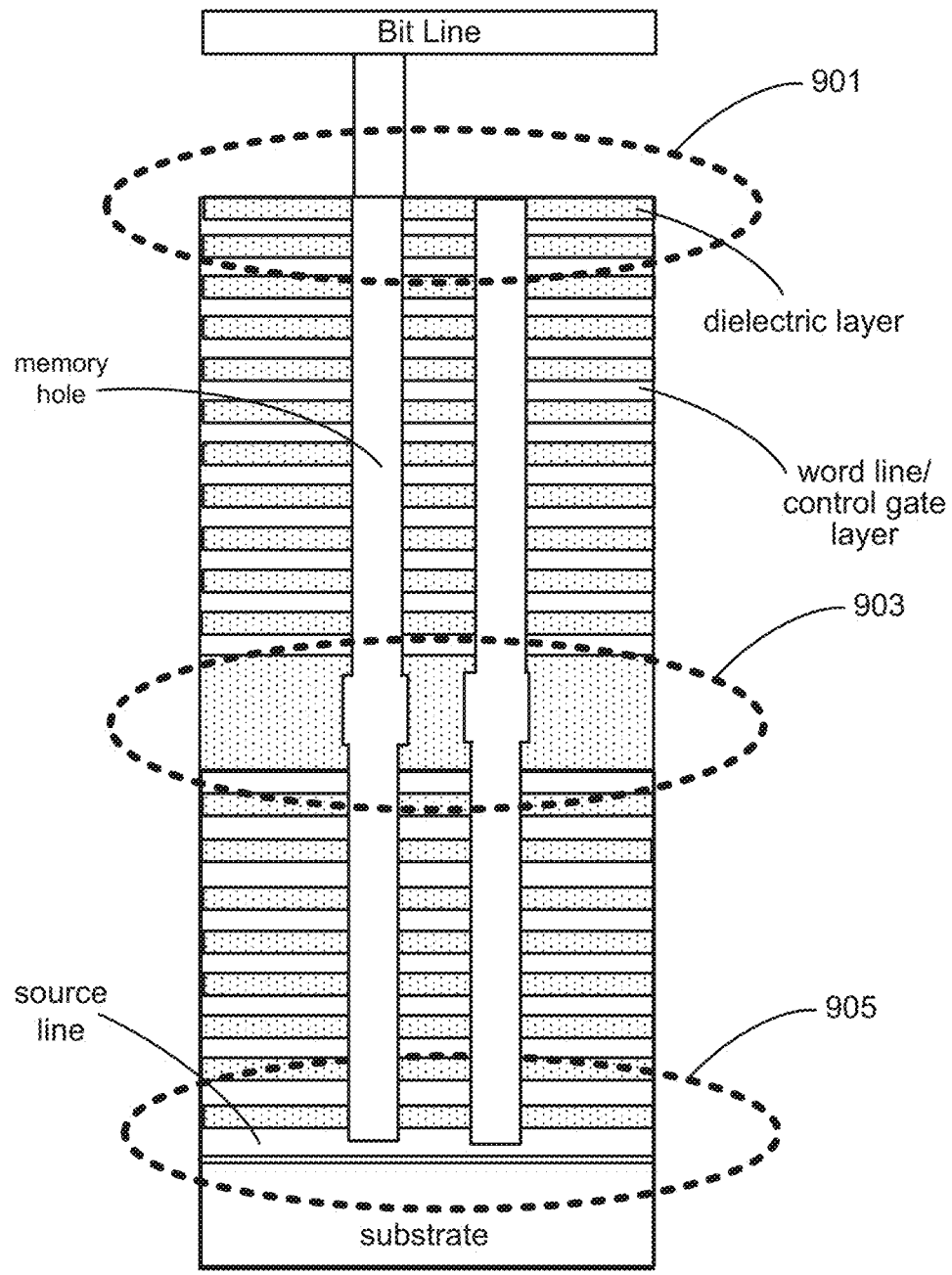
FIG. 9 represents a side view cross-section of a BiCS structure and its memory holes.

FIG. 9 represents a side view cross-section of a BiCS structure and its memory holes. In the processing to fabricate the structures of FIGS. 8 and 9, a large number of alternating control gate layers and dielectric layers are formed, connected between bit lines at top (top circled region, 901) and a source line at the bottom (bottom circuit region, 905). In the embodiment of FIG. 9, at a central circled region 903 is a joint region that divides the select gates into two halves. The formation of the memory holes through the control gate layers, dielectric layers, and other layers is a delicate and complex processing operation, which can be particularly delicate at the circled regions 901, 903, and 905 of FIG. 9. These regions comprise a bottom, "dimple" region formed under the memory holes in the substrate at the region 905; a central, joint region in 903 in central portion of the memory array structure; and a "shoulder" region at 901, where the memory hole opens up and connects to the bit lines. To form the memory cells, a number of concentric ring-like layers are formed within the memory holes.

Figure 10:
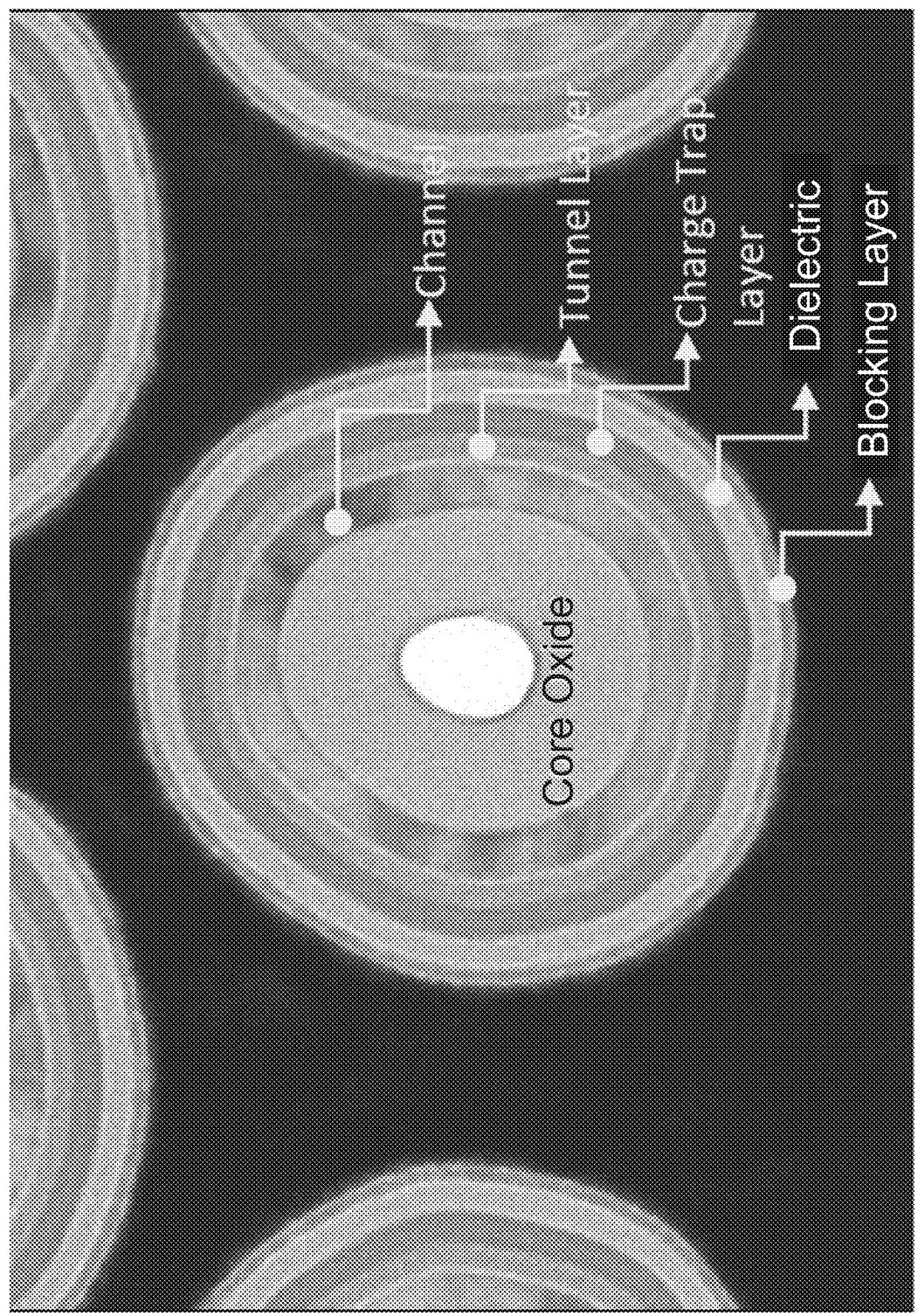
FIG. 10 is the top view of the layers formed within the memory hole to provide the memory cells of the NAND structure.

FIG. 10 is a top view of the layers formed within the memory hole to provide the memory cells of the NAND structure, showing a view from above horizontal cross-section taken at A-A part way down the structure of FIG. 9. The view of FIG. 10 can be prepared from a fully fabricated device that is pared back after processing is complete, or from an intermediate state of processing. Starting at the outside of the memory hole and working inward for this particular embodiment is a blocking layer followed by a dielectric layer. Next is a charge trap layer, in which the memory device stores electrons to determine the state of a memory cell. The charge trap layer is separated by a tunnel layer from the channel layer of the NAND string, with an inner core oxide formed inside of the channel layers.

In forming such a memory structure, the memory holes and the layers within them are formed to have generally circular cross-sections, with each of the layers meant to have a specified and uniform thickness. Due to process variations, the actual shapes and thicknesses of these layer will vary. Because of this, processing samples can be collected and analyzed to determine the quality of the integrated circuits. As the extremely large number of memory holes in a given device is extremely large, and the number of devices produced is also large, visual inspection by a person is very labor intensive process and, as a practical matter, only a small percentage of the memory holes on a given device, and only a small number of devices, can be inspected. Additionally, visual interpretation of an image as in FIG. 10 can be difficult, since determining questions of whether a layer is sufficiently circular or of sufficiently uniform thickness may not be obvious.

To improve upon this situation, neural networks can be applied, both to consider more instances and to do so more accurately. Embodiments described here can apply Mask R-CNN and Precision Mask R-CNN (P-Mask R-CNN, as described in more detail further below) techniques to this process. The CNN infrastructure described above can be used towards pixel level image segmentation of electron microscope images, as described with respect to FIG. 11.

Figure 11:
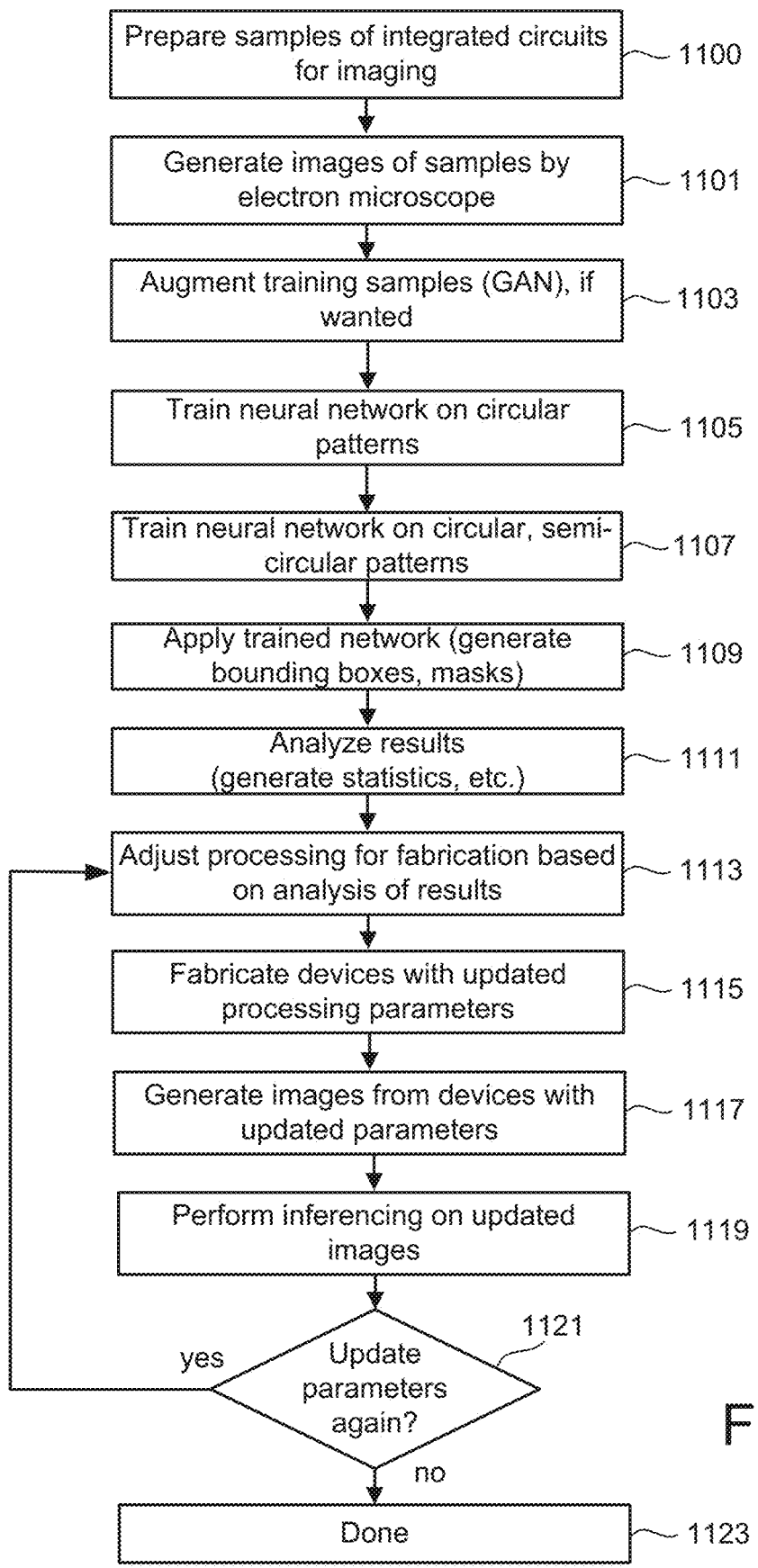
FIG. 11 is a flowchart for one embodiment of the application of Mask R-CNN to the memory hole example.
Figure 12C:
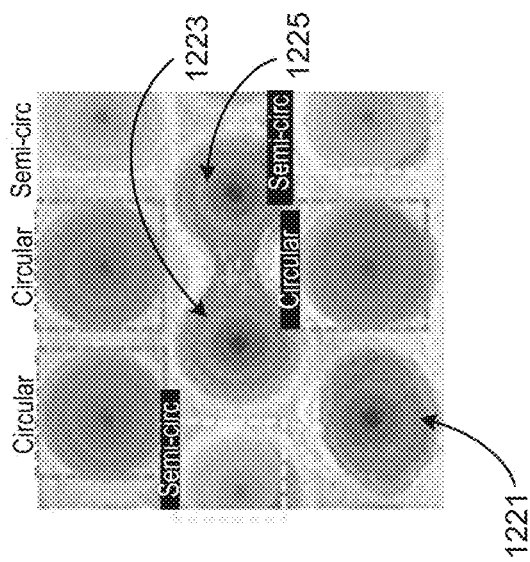
FIGS. 12A-12C are some image samples that can be used to illustrate the process of FIG. 11.
Figure 12B:
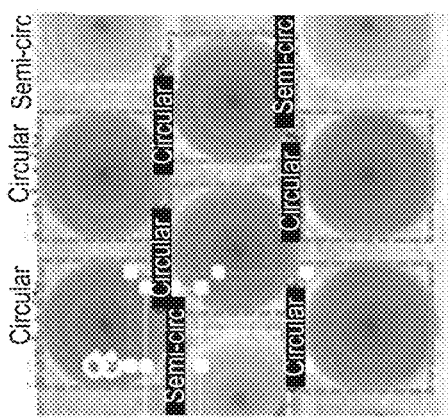
Figure 12A:
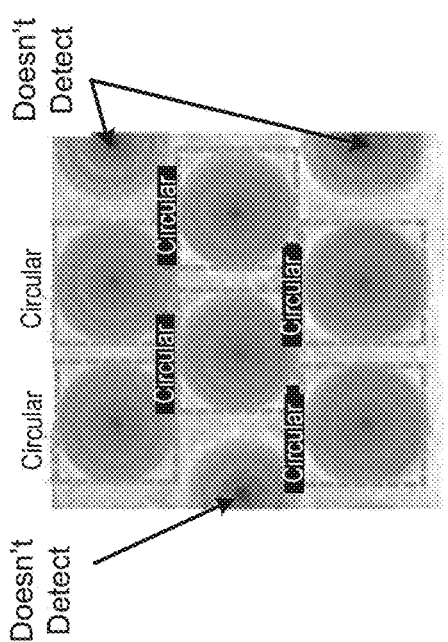

FIG. 11 is a flowchart for one embodiment of the application of Mask R-CNN to the memory hole example. FIGS. 12A-12C are image samples that can be used to illustrate such a process. (Please note that in FIGS. 12A-12C, as well as in similar figures such as FIGS. 13, 17, 18, and 21, black rectangles cover certain numerical values which have been blocked out. Such blocking boxes are not part of the original figures or features related to the shown structures or the neural network processes, but merely redaction.) This testing can be done as part of a normal test process during fabrication or in response to the occurrence of failed devices as part of failure analysis. The testing can also be done as part of a sorting or binning process (separating devices into lots of good/bad, good/bad/marginal, and or so) or monitor processing, where the results can be used to go back and adjust processing parameters.

Beginning at step 1100, samples of an integrated circuit are prepared for imaging. Depending on the embodiment, this can involve the fabrication of samples of the integrated circuit, such as by a sequence of processing steps to build up the circuit on a substrate, or receiving samples of the circuit. Depending on the features of interest, completed samples of the integrated circuit may be used, or the integrated circuits may be at some earlier stage of the fabrication process. For checking on some features, such as the memory hole structures of a three dimensional non-volatile memory circuit, a completed or partially completed circuit can be pared back through one or more layers to reach the layer of interest. The preparing of the integrated circuits for imaging can also include cleaning of the circuits and any needed mounting for generating the images.

At step 1101, a set of images are produced, such as by using an electron microscope on a set of memory chips or integrated circuits. As noted, to prepare the images, in some embodiments, a finished memory chip can be pared down to a desire level (such as the circled regions in FIG. 9) of the structure, or the device can be only partially completed (such as just the initial stages in order to considered the "dimple" regions where the lower end of the memory hole extends into the substrate). In the training phase, accurate results are usually based on creating a large enough pixel level dataset (using available software) to help train the network. In the case of a sparse data set, Image Augmentation can optionally be used to increase the sample size at step 1103, such as through use of a Generative Adversary Network, or GAN, as described in more detail below.

At step 1105 training is performed in order to be able to generate pixel level masks of features of the samples. In one set of embodiments for the memory hole example, this can be an initial training phase performed only on circular patterns. This is illustrated in FIG. 12A. Based how the electron microscope image formed, some of the memory holes will be only partially included since, although the hole may be circular, they are partially cut off by the edge of the image's framing, resulting in a semi-circular hole as illustrated in FIG. 12B.

The training can be extended to include such semi-circular holes at step 1107. CNN classifiers can be natively capable of detecting or classifying partial object, without requiring an additional training step or labeling. This is done through a process call image augmentation during training, where the images are intentionally cropped/resized/transformed to artificially increase the data size. Therefore, step 1107 can be considered part of step 1105 as no additional work or step may be needed for semi-circle objects. The training can also be taught to account for specks of debris, such as illustrated at the squares of FIG. 12B. Depending on the resolution of the image, the neural network can be trained to look for various markers within the electron microscope image and improve process feedback time. For illustration purposes, the described embodiment uses this methodology to look for uniformity of memory holes at various word line cross-sections, but this can be extended to other features of integrated circuits. To help improve the training process, samples of memory devices found to have defects can be included in the training process, as the neural network may be able to be trained to defect details that may not be readily apparent by visual inspection, but which can be extracted by the neural network.

At step 1109, the neural network can move to the inferencing phase and applied the trained neural network to generate bounding boxes and pixel level masks. For example, the neural network can be trained to look for the circularity of the memory hole. If the neural net cannot detect that the memory hole is sufficiently circular (at the pixel level), it will not generate a bounding box and mask around it. In other embodiments, the neural network can be trained to look for other aspects such semi-circles or elliptical shapes. An example of an inferencing result is illustrated in FIG. 12C, where three memory holes (1221, 1223, 1225) were not detected due to their normal shapes, with two of them merged (1223 and 1225) and one being more elliptical (1221). At step 1111, the inferencing results can be analyzed and used to generate data, including statistics such as expected Circular Memory holes per image vs. Expected Data. At step 1113, the statistics can be fed back into the processing operation to adjust the processing for fabricating the integrated circuit based upon the analysis of step 1111. At step 1115, the devices can then be fabricated with the updated processing parameter(s). For example, the time or parameters (such as temperatures or concentration levels) for various process steps can be changed. Referring back to FIG. 10, if, for example, memory holes are too small or too large the time for performing the etch to form the memory holes can be increased or decreased. If some of the layers within a memory hole are too thick or too thin, the time for depositing such a layer can be adjusted. If a layer is too non-circular, the rate at which it is formed could be slowed to obtain more uniformity by, for example, altering the temperature for the processing step or the concentration of the reactants.

The feedback of step 1113 can be performed in an iterative process in some embodiments, by including a loop of steps 1115, 1117, 1119, 1121, and 1123. At step 1115, the processing feedback of step 1113 is used in a new processing operation to manufacture one or more samples. At 1117, electron microscope images can then be generated, which are then used for inferencing at step 1119. Based on the results of the inferencing, step 1121 can determine whether another iteration is called for: if so, the flow can loop back to step 1113; and if not, the process can end at step 1123.

In the flow of FIG. 11, the processing steps for the fabrication of the integrated circuits at steps 1100 and 1115 can be performed by any of the processing methods used in fabricating the integrated circuits being analyzed. The training and inferencing of the neural network in the flow of FIG. 11, and also FIGS. 22 and 27 below, are generally quite computationally intensive operations and can be implemented using hardware, firmware, software, or a combination of these. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals. The training phase is typically more computationally intensive and can be performed in the cloud, for example, while inferencing may be performed more locally, such as on computational facilities at the fabrication facility. Examples of the processing units that can be used for neural network computations can include one or more of CPU (central processing unit), GPU (graphic processing unit), TPU (tensorflow processing unit), and NPU (neural processing unit) devices, among others.

Figure 13A:
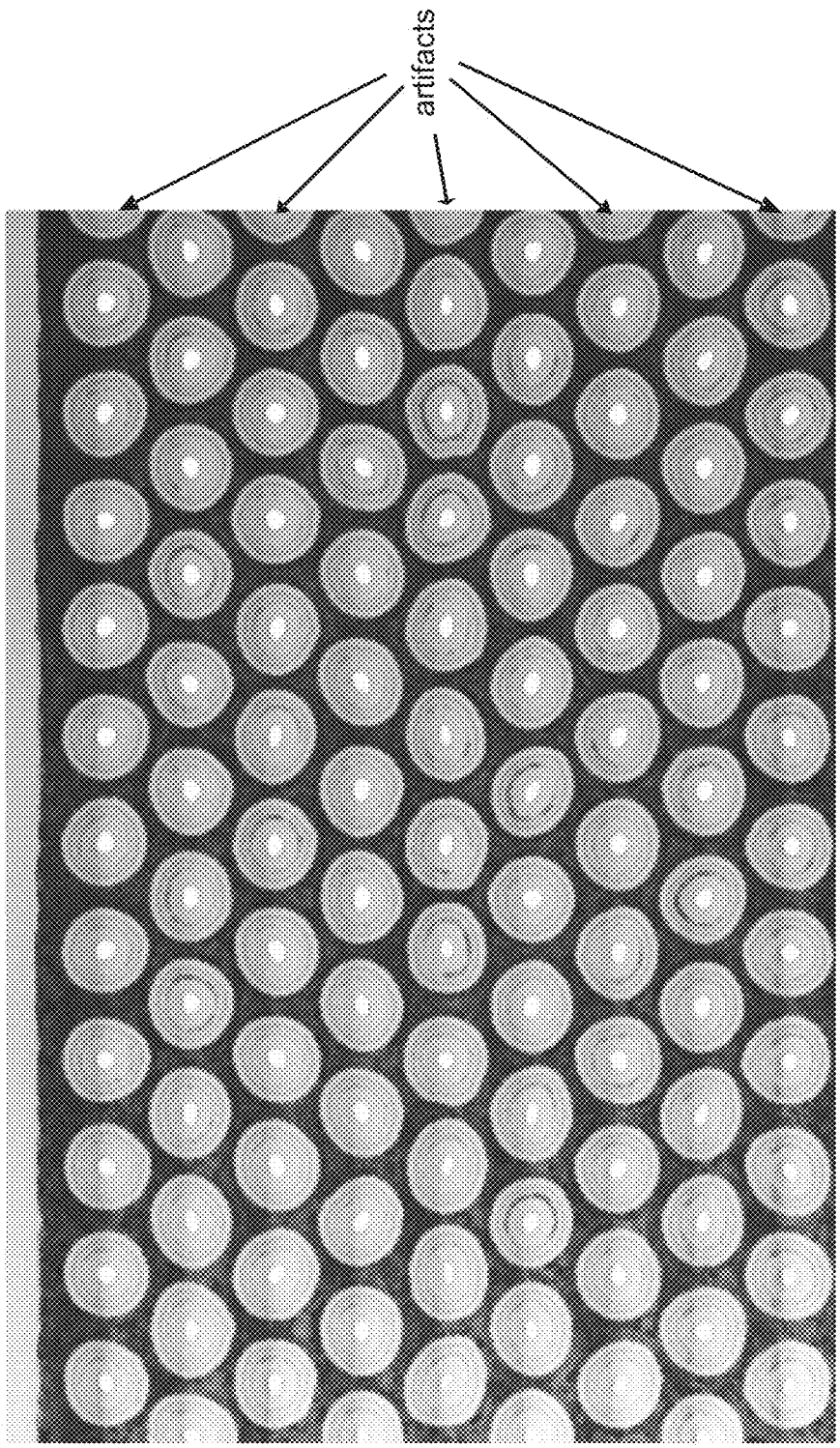
FIGS. 13A and 13B illustrate an example of the application of the Mask R-CNN to a memory hole image.
Figure 13B:
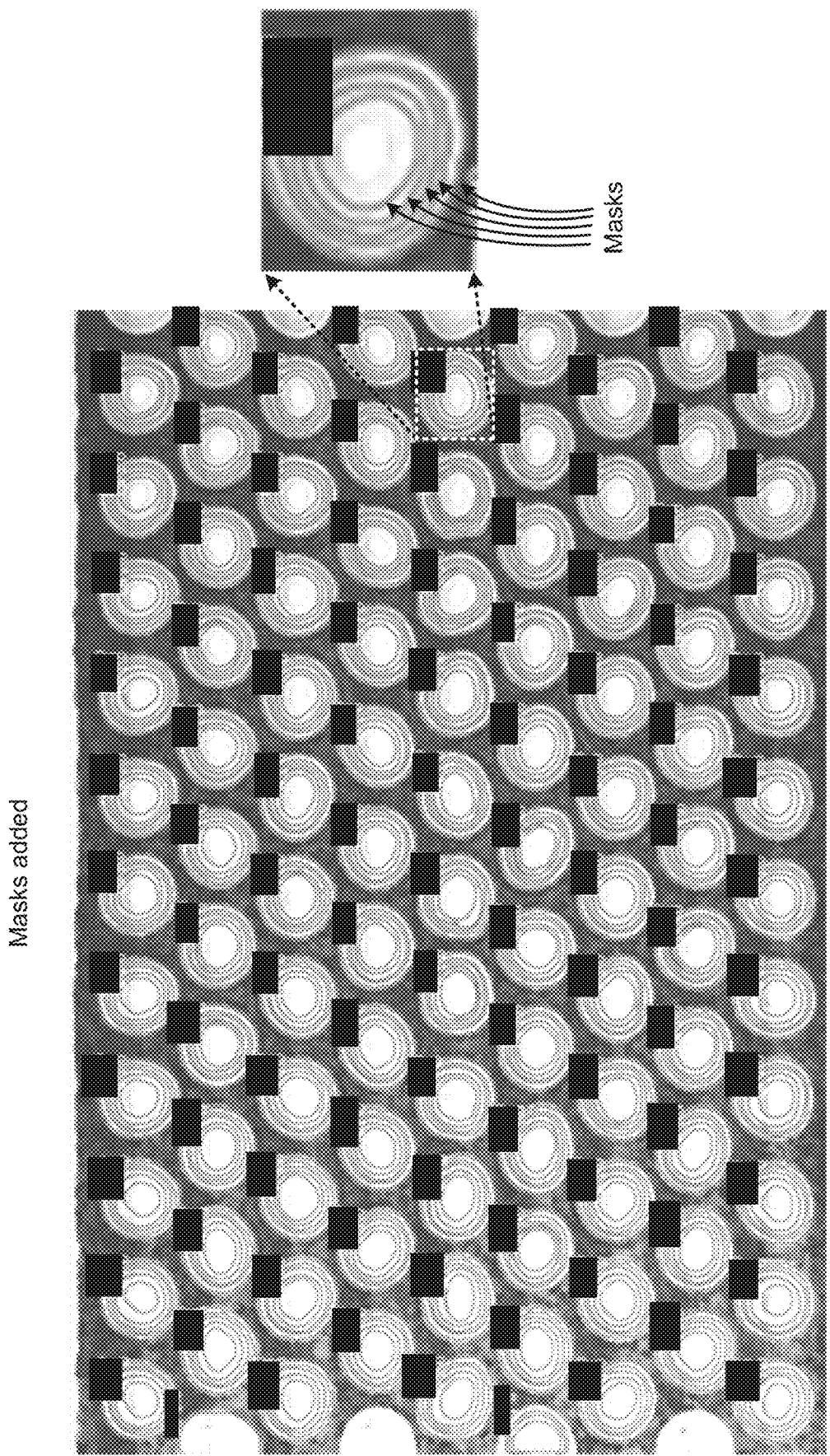

FIGS. 13A and 13B give an example of the application of the Mask R-CNN to a memory hole image to help illustrate the advantage the process of FIG. 11. FIG. 13A illustrates an electron microscope image for a small portion of a single BiCS die. Although only a small portion of the die is shown, the number of holes and the number of rings within each whole is large and complex. Thus, a visual inspection of this die would consequently be time intensive and tedious. FIG. 13B illustrates the resultant masks generated in an inferencing for the image of FIG. 13A, the masks being roughly circular rings between the different layers shown in FIG. 10. (In FIG. 13B, as well as in FIGS. 17A, 17B, 19A, 19B, 22A, and 22B, the black boxes to the upper left of each memory hole are again not part of the original image, but added to redact specific numeral information that does not enter into the discussion here.) Although the training process may take time, once trained, the inferencing can be executed relatively rapidly, with the masks then usable to analyze the health of the processing more readily.

As illustrated in FIGS. 12A-12C, 13A and 13B, the training and consequent inferencing for the neural network is for images looking down on a memory chip from above, in the x-y plane. The process can similarly be applied to electron microscope images from an "x-cut" or a "y-cut", where the integrated circuit is cut in the vertical direction in either an x-z or y-z plane. This can provide a view as represented in FIG. 9, allowing a view of the memory holes in the vertical direction.

Another example of an integrated circuit to which the processes described above is for the example of forming the electrical contacts for integrated circuits that are then bonded together, such as a bonded die pair of a memory device, in which one die of the pair is formed to hold an array or arrays of non-volatile memory cells and the other die of the pair can hold some or all of the peripheral and control circuitry in a CMOS die. To operate properly, the two die need to be properly fabricated and aligned when attached so that the two die can exchanged electrical signals.

Figure 14:
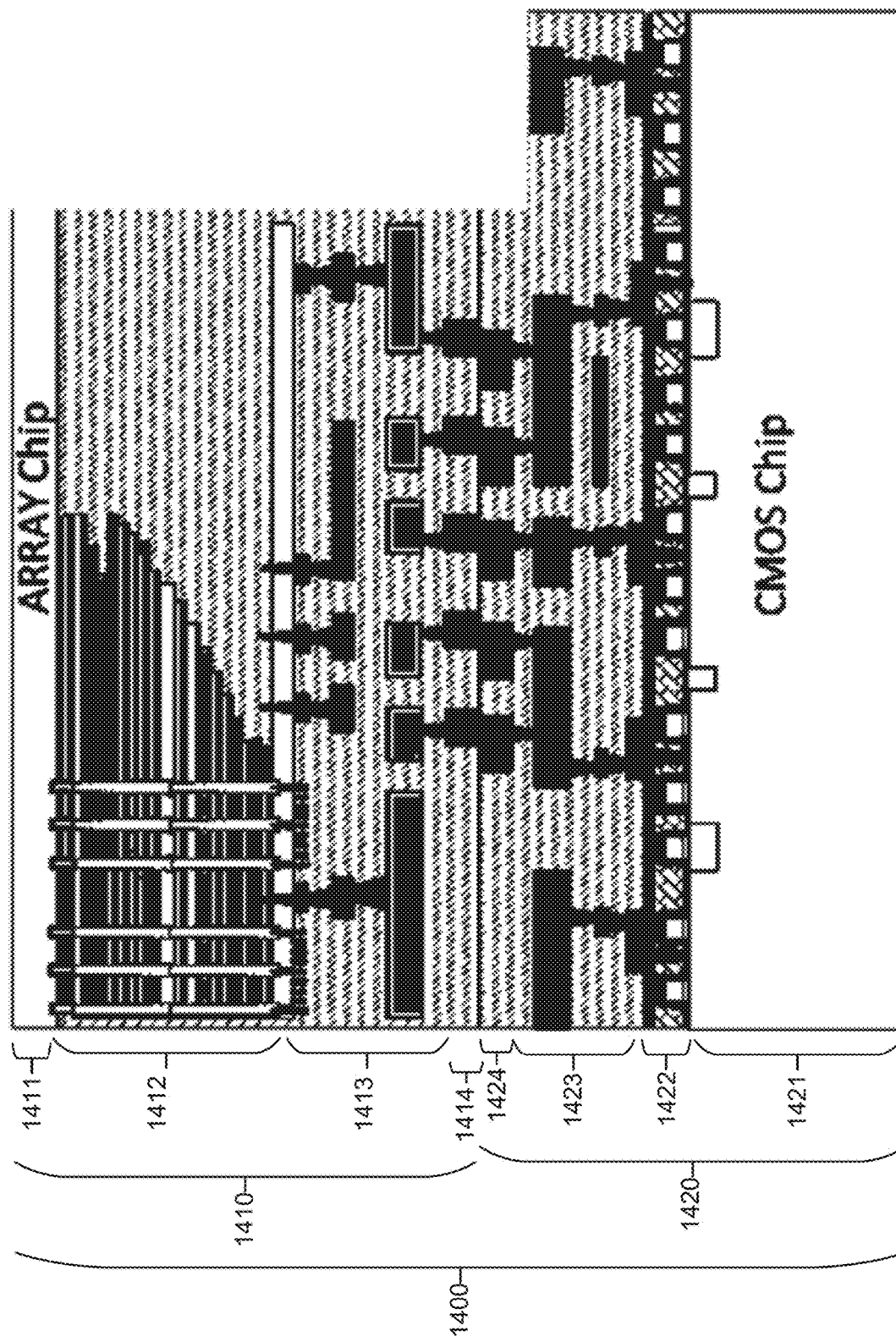
FIG. 14 is a cross-sectional side view of a bonded die pair of a non-volatile memory array chip and a CMOS chip.

FIG. 14 is a cross-sectional side view of a bonded die pair 1400 of a non-volatile memory array chip 1410 and a CMOS chip 1420. The CMOS chip 1420 of the bonded die pair 1400 includes a substrate 1421, intermediate region 1422 (including active components formed as CMOS Chip components in and on substrate 1421), upper region 1423 (including conductive paths formed of traces and vias separated by dielectric), and bonding region 1424. The active components on the CMOS chip can include the control and peripheral elements (read/write circuits, sense amplifiers, voltage regulators, charge pumps, and so on) that, for a conventional memory circuit, are formed on the periphery of the memory array. The bonding region 1424 of the peripheral circuitry die, or CMOS chip, 1420 includes pads bonded to corresponding pads of bonding region 1414 of the memory die of the array chip 1410.

The memory die, or array chip, 1410, includes the pads of bonding region 1414 that are coupled through conductive paths of upper region 1413 to memory array elements in intermediate region 1412, which was formed on substrate 1411. The intermediate region 1412 and substrate 1411 can correspond to the structures of a 3D memory structure as shown in FIG. 8 or FIG. 9, but where the structure in those figures has been turned upside-down so that the pads of bonding region 1414 can be bonded to the pads of bonding region 1424.

The array chip 1410 and CMOS chip 1420 are fabricated separately and then bonded together to form the bonded die pair 1400. For proper operation, the contact pads of the bonding regions 1414 and 1424 need to be properly formed and aligned. The processes described above with respect to FIG. 11 for the memory holes of the memory array structure can also be applied to the bonded die pair 1400 of FIG. 14. The testing and quality control of the bonded die pair can be performed on one or both of the die prior to bonding, to the pair after bonding, or both. For example, to determine if the bonding contacts are properly formed, the techniques described above for memory holes can be applied to the pads of the bonding region 1414 or 1424 before the die are boned together in pair. The process can be performed on completed (but unbonded) samples of either or both die, or the bonding region 1414 or 1424 can be pared back to prepare a sample. (Note that paring back of the array chip 1410 would correspond to upward direction the array chip 1410 of FIG. 14 as it is represented in FIG. 14 as it has been inverted prior to forming the bonded structure of die pair 1400.) To determine whether the array chip 1410 and CMOS chip 1420 are properly aligned and bonded, samples can be prepared by cutting into the bonded pair from the side, resulting in a view similar to that shown in FIG. 14.

The examples above make use of very high resolution images from electron microscopes and analyze the images at the pixel level. To apply neural networks more accurately to such tasks, the Mask R-CNN technique can be extended to an enhanced Mask R-CNN, or P-Mask R-CNN (Precision Mask R-CNN), for high precision metrology tasks.

In manufacturing and engineering environments, many images are taken either inline or off-line for metrology, or obtaining the dimensional information, of specific features. These metrology tasks are traditionally based on the brightness/contrast of the target features compared to their background. Advanced CNN technology can be applied to such tasks, however many of the CNN technologies, such as Mask R-CNN, are designed for low latency and small computational footprints to satisfy applications such as self-driving cars, mobile applications, surveillance systems, and so on. Generally, such technology is not designed for images that require high-accuracy, such as the images taken in the fabrication process of integrated circuits, where nanometer scale variations could make a very significant difference.

Figure 15B:
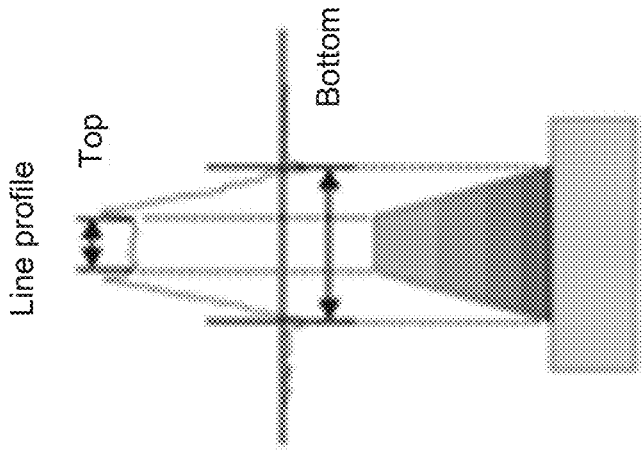
FIGS. 15A and 15B consider a metrology task traditionally based on the standard approach of brightness/contrast of the target features compared to their background.
Figure 15A:
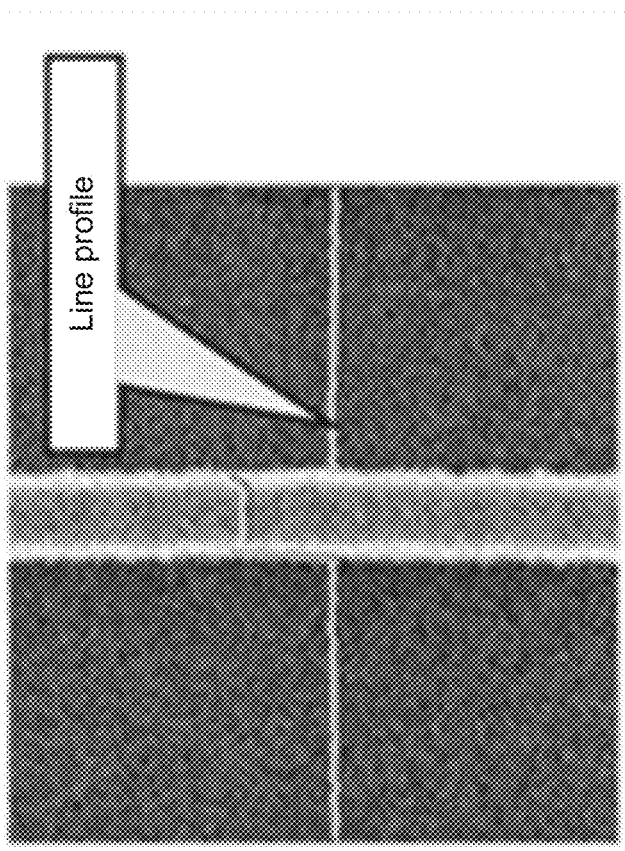

To provide some context, FIGS. 15A and 15B consider a metrology task traditionally based on the standard approach of brightness/contrast of the target features compared to their background. FIG. 15A illustrates the use of a critical dimension scanning electron microscope (CD-SEM) image using grey level (contrast) signal of the electron microscope image for a photoresist line of a photoresist formed on an integrated circuit. First, the position indicator ("line profile") of FIG. 15A specifies the measurement position of the image of FIG. 15B. The line profile of the specified measurement position is then obtained, where a line profile is a signal that indicates changes in the topological profile of the measure feature. The line profile is used to obtain the dimensions of a specified position. The CD-SEM can calculate the dimensions automatically by counting the number of pixels in the measurement area. FIG. 15B is a schematic cross-section illustrating the relationship between the line schematic cross-sectional view and the line profile.

Figure 16B:
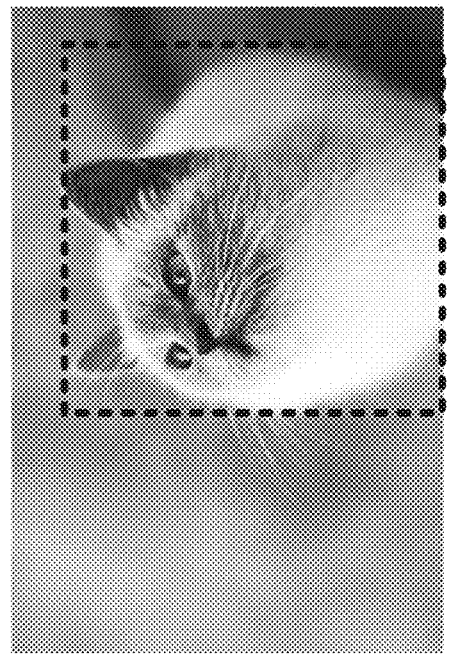
FIGS. 16A-16C illustrate three levels of CNN detection.
Figure 16C:
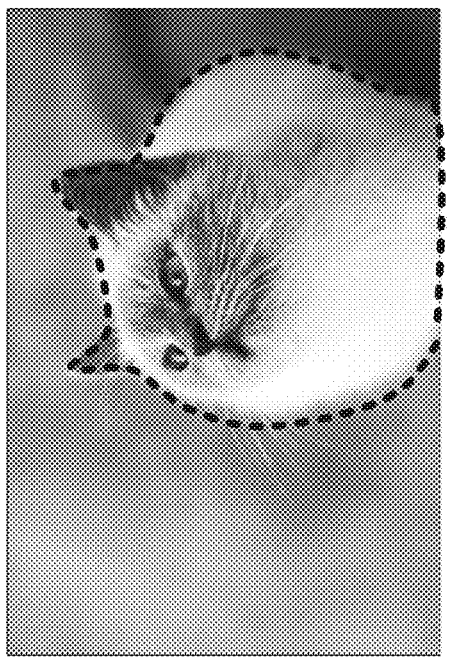
Figure 16A:
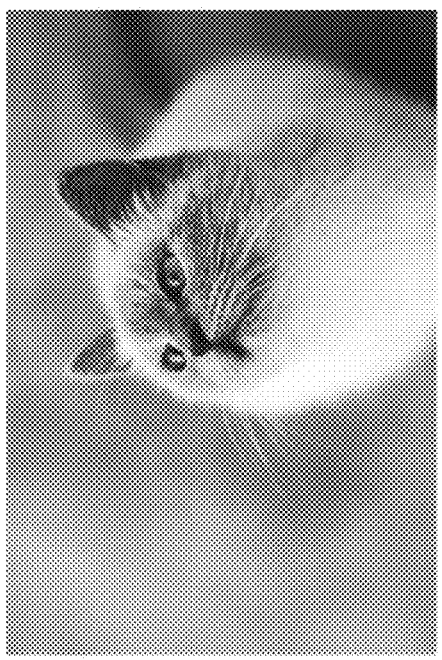

As discussed above, there are different levels of CNN detection. FIGS. 16A-16C respectively illustrate three levels of CNN detection: a basic image identification in FIG. 16A, the determination of a bounding box in FIG. 16B, and the application of a mask in FIG. 16C. The use of such techniques can be a powerful tool for helping day-to-day engineer tasks. The P-Mask R-CNN approach described here extends the Mask R-CNN approach to provide the higher level of precision than may be required for the extremely high resolution images of a semiconductor manufacturing process.

More specifically, as discussed with respect to the examples of FIGS. 8-12, the shape and dimension of memory hole layers directly affect device characteristics of a memory circuit, and manually extracting measurements from electron microscope pictures is done with poor efficiency and accuracy. Use of a standard Mask R-CNN can allow for CNN detection of features at lower levels of image resolution, but can lead to error when applied to memory holes or similar applications using pixel level precision.

Figure 17B:
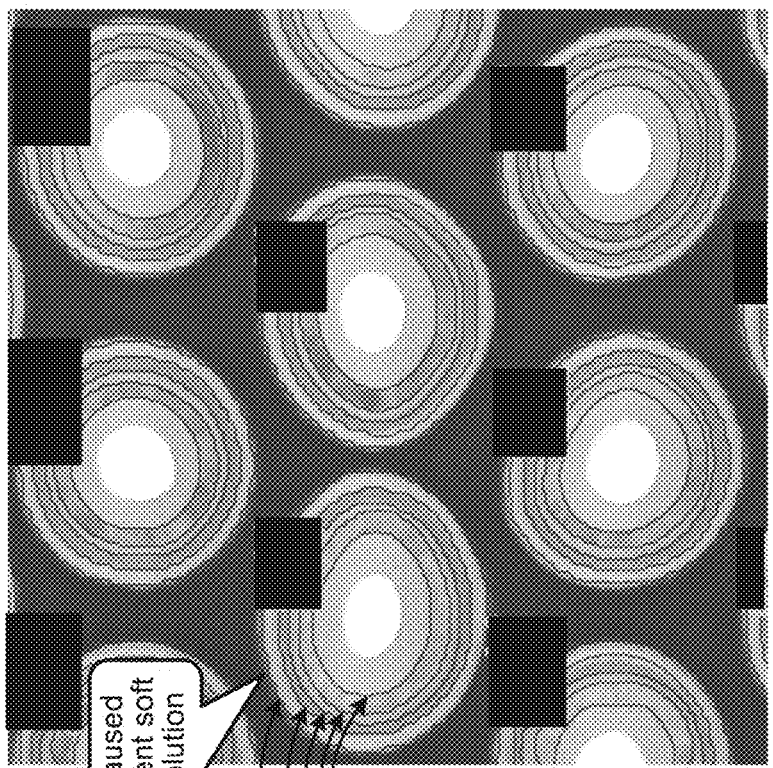
FIGS. 17A and 17B consider some sources of mask prediction error when applying a typical Mask R-CNN to the memory hole example.
Figure 17A:
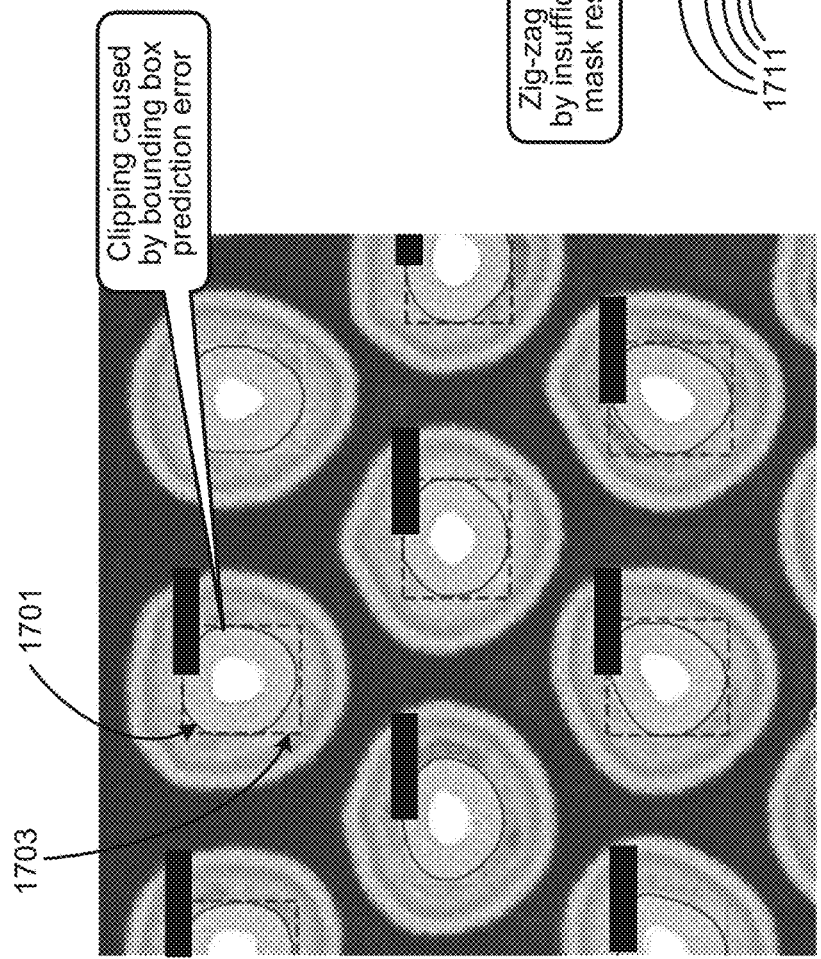

FIGS. 17A and 17B consider some sources of mask prediction error when applying a typical Mask R-CNN to the memory example. FIG. 17A illustrates examples of regional proposal bounding box prediction error, which results in "clipping" of the predicted masks, where a specific example is highlighted in the center memory hole at top. As shown in these samples, portions of the predicted mask 1701 extend beyond the proposed bounding box 1703, slicing off portions of the predicted mask 1701 near the central portions of sides of the bounding box 1703.

FIG. 17B illustrates the result of insufficient mask resolution. The initial soft mask is designed for performance and small computational footprint. However, when up-converting the floating-point values soft mask to a binary valued hard mask, losses occur, as illustrated by the zig-zagging shown in FIG. 17B at 1711, rather than the smoother circular bounding lines illustrated in FIG. 13B.

Figure 18:
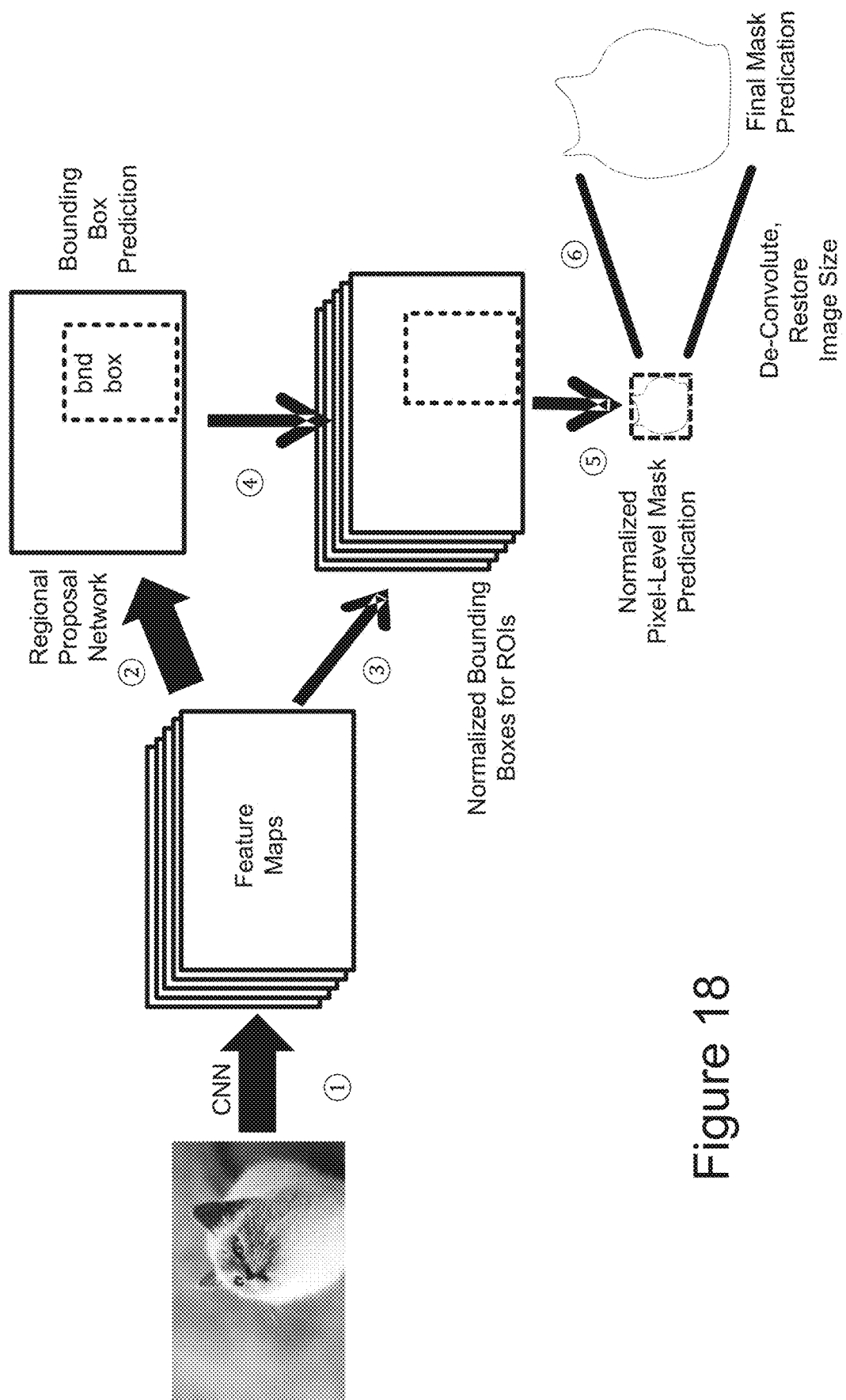
FIG. 18 is a schematic representation of the application of a Mask R-CNN to an image.

FIG. 18 is a schematic representation of the application of a Mask R-CNN to an image, in this case a cat as in FIGS. 16A-16C. Starting from the input image, at (1) the input image goes through a CNN to generate feature maps. At (2), the RPN generates a bounding box prediction from the feature maps. At (3) and (4), the feature maps and the regional protocol network locate regions of interest, and normalize the region to the initial mask pool size. At (5) the normalized regions of interest are used to generate a pixel-level mask prediction. As a pixel-level mask is normalized to the initial mask pool size, at (6) the normalized mask is de-convoluted to the original image size (final mask prediction). Mask error can arise at (4), due to bounding box prediction error, and at (5) and (6), due to insufficient mask resolution.

FIGS. 19A and 19B illustrate the effect of the extension the Mask R-CNN to a P-Mask R-CNN on the bounding box prediction error and the insufficient mask resolution error as illustrated in FIGS. 17A and 17B, respectively. To address the clipping error for the bounding boxes, a fine-tuning term can be added to, in effect, increase the bounding box prediction error, and improve mask prediction precision. The result is illustrated in FIG. 19A, where the clipping illustrated by the top figure, where mask 1901 is clipped by bounding box 1903 for example, is resolved by the use of bounding boxes of a larger size in the bottom figure, where the mask 1911 is all within the bounding box 1913. Returning back to FIG. 18, this corresponds to adding in a fine-tuning term at (4), which increases the bounding box prediction error, but improves the final mask.

To address the zig-zagging of the mask prediction, the size of the soft mask can be increased by an increase the initial soft mask pool size and/or an increase the number of deconvolution layers. The result is illustrated in FIG. 19B, where the zig-zag mask lines 1921 of the prior arrangement at top, as in FIG. 17B, are replaced by smoother lines 1923 of the P-Mask R-CNN approach. Returning back to FIG. 18, this corresponds to use of a larger initial mask, or more de-convolutional steps to increase the mask size, or both, at (5) and (6).

Figure 20:
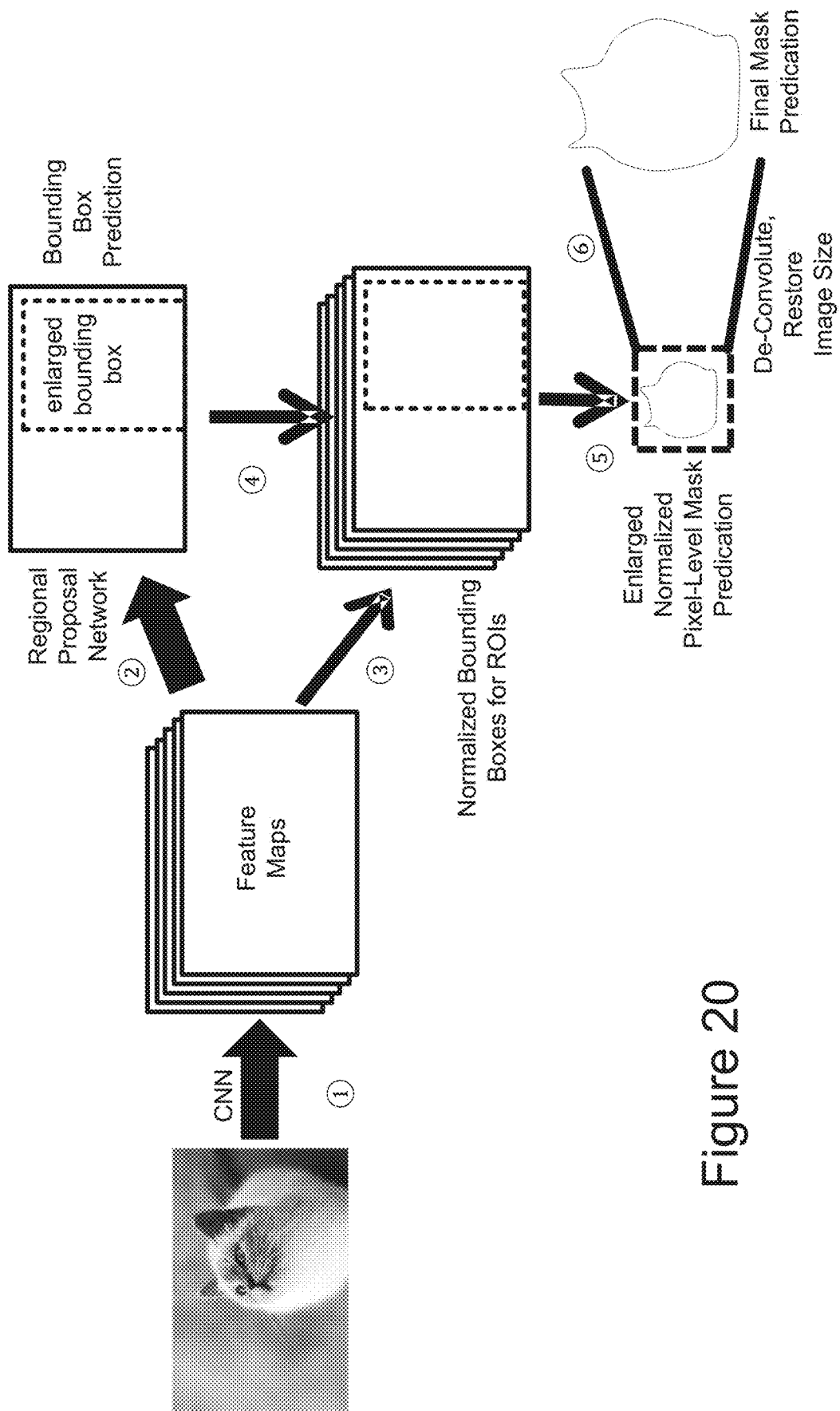
FIG. 20 is a schematic representation of the application of a P-Mask R-CNN to an image.

FIG. 20 is a schematic representation of the application of a P-Mask R-CNN to an image, and repeats the elements of the Mask R-CNN process of FIG. 18, but is updated to reflect the changes to process described with respect FIGS. 19A and 19B. More specifically, at (4) the addition of a fine-tuning term leads to the increased size of the bounding box illustrated in FIG. 20. At (5) and (6), the use of a larger initial mask, more de-convolutional steps to increase the mask size, or both lead to a larger initial mask, as represented by the larger cat figure and bounding box between (5) and (6) in FIG. 20.

Figure 21:
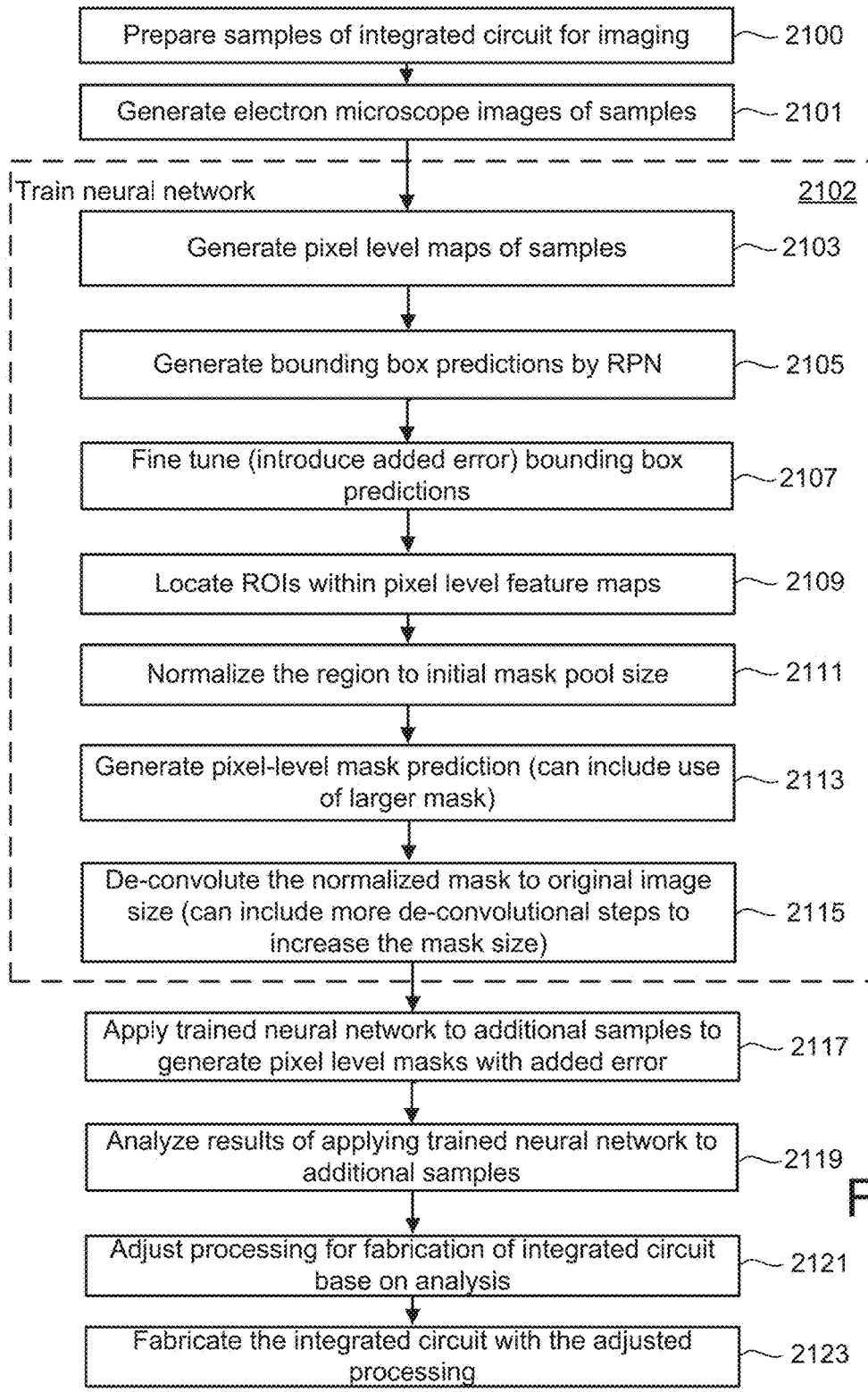
FIG. 21 is a flowchart of one embodiment of a P-Mask R-CNN process.

FIG. 21 is a flowchart of one embodiment of a P-Mask R-CNN process. In FIG. 21, many of the steps are similar to those of FIG. 11 and illustrate how a P-Mask R-CNN process can be incorporated in the process of FIG. 11. The flow of FIG. 21 begins at step 2100 in which, similar to step 1100 of FIG. 11, samples of an integrated circuit are prepared for imaging. Specific examples of the integrated circuit can be the three dimensional memory array structure of FIGS. 8 and 9, in which the feature of interest can be the memory holes, and the bonded die pair structure of FIG. 14, in which the feature of interest can be the contact pads of the individual die or the alignment of the bonded pair.

In step 2101, electron microscope images are generated from the prepared samples of the integrated circuit. Step 2101 can be as described with respect to step 1101 of FIG. 11. As in the flow of FIG. 11, in the case of a sparse data set, image augmentation can also be used to increase the sample size, such as described in more detail below.

The training of neural network to generate pixel level masks of features of the first plurality of the samples of the integrated circuit from the electron microscope images occurs at step 2102, which includes steps 2103-2115 in the illustrated embodiment. At step 2103, pixel level feature maps are generated from the electron microscope images. Step 2103 corresponds to (1) on FIG. 20, where the images go through a CNN to generate feature maps. At step 2105 bounding box predictions are generated from the pixel level feature maps by the regional proposal network. Step 2105 corresponds to (2) of FIG. 20.

As discussed above with respect to FIGS. 17A-21, the feature map can be fine-tuned, such as by adding in error to the bounding box predictions to avoid clipping of the masks. This process can increase error, but improve the final mask, and is step 2107. At step 2109, the regional proposal network ((3) of FIG. 20) and feature map ((4) of FIG. 20) locate the regions of interest within pixel level feature maps. The region is normalized to the initial mask pool size at 2111. At step 2113, corresponding to (5) in FIG. 20, the pixel level mask is predicted. In the P-Mask R-CNN process, this can include the use of a larger mask. At step 2115, de-convolution of the normalized mask to the original size is performed, providing the final mask prediction and corresponding to (6) of FIG. 20. In the P-Mask R-CNN process, this can include an increased number of de-convolution steps to increase mask size. The improvements provided by the R-Mask R-CNN relative to the Mask R-CNN can be illustrated by FIGS. 22A and 22B.

Figure 22B:
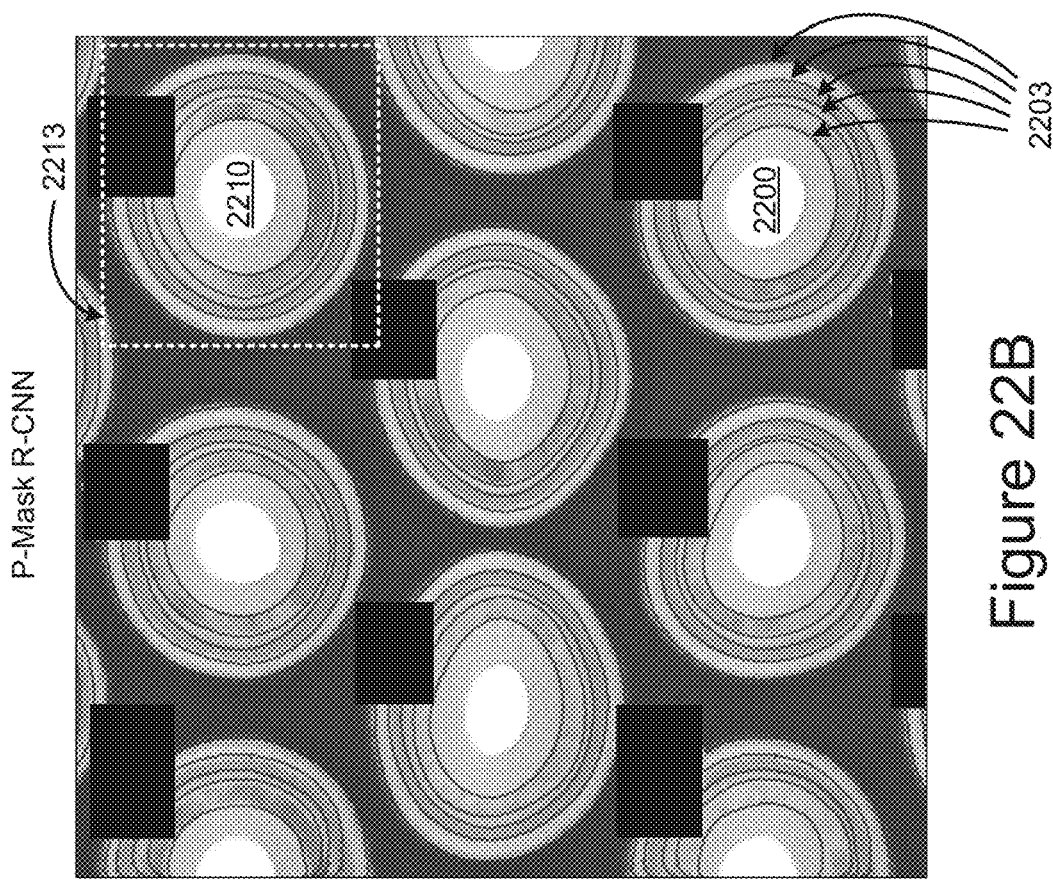
FIGS. 22A and 22B respectively illustrate the application of Mask R-CNN and R-Mask R-CNN to a memory hole image from an electron microscope.
Figure 22A:
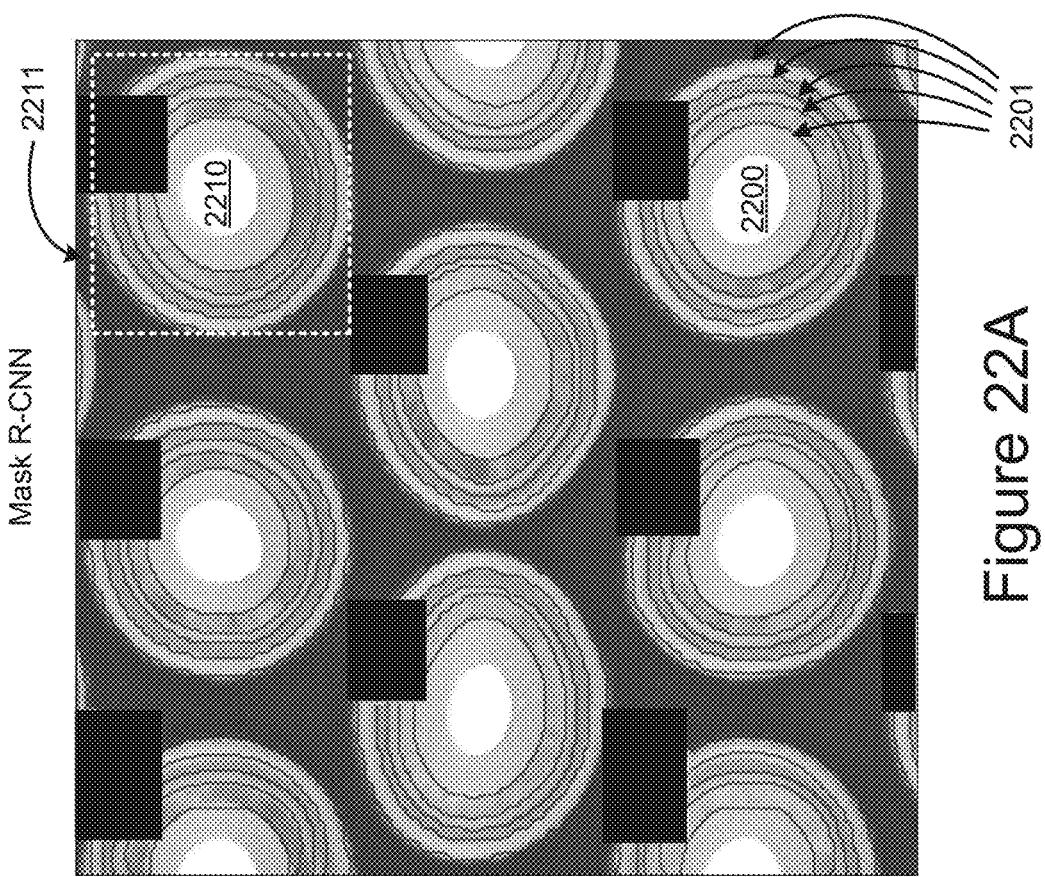

FIGS. 22A and 22B respectively illustrate the application of Mask R-CNN and R-Mask R-CNN to a memory hole image from an electron microscope. In both FIGS. 22A and 22B, a set of concentrically embedded roughly circular masks are generated for each of the memory holes. For the Mask R-CNN of FIG. 22A, several examples of "clipping" are marked out, such as for bounding box 2211 for memory hole 2210 where the mask is limited by the bounding box as is the "zig-zag" nature of these masks, as indicated at 2201 for memory hole 2200. In the P-Mask R-CNN result of FIG. 22B for the same input image, the clipping has been eliminated for mask 2213 and the concentric rings 2203 are smoothed out. The results of the image of FIG. 22B is more readily usable to determine memory hole health.

Returning to FIG. 21, steps 2117, 2119, 2121, and 2123 can respectively correspond to step 1109, 1111, 1113, and 1115 of FIG. 11. More specifically, at step 2117 the trained neural network can be applied to samples of the integrated circuit, with the results then analyzed at step 2119, where pixel level masks can be generated from the bounding boxes with the introduced added error. Based on the analysis of step 2119, the processing used in fabricating the integrated circuit can be adjusted at step 2121, with the integrating circuit being fabricated with the adjusted processing at step 2123. Although not shown in FIG. 21, the process of FIG. 21 can also include steps similar to steps 1117-1122 of FIG. 11 for one or more loops to further analyze and adjust the processing of the fabrication process.

Another difficulty that can arise in the application of convolutional neural networks to process monitoring in the fabrication of integrated circuits and electronic devices is the training of the neural network when the available training data set is sparse. An example of this can be provided in the context of a background-neutral classifier for automatic optical inspection, such as can be used in an assembly line in which components are mounted on printed circuit boards (PCBs) automatically and where automatic optical inspection (AOI) is used for screening defects and quality issues. For illustrative purposes, the following discussion uses as an example the inspection of capacitors' polarity on a solid-state drive's (SSD) PCB board.

Figure 23A:
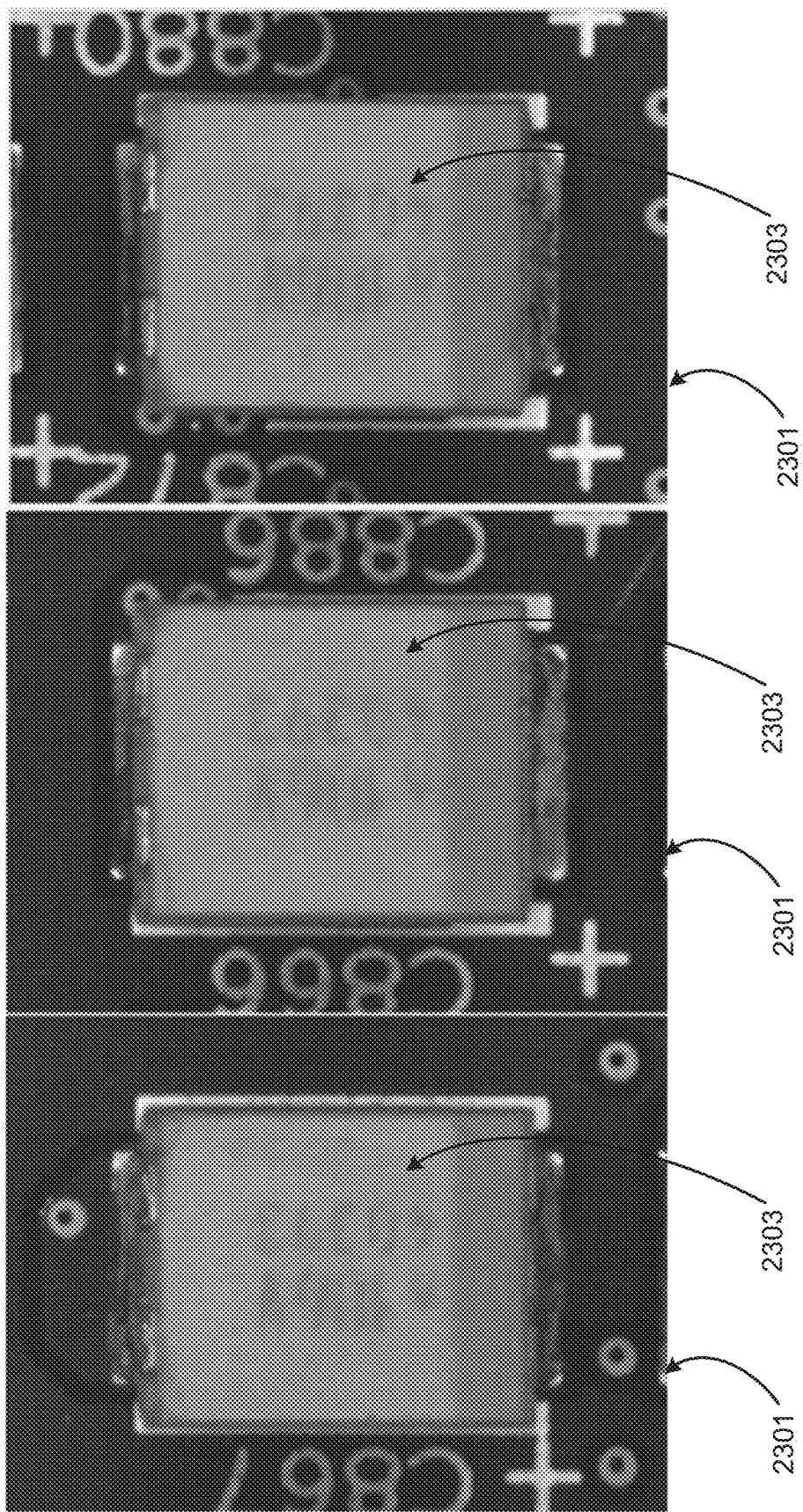
FIG. 23A illustrates samples of a circuit element (a capacitor) that can be installed at different locations of a printed circuit board (PCB) that will be used to consider the sparse training data situation.

FIG. 23A illustrates samples of the instances of the same capacitor 2301 installed at different locations of a PCB 2303 that can be used to consider the sparse training data situation. (FIG. 23A is a black and white reproduction of a color image.) Each location where a capacitor 2301 is mounted on the PCB 2303 may have a different PCB background pattern and text, and different instances of the capacitor 2301 may have different text and variations in the printing and coloration. The goal is to design an image classifier that determines if the capacitor is installed with the correct polarity or not. If the capacitor is installed with the wrong polarity, the PCB or device of which the PCB is part will be removed from assembly line for rework.

In some previous approaches, the AOI has a built-in rule-based judgement. This approach has the disadvantage of a tendency toward overkill, identifying more errors than are actually present, so that that human intervention is still needed to prevent loss.

In an approach applying a CNN with transfer learning to this problem, the same capacitor is installed on perhaps tens of different locations on the PCB. Therefore, the CNN model needs to be re-trained for new locations to maintain its accuracy. The CNN is also sensitive to the text (e.g., a date code) on the capacitor itself. If the training data contains capacitors of the same date code, the trained CNN could fail in classifying capacitors of different date codes. Due to the low failure rate typical of such assembly processes, it is difficult to collect sufficient failure sample data for training.

In summary, among the challenging issues of prior approaches are: rule-based solutions have poor accuracy; CNN models are sensitive to the background pattern, which varies by location, as well as the text on the capacitors; and CNN needs hundreds or thousands of images for training, such that insufficient image data are available for CNN training.

To improve upon this situation, construction of a background-neutral classifier by training a CNN model from scratch using the artificial images generated by a generative adversary network (GAN) is presented. Such an approach can provide: high accuracy; an unlimited number of real-like artificially generated synthetic, or "fake", data images generated for training, where these generated images can have diversified and varying backgrounds and date codes; and a CNN model which is insensitive to background and date code variations, due to the diversity of the generated images. As a result, no new model training is needed for new capacitor locations, and the CNN model is not sensitive to extraneous data, such as the date code. Consequently, by incorporation of a GAN, the CNN model can overcome the noted limitations of previous approaches.

Figure 23B:
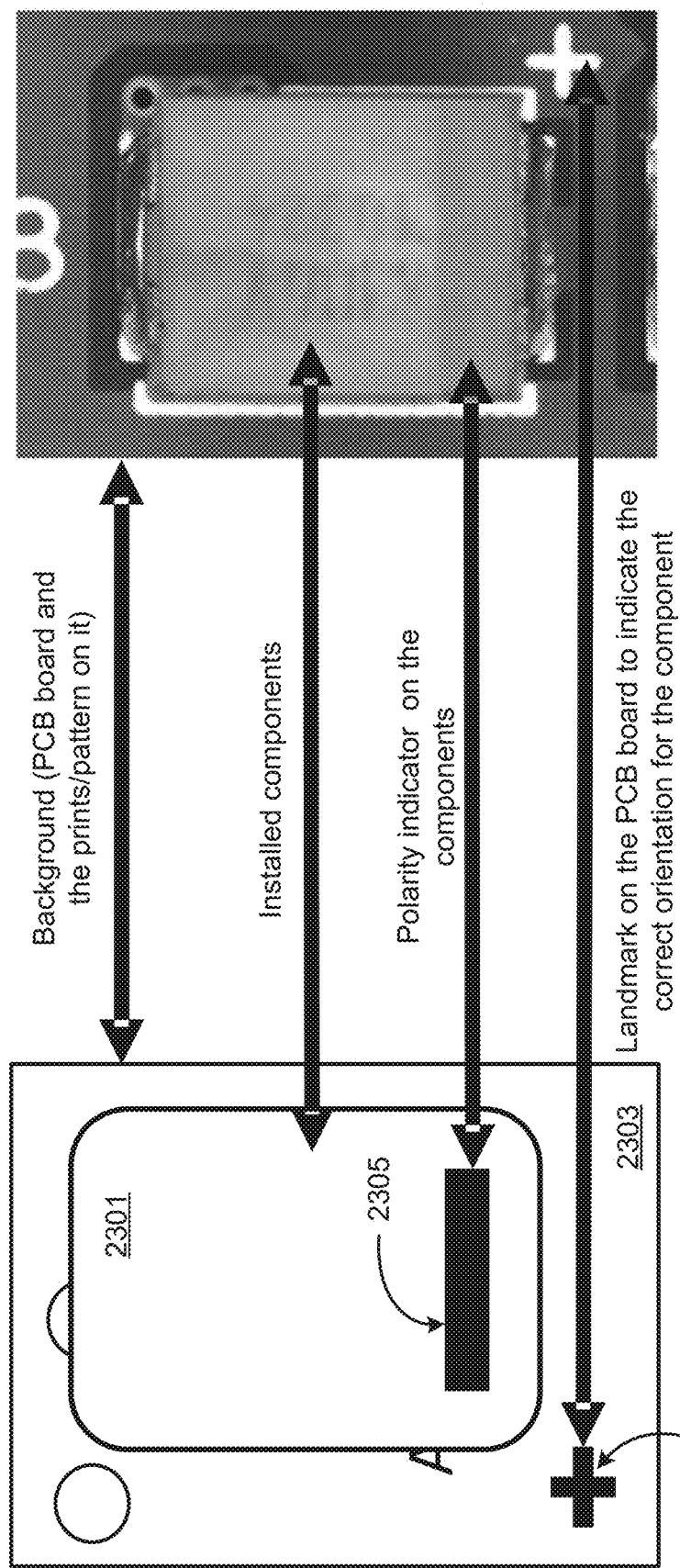
FIG. 23B illustrates an example where a polarity indicator on the components need to be on the same side as a landmark on the PCB board in more detail.

FIG. 23B illustrates the capacitor example in more detail. At right in FIG. 23B is a photograph of a capacitor, with a drawing of the arrangement on the left. In FIG. 23B, a polarity indicator on the components needs to be on the same side as a landmark on the PCB board. The background in the images is the PCB surface with various printing and patterns upon it. On the PCB is the installed component, which is the capacitor in this example, but could more generally be other components mounted on the PCB. The components include a polarity indicator of, in this example, the darker colored bar 2305 along the lower (as shown in FIG. 23B) edge. A landmark on the PCB board (here the "+" 2303) is used to indicate the correct orientation for the component.

Figure 24:
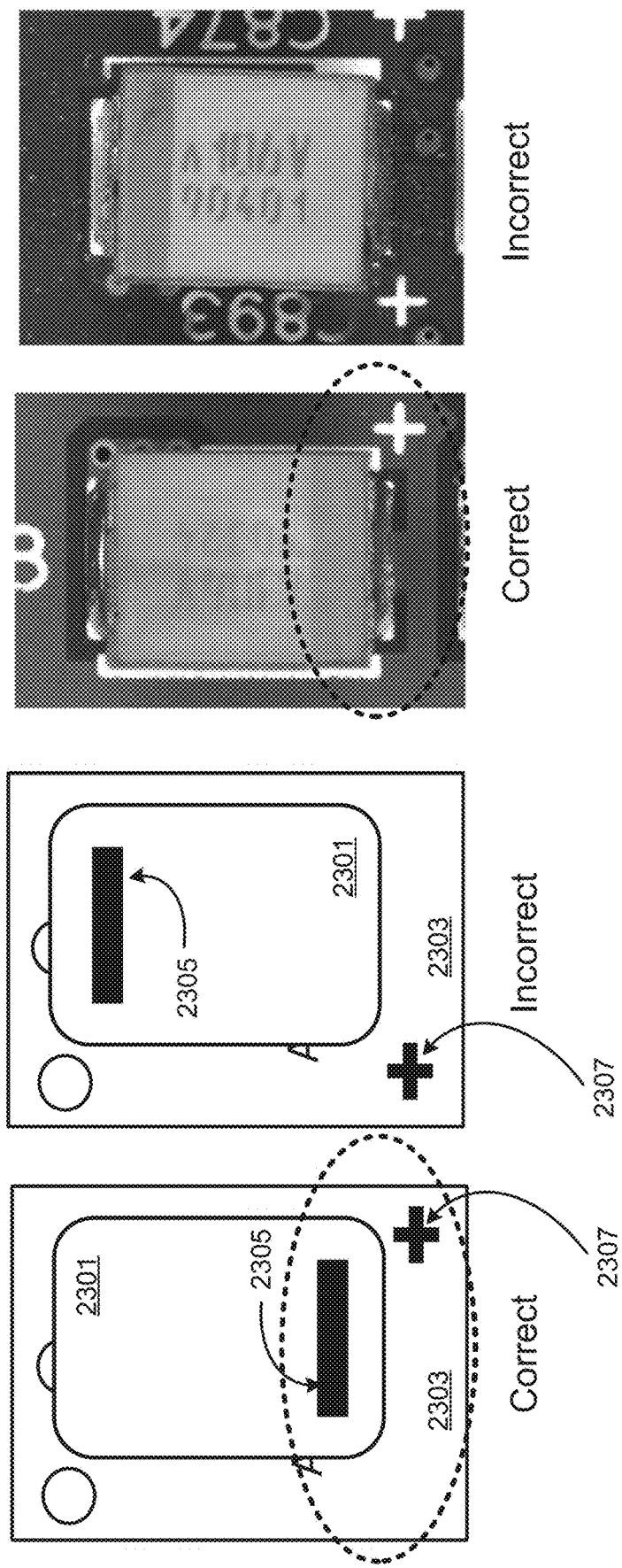
FIG. 24 illustrate samples of "good" installation and "bad" installation of the component on the PCB.

FIG. 24 illustrates examples of "good" installation and "bad" installation of the component on the PCB. More specifically, from left to right, FIG. 24 shows the correct installation as a drawing and the incorrect installation as a drawing, followed by images of a correct installation and an incorrect installation. The judgement is based on if the landmark (the "+" sign) and the polarity indicator (the "dark bar") are on the same side (with respect to the up-down direction corresponding to the longer dimension of the capacitor) and, if so, the capacitor polarity is correct. In an actual situation, the landmark could be on the left or right (as shown for the "+" 2307 on the correct installations in FIG. 24), and the background can contain other patterns and/or texts at different locations on the PCB board. The goal is to train a CNN model that uses only the landmark and the polarity indicator to judge, regardless of location of the different patterns/text in the background.

Embodiments can build a background-neutral classifier through use of a GAN for data augmentation and background diversification. This approach can be used to generate image data that contains important features to be preserved (the capacitor, the landmark ("+" sign 2307), and the polarity indicator ("the dark bar" 2305)), while the background contains real-like but diversified patterns and texts. The new image data generated by the GAN can then be used to train a CNN model from scratch, so that the CNN model has high accuracy, is insensitive (or less sensitive) to the background, and, for the same device (here the capacitor) requires no re-training for new products or new locations.

A GAN contains two competitive networks: a generator (G) and a discriminator (D). The training goal of D is to distinguish between "real" images (original input data) and artificially generated, or "fake" or "synthetic", images (generated by G). The training goal of G is to generate real-like "fake" images so that D cannot distinguish the synthetically generated "fakes" from the "real" images. The end result is that if both D and G are trained successfully to achieve minimum loss, the G will produce real-like "fake" or synthetically generated images that cannot be distinguished by D. This is illustrated schematically in FIG. 25.

Figure 25:
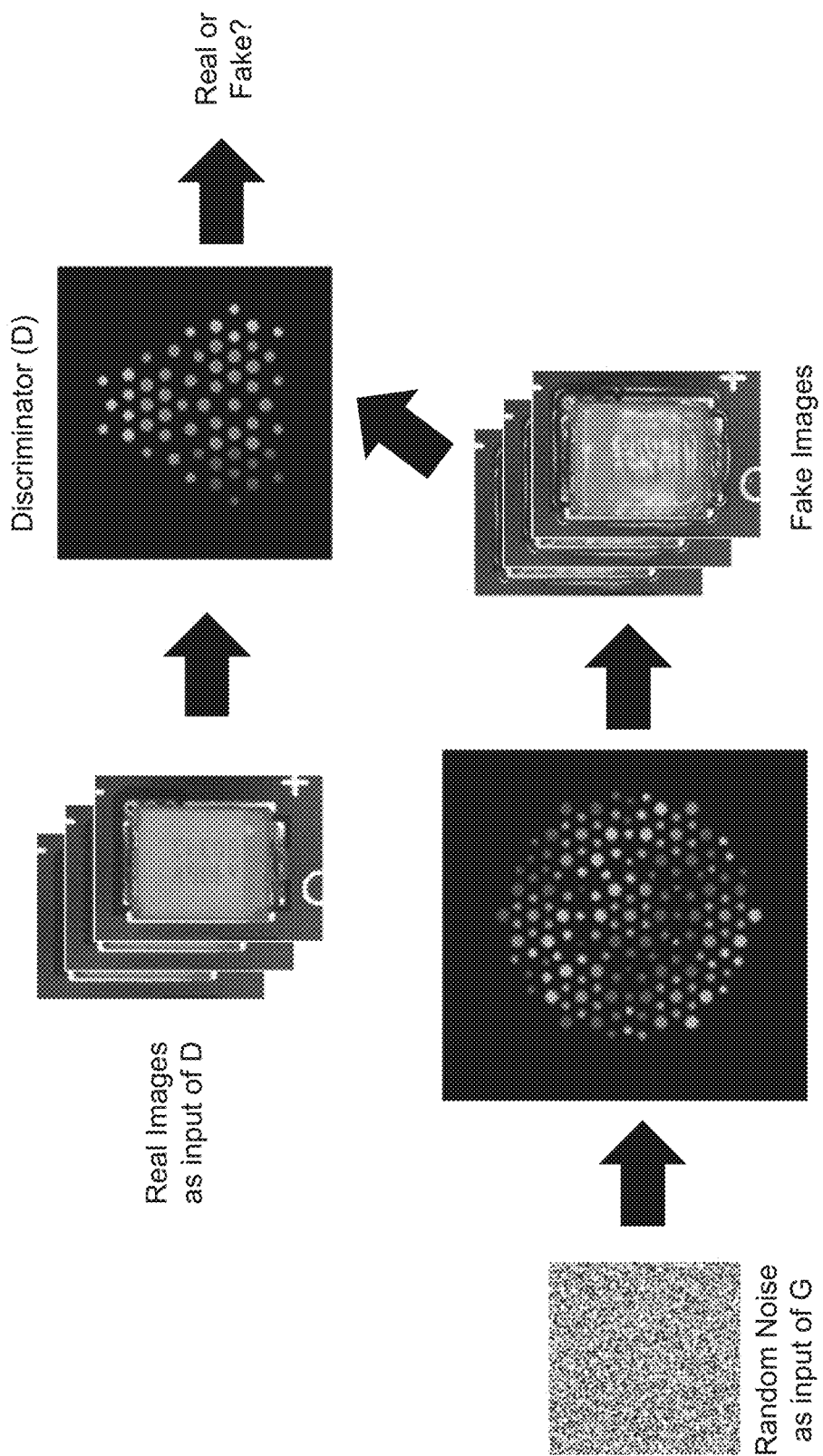
FIG. 25 is a schematic representation of the operation of a generative adversary network.

FIG. 25 is a schematic representation of the operation of a GAN. The input to the generator network is random noise, from which the generator produces a set of fake images. The fake images from the generator and the real images are both input into the discriminator, which sorts, or attempts to sort, the real images from the fake images. Both networks are trained simultaneously and competitively until both losses reach minimum, with the generator learning to produce better fakes and the discriminator becoming more adept at differentiating the fake images from the real images.

Figure 26B:
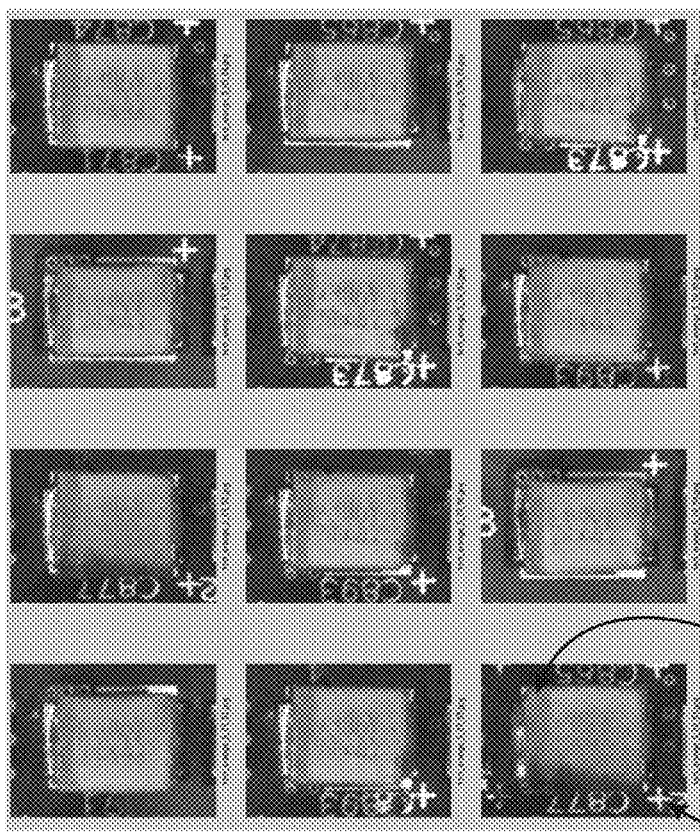
FIGS. 26A and 26B respectively illustrate a set of images of real "bad" samples and some samples of generated fake "bad" samples.
Figure 26A:
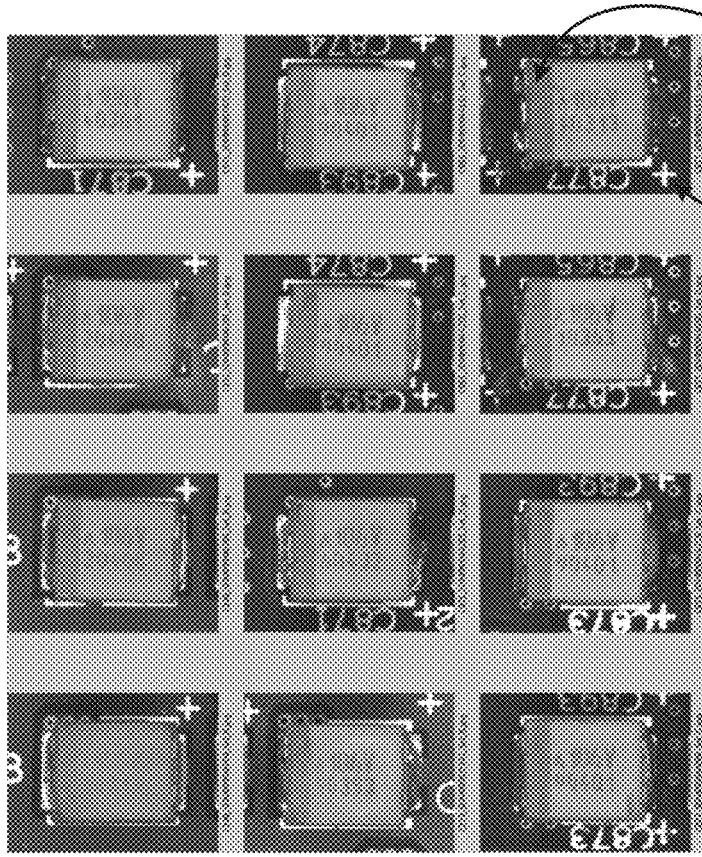

FIGS. 26A and 26B respectively illustrate a set of images of real "bad" samples and some examples of synthetic fake "bad" samples. Through the mutual training process, a relatively small set of genuine "bad" sample can be used to generate a large number of fake "bad" samples for use in training the neural network. As can be seen by a comparison of FIGS. 26A and 26B, the generated images capture the essential elements of the polarity judgement: the capacitor itself, the "+" landmark 2307 on the PCB, and the polarity indicator (darker bar 2305 on the capacitors). The generated images' backgrounds have diversified variation compared to the real images. Consequently, the use of a GAN to generate fake images can be used to solve the data scarcity issue. The generated fake images can then be used to train the CNN model, leading to an increase in accuracy as the model is insensitive to features such as the background and the date code.

The use of the GAN technique can be used to train a CNN for testing at various testing points within the manufacturing processed. Once trained, the determination of the health of the fabrication process can be checked efficiently and on an increased scale. Although the GAN technique and the use of a P-Mask R-CNN have been described in the context of the fabrication of a solid state drive (SSD) and BiC S-type memory circuits, these techniques can be extended to other example of integrated circuits and electronic devices. For example, the generation of augmented training sample can be incorporated into the flow of FIG. 11 or 21, such as at step 1103 of FIG. 11.

Figure 27:
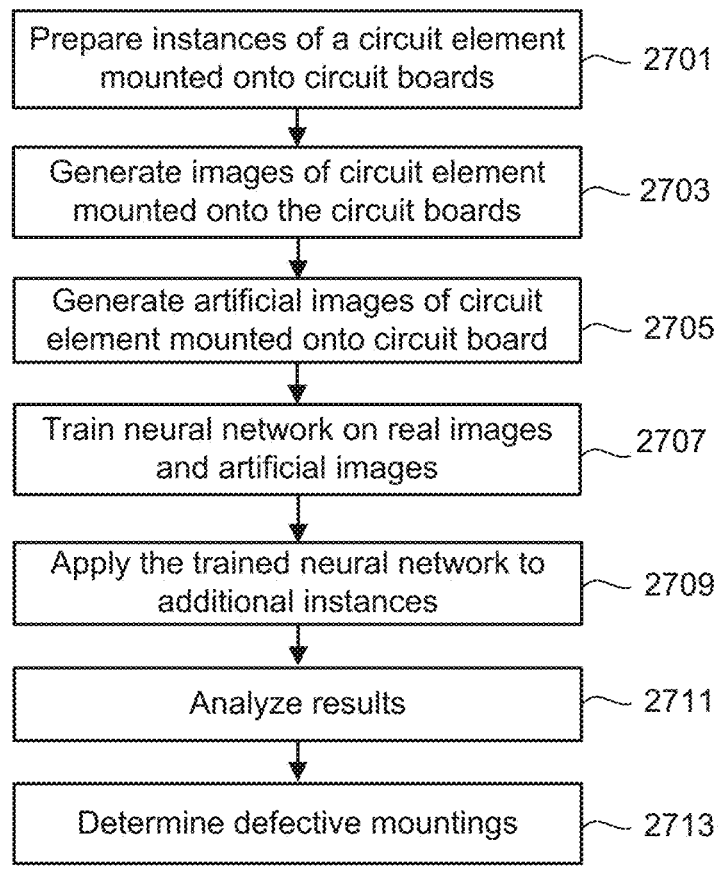
FIG. 27 is a flowchart illustrating one embodiment for the use of a GAN generative adversary network to train a neural network to identify circuit elements defectively mounted on a printed circuit board.

FIG. 27 is a flowchart illustrating one embodiment for the use of a GAN to train a neural network to identify circuit elements defectively mounted on a printed circuit board. At step 2701, multiple instances of a circuit element, such as the capacitors in the above example, are mounted onto one or more circuit boards. From these prepared instances of actual samples of the circuit element mounted onto one or more circuit boards, photographic images are generated at step 2703. The synthetic artificial, or fake, images for multiple instances of the circuit element mounted onto one or more circuit boards are generated by the GAN at step 2705. Using a combination of the photographic images of the real samples and the artificial images, step 2707 performs the training of the neural network.

Once the neural network has been trained, it can be applied to other samples of the circuit element mounted on the circuit board and be incorporated into the assembly process to detect defective instances. At step 2709, the trained neural network is applied to the additional instances of the circuit element mounted to a circuit board. This application may be in the form of a check during the manufacturing process, either at the end of the assemble process or at an intermediate stage. The results of applying the trained neural network to the one or more additional instances of the circuit element mounted to a circuit board are analyzed at step 2711, and step 2713, a determination of whether any of the additional instances of the circuit element are defectively mounted to the circuit board is made. Based on this information, the defective instances of the circuit element mounting can either be discarded or fixed, and the information can also be used to modify the production process.

Returning to examples from semiconductor processing, further application of the techniques presented here can again be described using the example of the non-volatile memory circuit structures described above with respect to FIGS. 8 and 9. Many of the examples consider above were based on electron microscope images looking downward onto two dimensional plane of the surface of the circuit's substrate, such as looking at features related to the memory holes. The following examples consider features that can determined when looking at cross-sectional views based on electron microscope images from the side (as viewed in FIGS. 8 and 9) of the circuit.

As can be seen from FIGS. 8 and 9, the three dimensional non-volatile memory structure is a complex structure involving a many processing steps. The fabrication of the large number of alternating word line/dielectric layers and memory holes can result in many possible defects, such as voids that can result in the structure. The following discuss will particularly focus on the use of machine learning based methodologies for void detection and automatic data analysis.

Figure 28:
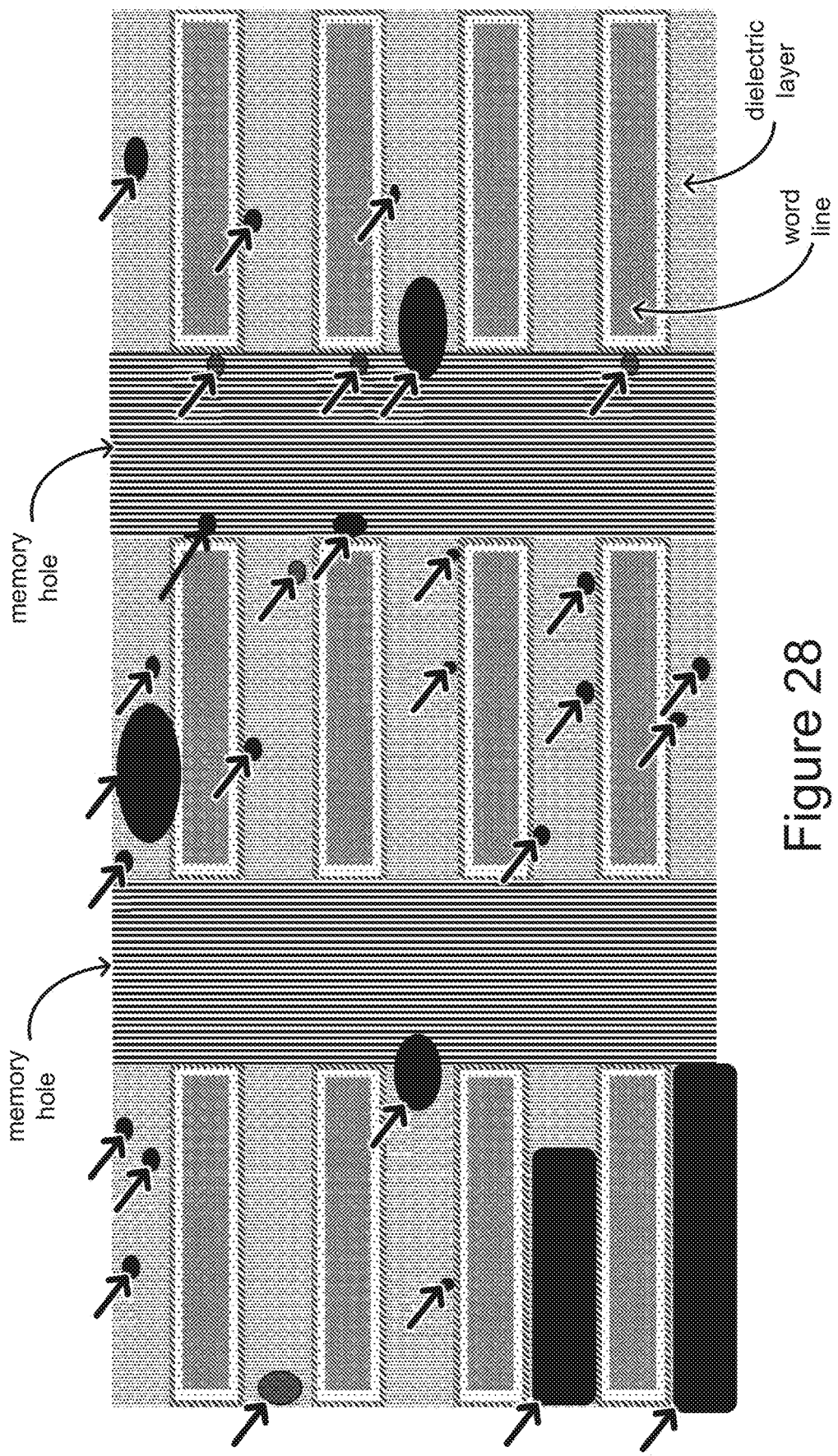
FIG. 28 is a cross-section illustration of void regions in a 3D memory circuit of the type shown in FIGS. 8 and 9.

FIG. 28 is a cross-section image that illustrates the occurrence of void regions in 3D memory circuit of the type shown in FIGS. 8 and 9. In actual operation, FIG. 28 and similar cross-sectional images below (such as FIGS. 31, 32, 33, 34A-C, and FIG. 36) can be generated by electron microscope, similarly to FIG. 10 and other SEM images above. To generate the electron microscope image, a sample of the integrated circuit is prepared by slicing the memory circuit perpendicularly to the plane of the substrate. This cross-sectional image was generated by an electron microscope, such as a scanning electron microscope or transmission electron microscope, and shows a portion of a larger image with two memory hole columns (the vertically striped regions) and 12 word lines (the darker stippled rectangles outlined in white stippling and a darker rectangle) to the sides and between the memory hole columns, with the region between the word lines filled by dielectric layers. Added to the image are a number of arrows, pointing downward to the right, indicating a number of voids in the structure, where these voids are generally located near the word lines and vary in location and size. Depending on the size and placement of these voids, these defects can cause problems such as word line to word line leakage and programming failures. The illustration of FIG. 28 shows a relatively high number of such voids where, for training samples, examples can be fabricated to have more voids than would present in production examples to provide higher amounts of training data and avoid sparse training data sets. In some embodiments, the training samples can be generated using different sub-optimal values for various processing parameters to better understand correlations between different processing parameter variations and different defect types.

One mechanism that can lead to such voids in embodiments for the fabrication process for the memory structure of FIGS. 8 and 9 occurs, for example, in the "metal replacement process", where fluorine (F) residue from a tungsten (W) deposition reacts with word line TEOS (Tetraethyl orthosilicate) material and the alternating $SiO_2$ dielectric layers to form voids in the oxide layers due to the F-degas process. This can be illustrated with respect to FIGS. 29A-F and FIG. 30. Although described in a somewhat specific context with respect to circuit structure and mechanism, the techniques for testing and quality control discussed in the following readily apply to other circuits where such metal layers are adjacent to oxide or other layer that could react with fluorine residue and, more generally, to other features that can be determined from cross-sectional images of circuits. For example, 3D ReRAM, MRAM, or phase-change memory structures often use a similar structure of alternating conductive and dielectric layers that could lead to void type defects, and the techniques can also be applied other features, such as the alignment of the bonded dies in FIG. 14.

Figure 29B:
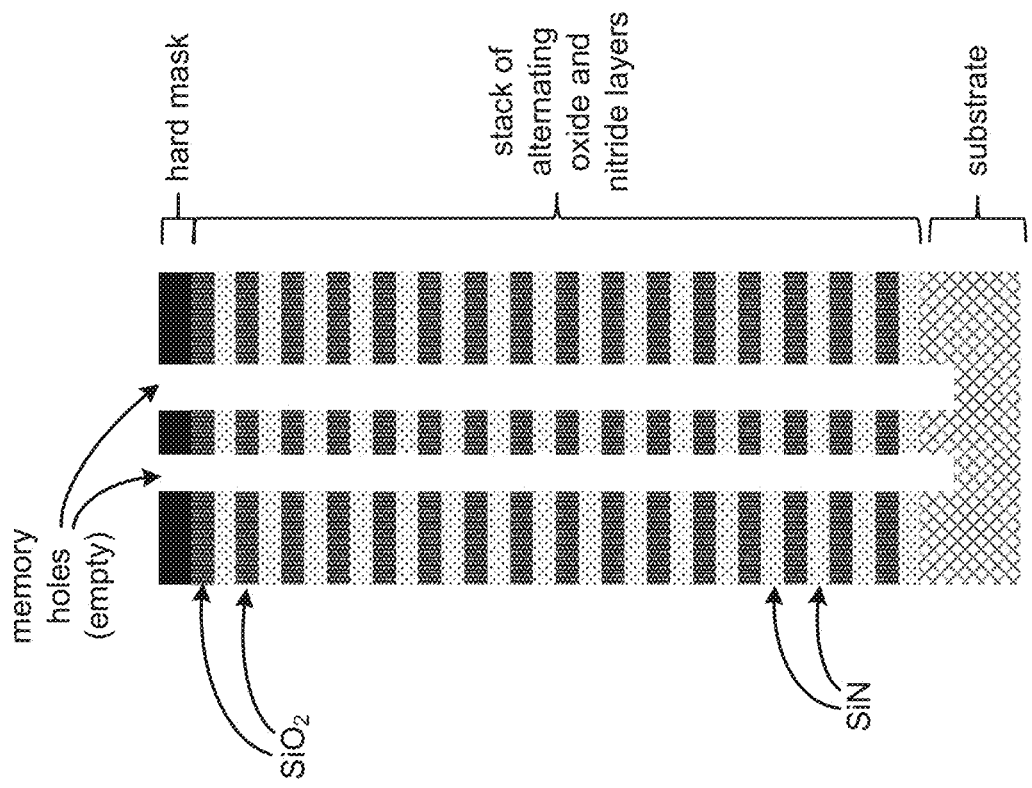
FIGS. 29A-F are a sequence of processing stages for an embodiment of forming a 3D NAND memory circuit such as those illustrated in FIGS. 8 and 9.
Figure 29A:
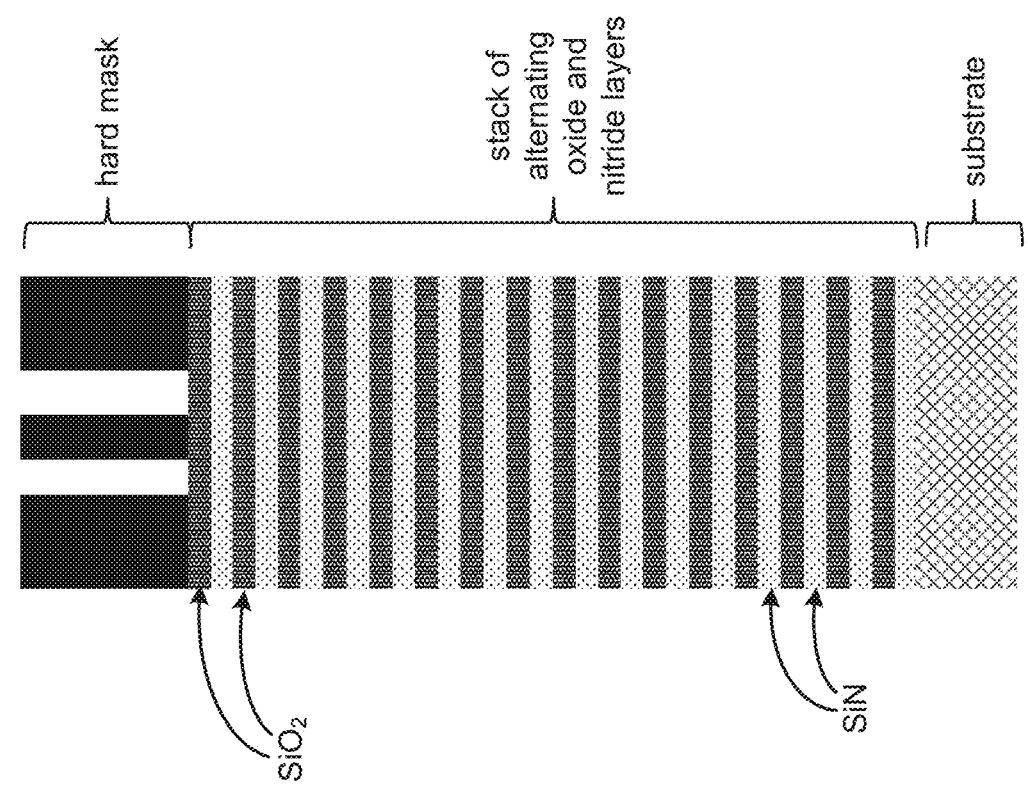
Figure 29D:
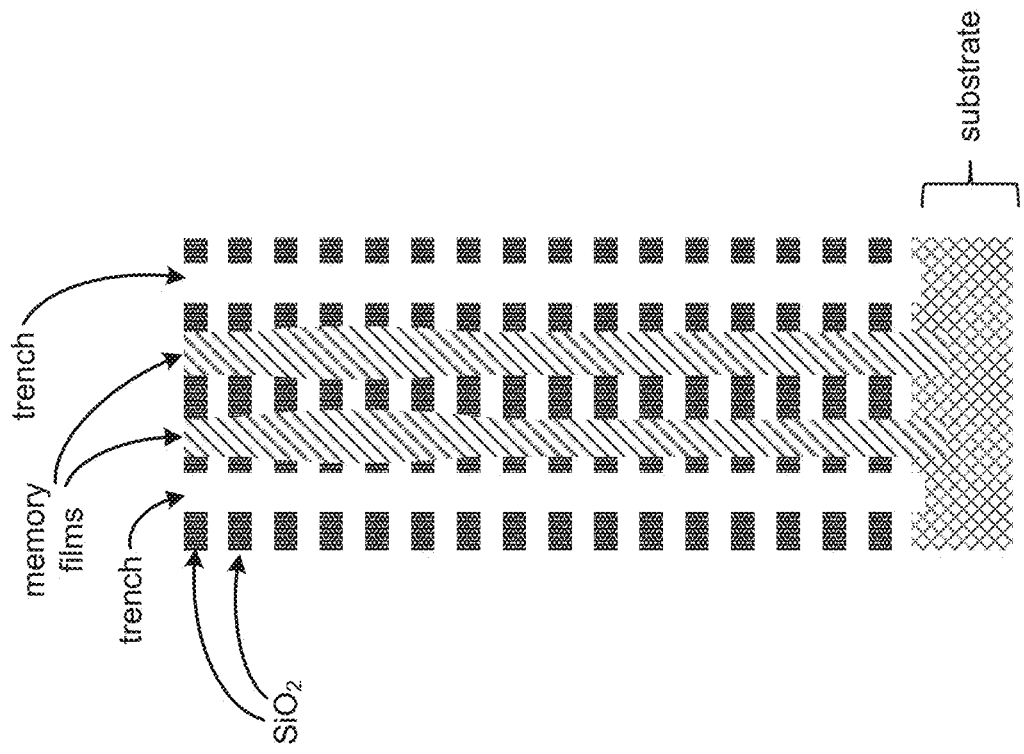

FIGS. 29A-F are a sequence of processing stages for an embodiment of forming a 3D NAND memory circuit such as that illustrated in FIGS. 8 and 9. This sequence is a "gate replacement" process that is follows after forming an alternating stack of oxide (SiO$_2$) and nitride (SiN) layers and before local interconnects, global bit lines, and other structures are formed. FIG. 29A is side view of a portion of the structure at the point where the alternating stack of SiO$_2$ and SiN layers have been deposited on top of a substrate and a hard mask has been formed on top of the stack and patterned to form the memory holes. The memory holes are then etched into the layers, such as by a reactive-ion etch, based on this hard mask, resulting in the structure shown in FIG. 29B. FIG. 29B shows the (at this point empty) memory holes as having horizontal sides, but in practice, these will bow out somewhat near the top and then may narrow a bit as they go down into the layers toward the substrate. This bowing is included in FIGS. 29C-F.

Figure 29C:
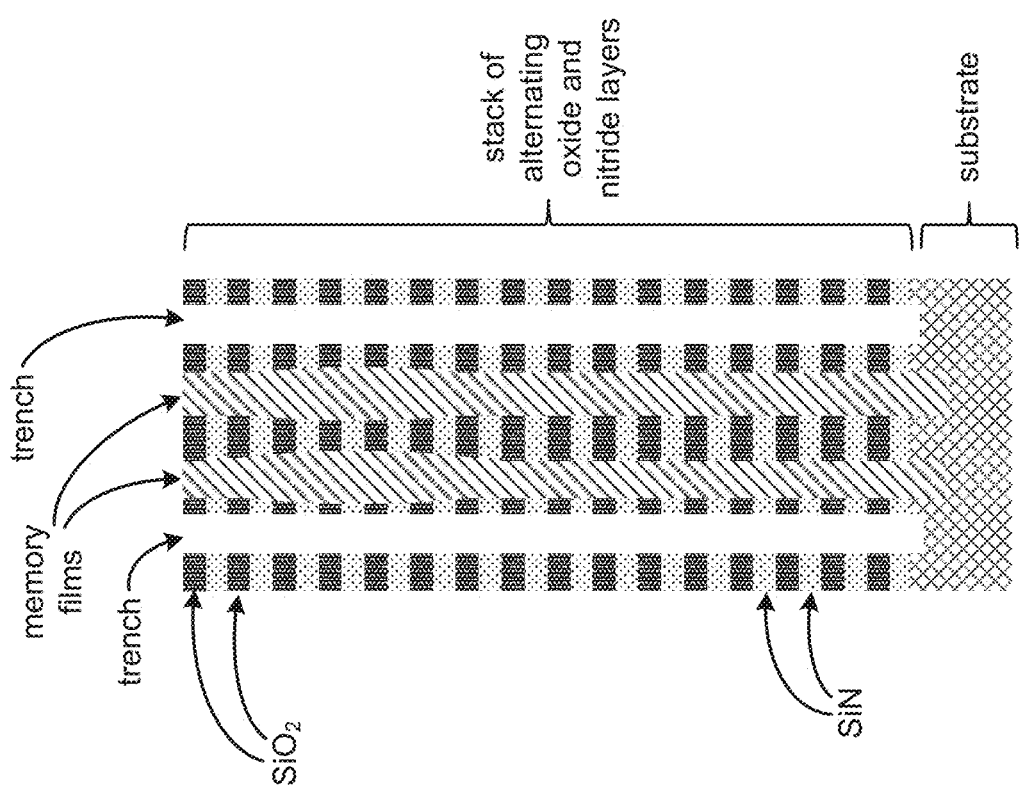
Figure 29F:
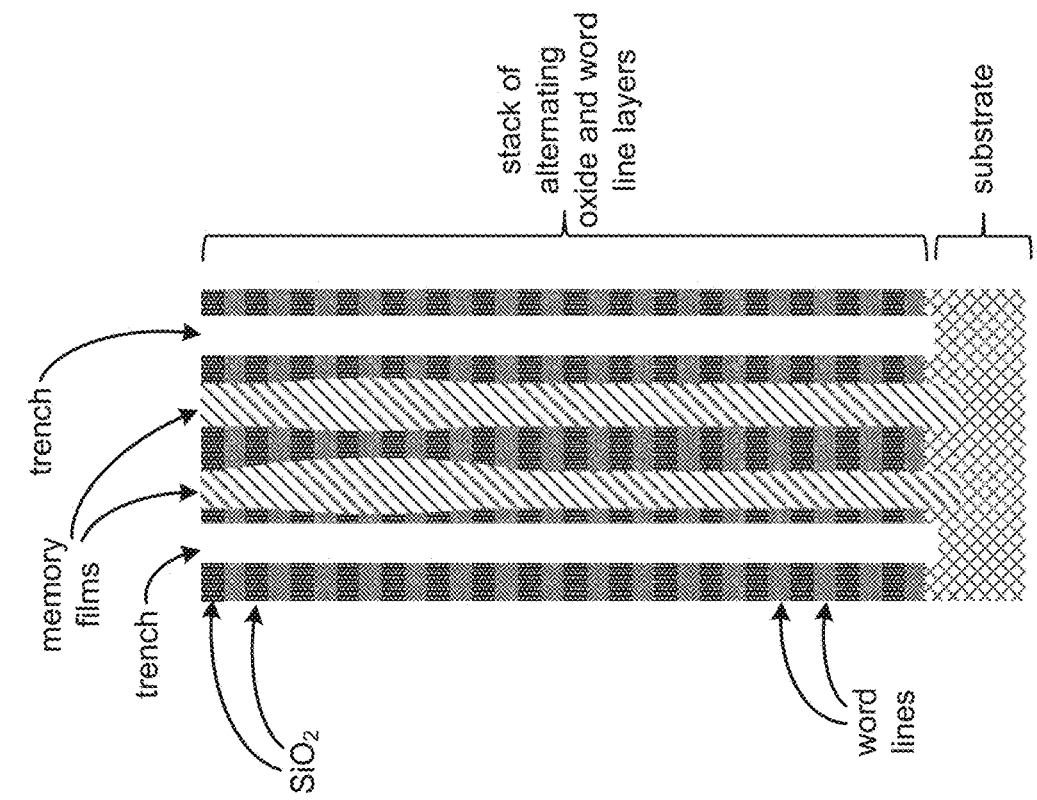

Once the memory hole are etched, any remaining hard mask is removed and the memory holes can be filled with the memory film layers, such as those in the embodiment illustrated above with respect FIG. 10. Once the memory holes are filled, another patterned hard mask can be formed on top of the structure and a set of trenches etched into the structure. In later steps, these trenches can be used for forming local interconnects, for example, connecting source lines running under the NAND strings to global source lines running across the top of the array. FIG. 29C shows the structure after the memory holes have been filled, trenches etched, and any remaining hard mask used to form the trenches has been removed. As shown in FIG. 29C and later such figures, the trenches run into and out of the page. At this point, the nitride layers are removed resulting in the structure of FIG. 29D in order to create a space in which the control gates along the word lines and the select gates are formed for the NAND string.

Figure 29E:
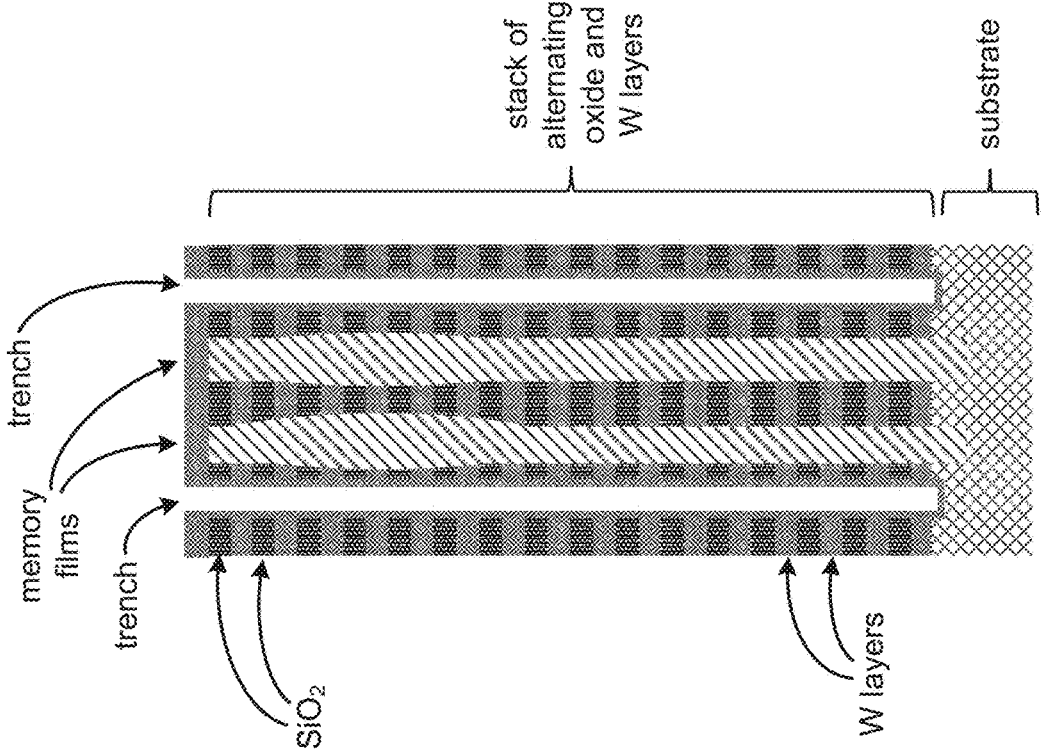

FIG. 29E illustrates the structure after the word line material of, in this embodiment, tungsten (W) has been deposited, both replacing the nitride layers and also leaving a lining layer in the trench openings and on top of the structure. The excess metal gate material is then removed from on top of the structure and within the trench regions, resulting in the structure of FIG. 29F of alternating layers of the oxide and the tungsten of the word line/gates formed over the substrate, with the memory holes filed and the trench regions still empty. This completes the gate replacement portion of processing, after which later steps, such as filling of the trenches and forming global bit lines, global source lines, and other structures formed on top of the structure of FIG. 29F.

One embodiment for depositing the tungsten layers of FIG. 29E is through use of tungsten hexafluoride (WF$_6$) though the reaction of:

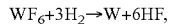

WF$_6$+3H$_2$→W+6HF, where each tungsten hexafluoride molecule reacts with three hydrogen molecules (H$_2$), so that for each tungsten atom deposited six molecules of hydrogen fluoride (HF) are generated. Hydrogen fluoride is an acidic and highly corrosive substance that attacks the gate dielectrics of the memory device's structure when the HF degasses from the gate regions, as can be illustrated with respect to FIG. 30.

Figure 30:
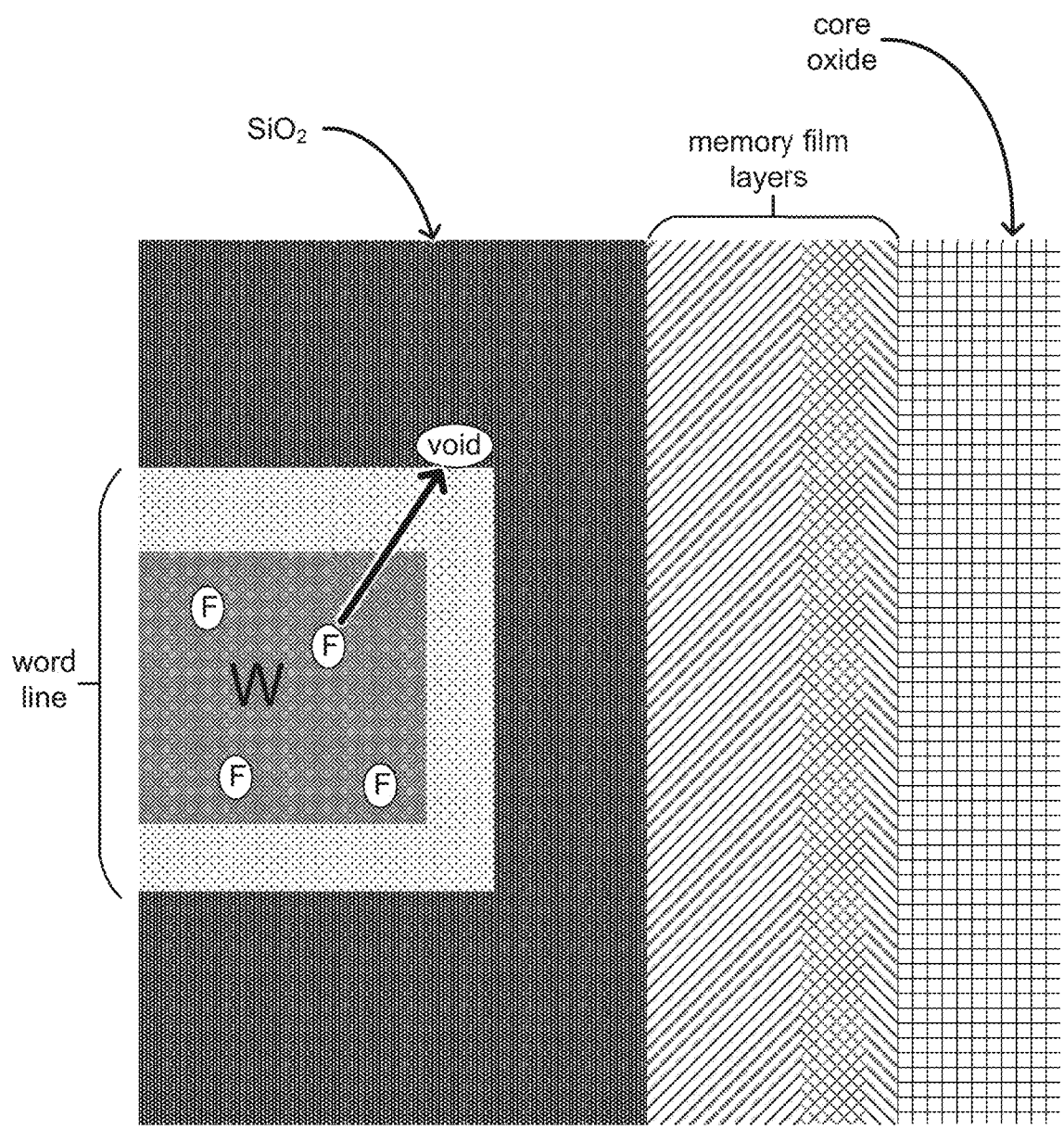
FIG. 30 is a schematic representation of the of the creation of voids due to fluorine degassing.

FIG. 30 is a schematic representation of the creation of voids due to fluorine degassing. FIG. 30 illustrates a region of the larger memory structure where a word line/control gate is adjacent to a memory hole. The vertically oriented memory hole includes a core oxide region and a number of memory film layers, such as the blocking layer, oxide, charge trap layer, tunnel layer, and channel region embodiment illustrated with respect to FIG. 10. The control gate or word line includes a central region, formed using tungsten hexafluoride, commonly surrounded by one or more additional layers (represented as the lighter stippling) such titanium nitride (TiN), aluminum oxide (Al$_2$O$_3$), and/or other material. Around the word line structure is the dielectric of SiO$_2$. In the metal replacement process illustrated in FIGS. 29A-F, the fluorine residue from the tungsten deposition (schematically represented as the Fs in the ovals) degas, such as during an anneal process, and the corrosive HF molecules can migrate into the oxide regions and generate voids, as illustrated in the image of FIG. 28. As this results in less dielectric material, this can cause problems such as leakage between word lines and programming failures. Although discussed here in the context of the word lines and surrounding dielectrics of a memory device, the techniques presented here are more generally to other situations when there are voids due to agents such as fluorine used to form conducting layers adjacent to material such as oxides than can be damaged by the corrosive agent, as well as to features other than voids that can be determined from cross-sectional images.

Figure 31:
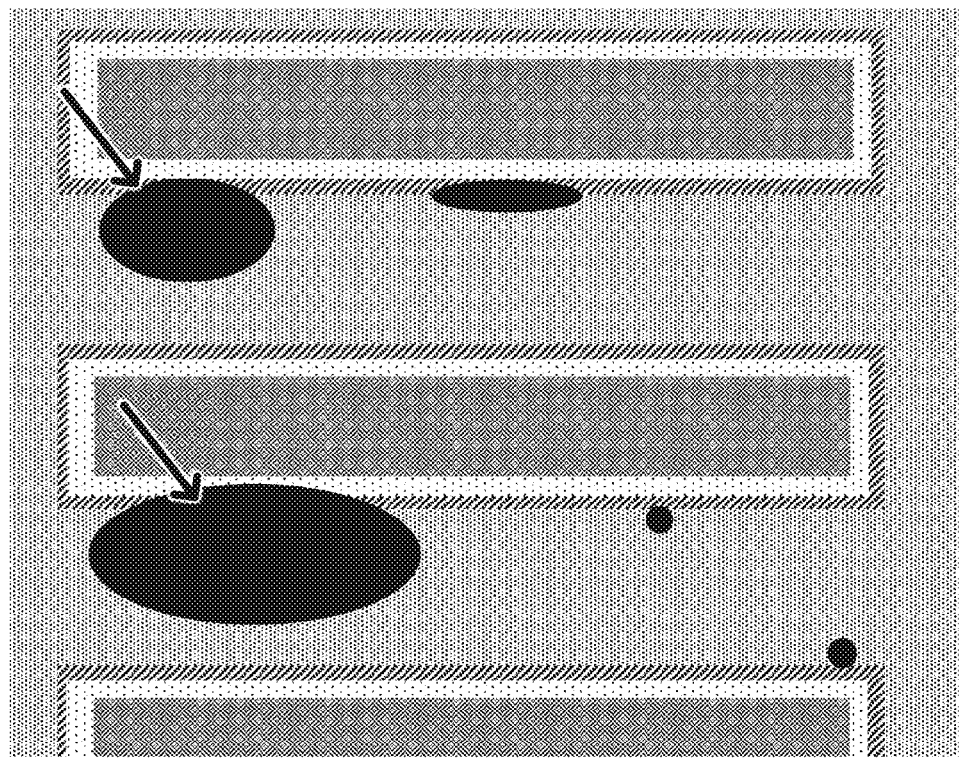
FIGS. 31 and 32 are detail views of FIG. 28.
Figure 32:
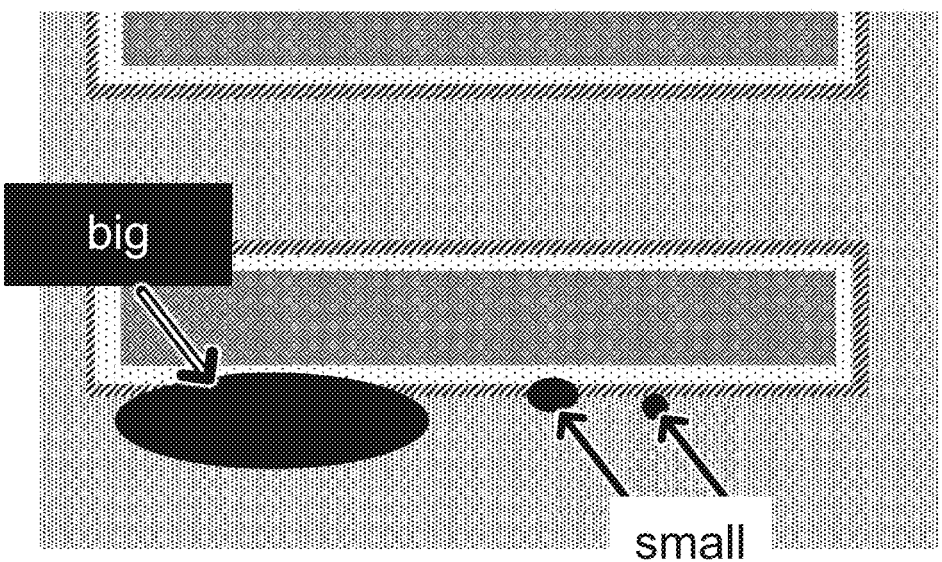

Returning to FIG. 28 and the defects illustrated there, these voids can vary in location, size, and shape. This can be seen in FIGS. 31 and 32 that are details of FIG. 28. In FIG. 31, as illustrated by the added arrows, two large voids are shown on each of two gate structures. This sort of large void, elongated along the word line direction, has significant oxide erosion that can cause leakage between word lines, rendering the word lines unusable. In the detail view of FIG. 32, the shown control gate/word line has several voids, including one big void, indicated at the added white centered arrow and labelling, and two small dot shaped voids, indicated at the added black centered arrows and labelling. As can be seen from the images, identification of these differing sort of defects is a complicated process. Previously, to detect and classify such F-degas voids or other features/defects visible from such views, cross-sectional scanning electron microscope images would be taken across memory structure. Engineers must look at the SEM images and mark out the F-degas voids, a manual detection process can take up to an hour to process just one image, so that this approach is very laborious and prone to human error. Due to these limitations, such a manual void detection as a process screening methodology is not overly useful for determining process parameters for concentrations, times, temperatures, and types of agents used.

To address this shortcoming, the techniques described above based on the use of CNNs and their derivatives such as regional CNNs, including faster-RCNNs and Mask-RCNNs, can, after proper training, can be used to identify and locate F-degas voids in cross-sectional SEM images for F-degas evaluation purposes. The use of codes, such as python, can be used to automatically translate the pixel coordinates of detected F-degas voids into their positions in 3D memory structure (such as word line and memory hole location), hence generating a summary of void information. Such an approach can significantly accelerate F-degas structural analysis speeds and enables screening and comparison of process conditions without electrical lot evaluation testing, which takes longer time and more resources.

More specifically, among the aspects of the embodiments presented here for cross-sectional images include the use of machine-learning algorithms to process images automatically and identify defects, such as voids, and classify these by type of defect, such as void size and shape and confidence level for presence of a defect. This can be used for the automatic binning and quantification of defects according to size and shape and for establishing correlations of voids to exact locations in a 3D structure to enable process analysis. During the training process, manual correction of machine detected voids can be determined and used to further train the machine learning model to detect more types of voids or, more generally, other features/defects with higher accuracy. As with the examples described above with, for example, respect to memory hole shapes or critical dimensions, pixel level resolution can provide pixel level precision for the identification of voids or other features. The following discussion will continue to be based on the example of voids in a 3D memory structure, but it will be understood that these techniques can more generally be applied to other defects or features that can be analyzed from cross-sectional images, such as feature word line, memory hole layer, or other feature shapes that can be analyzed similarly to the top-view memory hole shape features discussed above.

Concerning the training of a CNN model to detect F-degas voids or other features, one or more samples are prepared and cross-sectional electron microscope images are generated. The features can be labelled and be characterized according to various criteria, such as formation mechanism and impact on device operation. This can be illustrated with respect to FIGS. 33 and 34A-C.

Figure 33:
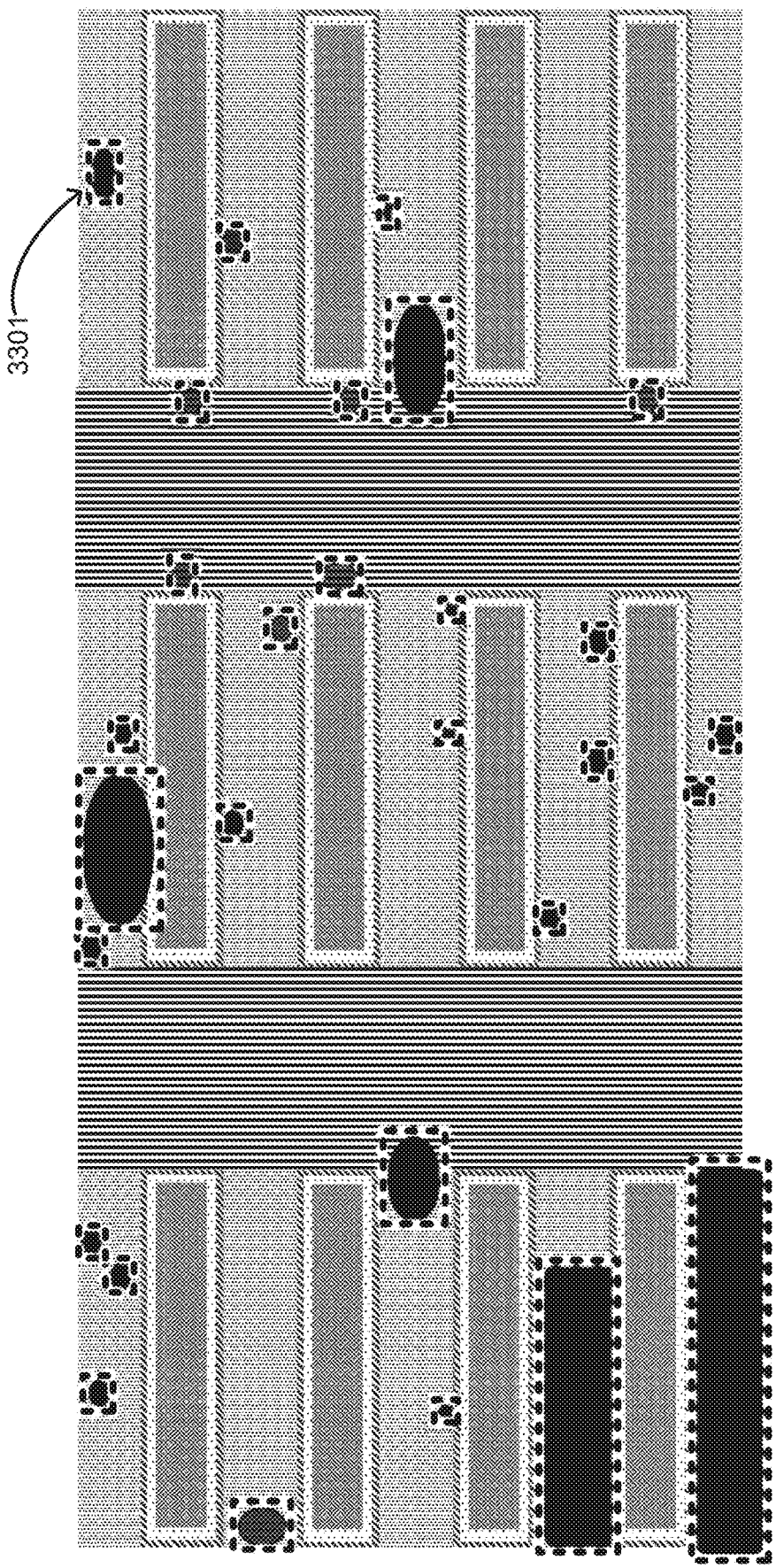
FIG. 33 is a cross-section image of a memory device, similar to the view of FIG. 28, but with the features marked out by bounding boxes.
Figure 34A:
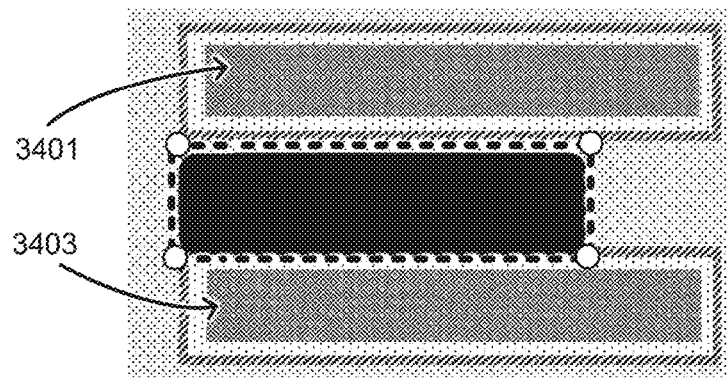
FIGS. 34A-C are detail of differing types of the features of FIG. 33.
Figure 34B:
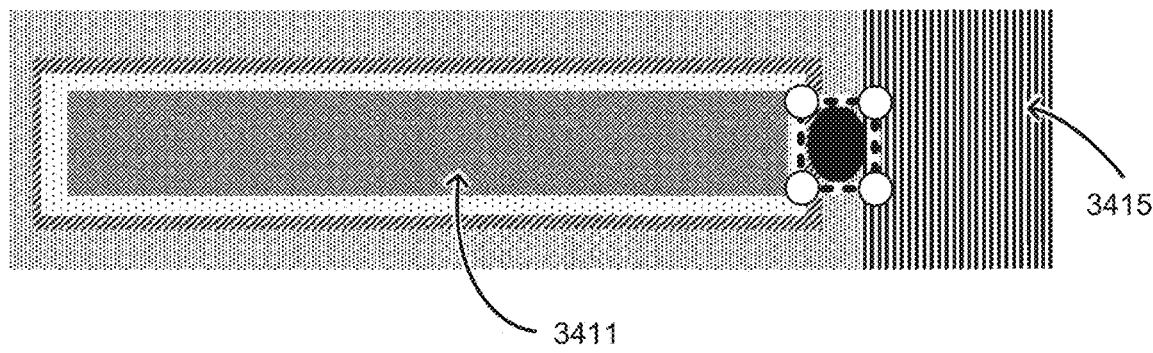
Figure 34C:
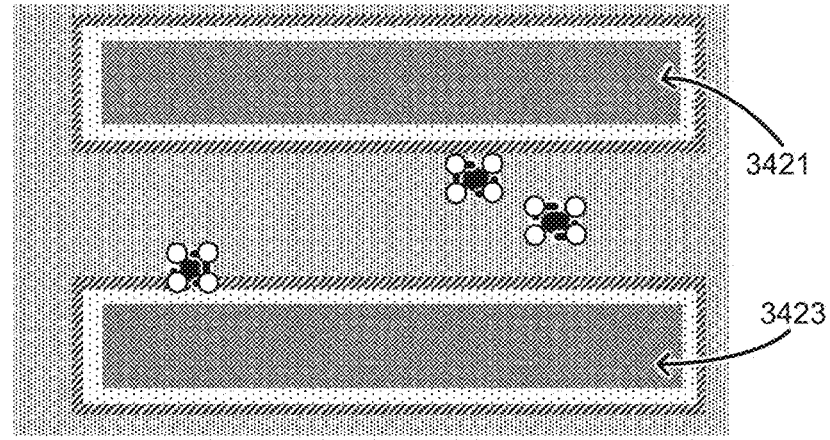

FIG. 33 is a cross-sectional image of a memory device, similar to the view of FIG. 28, but with the features marked out by bounding boxes, and FIGS. 34A-C are detail of differing types of these features. More specifically, in FIG. 33 identifies voids that, in an actual SEM generated image, can be manually labelled by a bounding rectangular box with points at the corners. The bounding boxes around the features (void in this example) are the dashed bounding boxes, where one example is marked out at 3301. These features can then be categorized by type based, for example, their formation mechanism and their expected impact.

FIGS. 34A-C show some examples of features (i.e., voids) categorized by type and size. (Please note that the scale varies between these figures.) FIG. 34A shows an example of a large void in the dielectric layer between a pair of word lines 3401 and 3403. This void will lead the word lines to short to each other, resulting in a catastrophic failure such that the two word lines, and perhaps a whole memory block, are not usable. FIG. 34B illustrates a relatively small void in the bounding box located between a word line 3411 and a memory hole 3415. The void of FIG. 34B will not result in the sort of catastrophic failure as that of FIG. 34A, but the reduced amount of dielectric between the gate of word line 3411 and the memory films of memory hole 3415 means that one or more of programming speed and level, read level, and erase speed and level may be effected. FIG. 34C shows several smaller voids between word lines 3421 and 3423 that, although they may not lead to the same sort of catastrophic failure as in FIG. 34A, they may increase the amount of word line to word line capacitive coupling and consequent disturb level. After the labelling of the voids or other features in the electron microscope images, training can be performed.

In one embodiment for the training of a CNN model, the labelled data can be separated in three parts: training data, testing data, and validation data. The training and testing data can be used to fine-tune the weights in the neural network to minimize the prediction error (or loss). The validation data is data that is not 'exposed' to the neural network model for training purposes, but used for validating whether the model works as expected or not.

Figure 35:
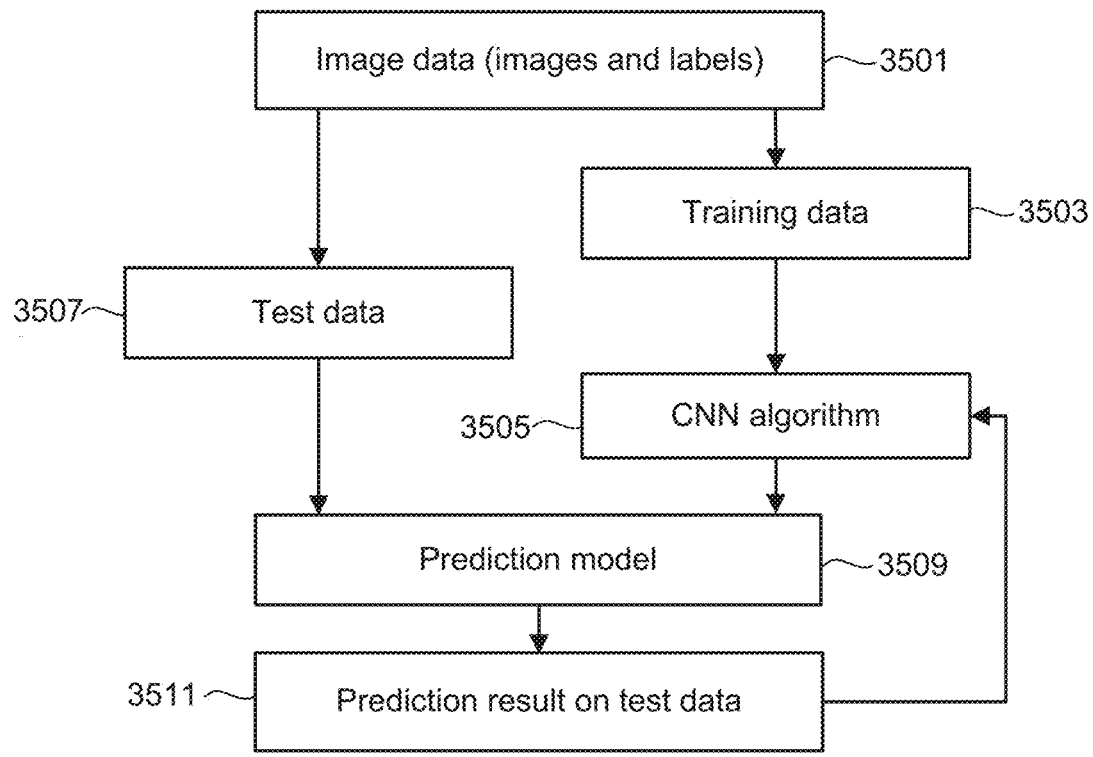
FIG. 35 is a high level block diagram of the training/testing process for pixel level void detection and data analysis based on cross-sectional electron microscope images.

FIG. 35 is a high level block diagram of the training/ testing process and is complementary to the techniques previously described. After preparing the samples and generating cross-sectional electron microscope images at 3501, some or all of the images and their labelling are provided as training data 3503, from which is generated an CNN algorithm at 3505. The CNN model of 3505 is then used for the prediction model 3509. Some or all of the images and their labelling are also provided at 3507 as test data for prediction model, where the test data 3507 will typically be largely or whole distinct of the training data 3503, as using training data as test data will generally not provide as useful for testing. The prediction results on the test data then follow at 3511 of the process, which can then loop back to 3505 so that, based on prediction error (loss), the model can be fine-tuned to minimize error.

Once the CNN model is trained to detect F-degas voids or other features, the weights of the model can be saved in storage media, such as a hard drive, a solid state drive or other medium usable as memory from where they can be accessed by a server or processor (e.g., one or more of a CPU (central processing unit), GPU (graphic processing unit), TPU (tensorflow processing unit), and NPU (neural processing unit) devices, among others). The weights can then be loaded into the model, and the model is ready to make predictions and detect the F-degas voids or other features that it intends to find. In one set of embodiments, the weights can be stored in flash memory or storage class memory based memory circuits to perform for a compute-in-memory approach to inferencing that does not require the loading of weight values. The model can be applied to the images, such as illustrated in FIG. 28, generated from samples to detect voids or other features of interest, such as illustrated in FIG. 33, that can then be characterized and assigned a type and also, in some embodiments, a confidence level.

In the machine learning process of FIG. 35, the processing circuitry and software can detect the voids, label them, and log the pixel level coordinates within the cross-sectional electron microscope images. These pixel coordinates can then be translated into the 3D memory structure locations for the convenience of further data processing to provide a table of void information summary that could, for example, list the X, Y coordinates, type label, area, confidence score, corresponding location in the circuit (e.g., a word line number), and other characterizing information.

Figure 36:
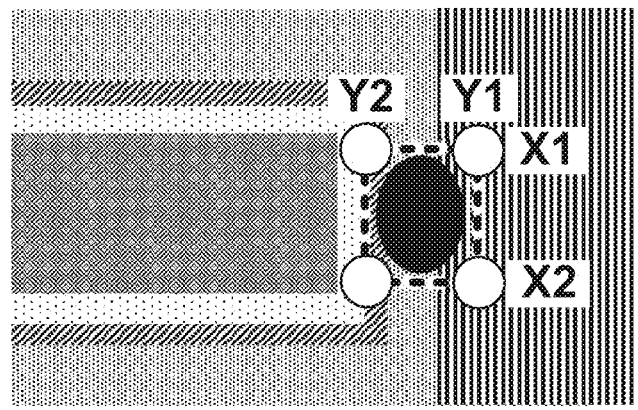
FIG. 36 illustrates an example of a void whose location is determined at the pixel level within an image.

FIG. 36 illustrates an example of a void whose location can be determined at the pixel level within an electron microscope image. An example of a rectangular bounding box for one of the detected voids is highlighted. The position of the void is identified by the pixel level coordinates X1, X2 and Y1, Y2 and the area of the void size is (X2−X1)*(Y2−Y1). The void information then be used to analyze and compare different processing parameters. For example, the F-degas voids result during the metal related processing steps used to form the word line/gate structures, so that process engineers can use the void information to plot sigma plot data to compare void amount and void size for different processing times, concentrations, temperatures, and types of agents used, for example.

Although the preceding discussion of applying neural networks to cross-sectional images has focused on voids within a 3D non-volatile memory circuit, these techniques can also be applied to other defects or features and other kinds of integrated circuits. For example, voids can form by the mechanism described above or other mechanism in other devices in which a metal layer is adjacent to a dielectric layer. With respect to other features, the above techniques can be applied to features such as gate structures or the alignment of bonded circuits (e.g., array chip 1410 and CMOS chip 1420 of FIG. 14) in a cross-sectional view, much as described for memory holes in a top-down view. In any of these cases, the disclosed methods can significantly reduce the processing time involved in detecting and analyzing defects and can readily be extended to other areas of process development that involves accelerated defect creation and defect recognition on cross-sectional scanning electron microscopes, cross-sectional transmission electron microscopes, or other metrology techniques.

Figure 37:
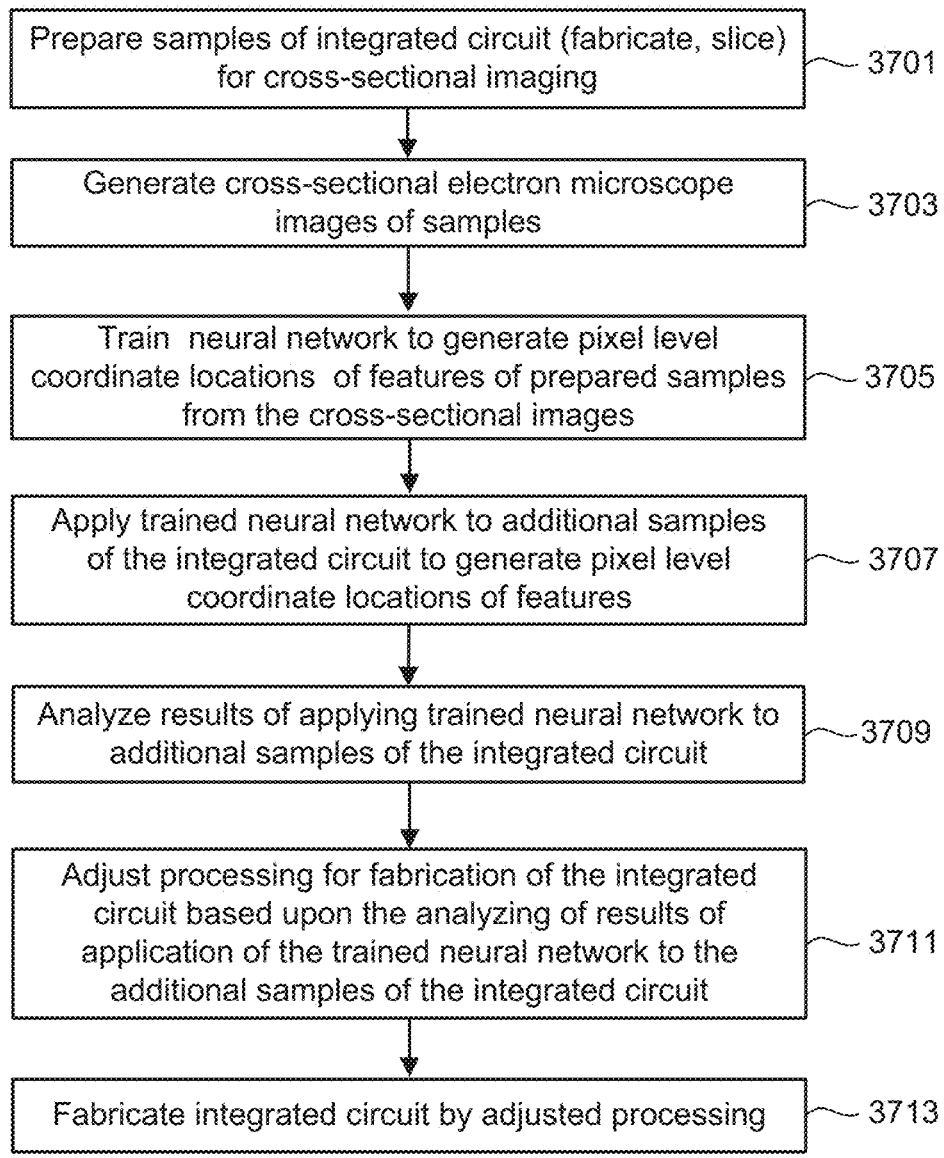
FIG. 37 is a flowchart for one embodiment of the application of neural networks to the cross-sectional image data.

FIG. 37 is a flowchart for one embodiment of the application of neural networks to the cross-sectional image data. The flow of FIG. 37 is similar to those presented above, such as in FIG. 11 or FIG. 21, and much of the discussion there can also be application to this case, but FIG. 37 is now focused on the cross-sectional image based embodiments.

At step 3701, a set of training samples for the non-volatile memory or other integrated circuits are prepared for cross-sectional imaging, where this can include fabricating the examples of the circuits or receiving the examples and slicing them to present the view from which the electron microscope images are generated at step 3703. Training of the neural network is performed at step 3705, where this can be any of the neural network variations described above (P-Mask-RCNN, faster-RCNN, etc.) or other neural networks. In this embodiment, the neural network is trained to generate pixel level coordinate locations of the prepared training samples of the integrated circuits that were generated by electron microscope at step 3703. For example, the pixel level coordinate data can the corners of bounding boxes for features such the F-degas or other voids in the circuit or features such as shapes and locations of feature such as gate structure or how elements of bonded dies align.

Figure 38:
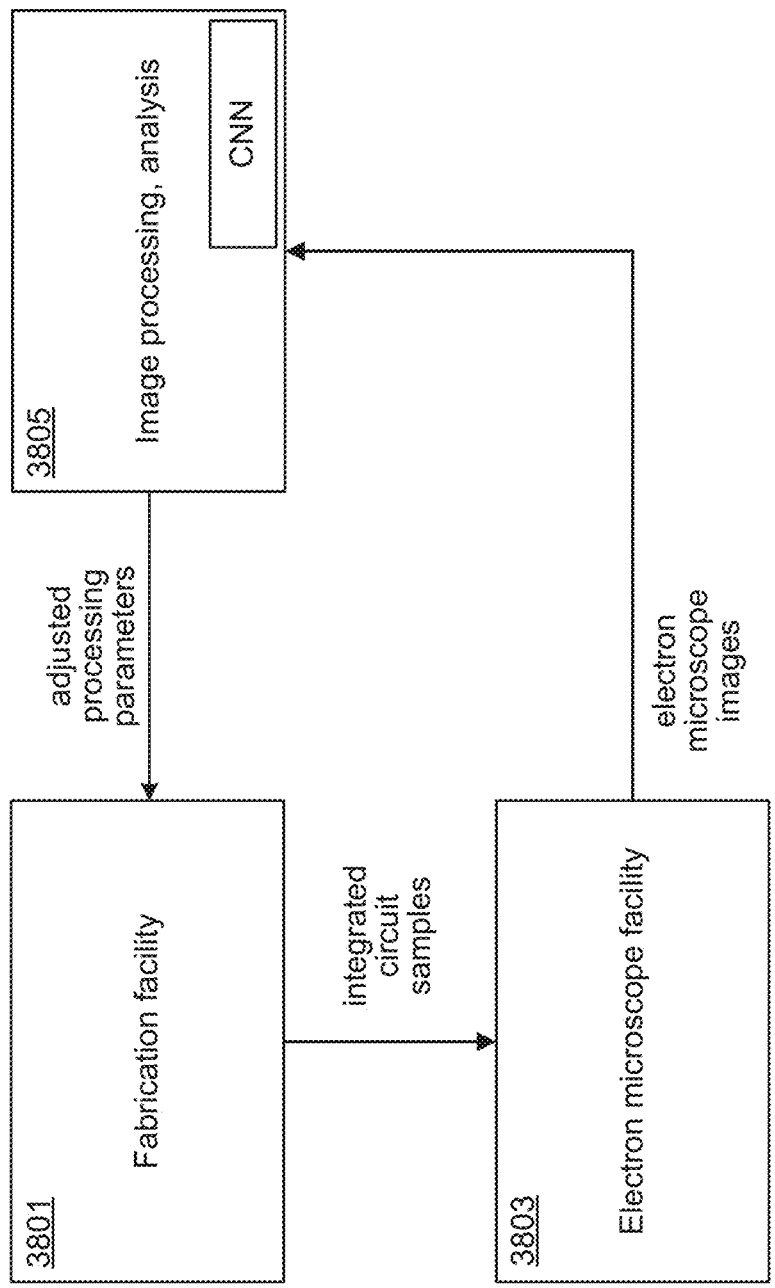
FIG. 38 represents an embodiment for the different physical facilities in which the processes of FIG. 37 could be performed.

FIG. 38 represents an embodiment for the different physical facilities in which the processes of FIG. 37, as well as FIGS. 11, and 21 above, or FIG. 39 below, could be performed. The fabrication facility 3801 is the manufacturing facility, including cleanrooms and other facilities, in which the memory dies or other integrated circuits are manufactured. After being manufactured, the integrated circuits can then be transferred to an electron microscope testing facility 3803. The electron microscope testing facility 3803 may be part of, located nearby, or remote from the fabrication facility 3801, or at a different location that would require shipping. The electron microscope testing facility 3803 generates and, depending on the embodiment, prepares both the training samples and testing samples, the electron microscope images for use of the neural networks to analyze. The electron microscope images, for both training data and test data can be transferred to the image processing and analysis facility 3805, with the various data sets of cross-sectional images from the electron microscopes for a set of memory circuits or other integrated circuits provided to an image processing and analysis facility 3805, where this can be one or more locations, including the fabrication facility 3801 or electron microscope testing facility 3803, or other locations, such as in the cloud.

With respect to the image processing and analysis facility 3805, including CNNs or other applications of machine learning and neural networks, this can be implemented by one or more processors using hardware, firmware, software, or a combination of these. The software used can be stored on one or more processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals. The training phase is typically more computationally intensive and can be performed in the cloud, for example, while inferencing may be performed more locally, such as on computational facilities at the fabrication facility. Examples of the processing units that can be used for the machine learning can include one or more of CPU (central processing unit), GPU (graphic processing unit), TPU (tensorflow processing unit), and NPU (neural processing unit) devices, among others.

Returning to the flow of FIG. 37, at step 3707 the trained neural network is applied to one or more additional samples of the integrated circuit to generate pixel level coordinate locations of the features of the one or more additional samples of the integrated circuit, that can then be analyzed at step 3709. The analysis can be to detect and categorize features such as the area of voids and feature shapes, where binning can be performed for feature type (shape, size) and, in some embodiments, correlate these detected features to circuit elements of the integrated circuits, such as word lines/gate structures, alignment of different bonded die elements, or other features. Based on the analysis of step 3709, at step 3711 the processing parameters (such as temperatures, concentrations, times, or other processing paraments) are adjusted. Subsequently, the memory device or other integrated circuits can then be fabricated by the fabrication facility 3801 using the adjusted processing parameters at step 3713.

Figure 39:
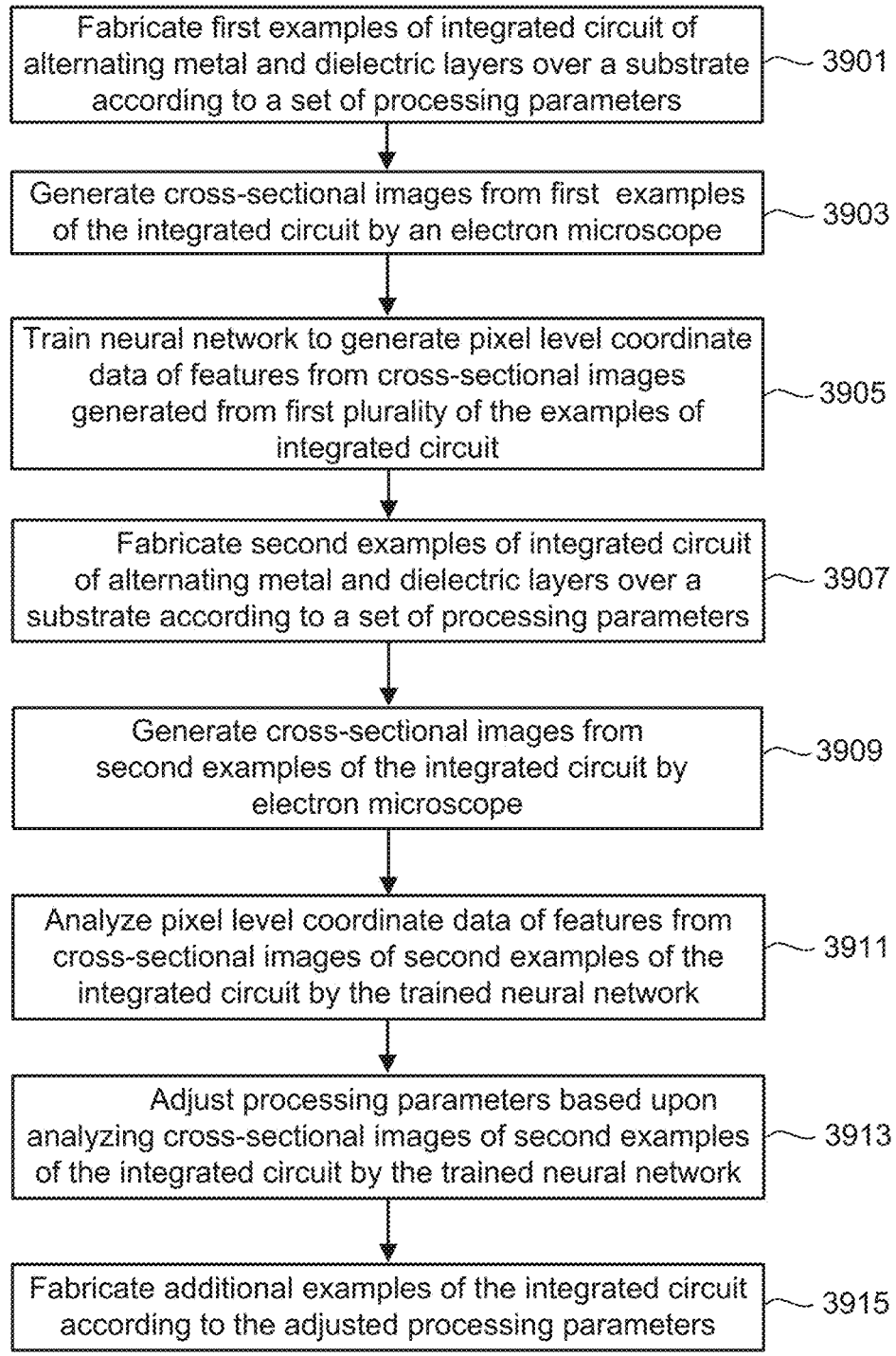
FIG. 39 is a flowchart for a more specific application to a 3D memory of one embodiment of the application of neural networks to the cross-sectional image data.

FIG. 39 is a flowchart for a more specific application to a 3D memory of one embodiment of the application of neural networks to the cross-sectional image data. FIG. 39 is complementary to the flow of FIG. 37, but focused on the primary example of voids in a 3D memory circuit. Step 3901 is the fabricating of training examples of an integrated circuit, such as a non-volatile memory circuit having a three dimensional architecture, by forming alternating plurality of metal layers and dielectric layers over a surface of a substrate where the conductive or metal layers are word lines and the dielectric layers include one or more inter-word line dielectric layers. Cross-sectional images of the training examples of the integrated circuit are generated by an electron microscope at step 3903. A neural network is then trained at step 3905 to generate pixel level coordinate data of features, such as voids in the inter-word line dielectric layers, from the of cross-sectional images generated from the first plurality of the examples of the integrated circuit. At step 3907, another plurality of testing examples of the integrated circuit is formed as alternating layers of metal layers and dielectric layers over a surface of a substrate according to a set of processing parameters are fabricated. These examples can be formed at the same time as the testing examples of step 3901 or separately. Cross-sectional images of the testing examples are generated by electron microscope at step 3909.

In step 3911 the pixel level coordinate data of features, such as shape, size, and location, from the cross-sectional images of the testing examples of the integrated circuit are analyzed by the trained neural network, with the processing parameters adjusted at step 3913 based on the analysis at step 3911. One or more additional examples of the integrated circuit are then fabricated with the adjusted processing parameters at step 3915.

In a first set of embodiments, a method includes preparing a first plurality of samples of an integrated circuit for cross-sectional imaging and generating by an electron of microscope of cross-sectional images of the first plurality of prepared samples of the integrated circuit. A neural network is trained to generate pixel level coordinate locations of features of the first plurality of prepared samples of the integrated circuit from the cross-sectional images generated by the electron microscope. The trained neural network can be applied to one or more additional samples of the integrated circuit to generate pixel level coordinate locations of the features of the one or more additional samples of the integrated circuit. The method also includes: analyzing results of the applying of the trained neural network to the one or more additional samples of the integrated circuit; adjusting processing for fabrication of the integrated circuit based upon the analyzing of the results of the application of the trained neural network to the one or more additional samples of the integrated circuit; and fabricating the integrated circuit by the adjusted processing.

In further embodiments, a method includes fabricating a first plurality of examples of an integrated circuit by forming alternating plurality of metal layers and dielectric layers over a surface of a substrate and generating a plurality of cross-sectional images from the first plurality of the examples of the integrated circuit by an electron microscope. A neural network is trained to generate pixel level coordinate data of features from the plurality of cross-sectional images generated from the first plurality of the examples of the integrated circuit. The method also includes fabricating a second plurality of examples of the integrated circuit by forming alternating layers of metal layers and dielectric layers over a surface of a substrate according to a first set of processing parameters and generating a plurality of cross-sectional images from the second plurality of the examples of the integrated circuit by an electron microscope. Pixel level coordinate data of features from the plurality of cross-sectional images from the second plurality of the examples of the integrated circuit is analyzed by the trained neural network. The method further includes adjusting the first set of processing parameters based upon the analyzing the plurality of cross-sectional images from the second plurality of the examples of the integrated circuit by the trained neural network; and fabricating one or more additional examples of the integrated circuit according to the adjusted first set of processing parameters.

In additional embodiments, a system includes one or more processors. The one or more processors configured to: receive, from an electron of microscope, cross-sectional images of a plurality of prepared training samples of an integrated circuit produced at a fabrication facility; from the plurality of prepared training samples of the integrated circuit, train a neural network to generate pixel level coordinate locations of features of the plurality of prepared training samples of the integrated circuit from the cross-sectional images from the electron microscope; apply the trained neural network to one or more additional samples of the integrated circuit produced at the fabrication facility according to a set of processing parameters to generate pixel level coordinate locations of the features of the one or more additional samples of the integrated circuit; analyze results of the applying of the trained neural network to the one or more additional samples of the integrated circuit; determine adjusted processing parameters for fabrication of the integrated circuit based upon the analyzing of the results of the application of the trained neural network to the one or more additional samples of the integrated circuit; and provide the adjusted processing parameters to the fabrication facility for subsequent fabrication of the integrated circuit.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. h It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method, comprising:
preparing a first plurality of samples of an integrated circuit for cross-sectional imaging;
generating by an electron microscope of cross-sectional images of the first plurality of prepared samples of the integrated circuit;
training a neural network to generate pixel level coordinate locations of features, the pixel level coordinate locations including pixel level coordinates of corners of a bounding box for the features, of the first plurality of prepared samples of the integrated circuit from the cross-sectional images generated by the electron microscope;
applying the trained neural network to one or more additional samples of the integrated circuit to generate pixel level coordinate locations of the features of the one or more additional samples of the integrated circuit;

analyzing results of the applying of the trained neural network to the one or more additional samples of the integrated circuit;

adjusting processing for fabrication of the integrated circuit based upon the analyzing of the results of the application of the trained neural network to the one or more additional samples of the integrated circuit; and fabricating the integrated circuit by the adjusted processing.

2. The method of claim 1, wherein preparing a first plurality of samples of an integrated circuit for cross-sectional imaging includes:

fabricating a plurality of integrated circuits comprising a plurality of layers formed over a surface of a substrate; and slicing the fabricated plurality of integrated circuits perpendicularly to surface of the substrate.

3. The method of claim 1, wherein preparing a first plurality of samples of an integrated circuit for imaging includes:

fabricating a plurality of integrated circuits each having a plurality of layers formed upon a substrate, wherein the features include voids in the integrated circuits.

4. The method of claim 3, wherein the plurality of layers include alternating layers of a plurality of metal layers and dielectric layers and the voids are voids in the dielectric layers.

5. The method of claim 1, wherein preparing a first plurality of samples of an integrated circuit for imaging includes:

fabricating a plurality of integrated circuits each having a plurality of layers formed upon a substrate, wherein the features include shapes of features in the integrated circuits.

6. The method of claim 1, wherein analyzing results of the applying of the trained neural network to the one or more additional samples of the integrated circuit includes determining an area of features of the one or more additional samples of the integrated circuit.

7. The method of claim 1, wherein analyzing results of the applying of the trained neural network to the one or more additional samples of the integrated circuit includes performing a binning operation of the features according to type.

8. The method of claim 1, wherein analyzing results of the applying of the trained neural network to the one or more additional samples of the integrated circuit includes correlating the pixel level coordinate locations of features to elements of the integrated circuits.

9. The method of claim 1, wherein adjusting processing for fabrication of the integrated circuit includes:

adjusting a temperature.

10. The method of claim 1, wherein adjusting processing for fabrication of the integrated circuit includes:

adjusting a concentration.

11. The method of claim 1, wherein adjusting processing for fabrication of the integrated circuit includes:

adjusting a time.

12. A method, comprising:

fabricating a first plurality of examples of an integrated circuit by:

forming alternating plurality of metal layers and dielectric layers over a surface of a substrate;

generating a plurality of cross-sectional images from the first plurality of the examples of the integrated circuit by an electron microscope;

training a neural network to generate pixel level coordinate data of features from the plurality of cross-sectional images generated from the first plurality of the examples of the integrated circuit;

fabricating a second plurality of examples of the integrated circuit by:

forming alternating layers of metal layers and dielectric layers over a surface of a substrate according to a first set of processing parameters;

generating a plurality of cross-sectional images from the second plurality of the examples of the integrated circuit by an electron microscope;

analyzing pixel level coordinate data of features from the plurality of cross-sectional images from the second plurality of the examples of the integrated circuit by the trained neural network;

adjusting the first set of processing parameters based upon the analyzing the plurality of cross-sectional images from the second plurality of the examples of the integrated circuit by the trained neural network; and fabricating one or more additional examples of the integrated circuit according to the adjusted first set of processing parameters.

13. The method of claim 12, wherein the integrated circuit is a non-volatile memory circuit having a three dimensional architecture.

14. The method of claim 13, wherein the metal layers include a plurality of word lines and the dielectric layers include one or more inter-word line dielectric layers.

15. The method of claim 14, wherein the features include voids in the inter-word line dielectric layers.

16. The method of claim 12, wherein analyzing pixel level coordinate data of features from the plurality of cross-sectional images from the second plurality of the examples of the integrated circuit by the trained neural network includes:

determining a shape for each of the features.

17. The method of claim 12, wherein analyzing pixel level coordinate data of features from the plurality of cross-sectional images from the second plurality of the examples of the integrated circuit by the trained neural network includes:

determining a size for each of the features.

18. The method of claim 12, wherein analyzing pixel level coordinate data of features from the plurality of cross-sectional images from the second plurality of the examples of the integrated circuit by the trained neural network includes:

determining a pixel level location for each of the features.

19. A system, comprising:

one or more processors, the one or more processors configured to:

receive, from one or more electron microscopes, cross-sectional images of a plurality of prepared training samples of an integrated circuit produced at a fabrication facility;

from the plurality of prepared training samples of the integrated circuit, train a neural network to generate pixel level coordinate locations of features, the pixel level coordinate locations including pixel level coordinates of corners of a bounding box for the features, of the plurality of prepared training samples of the integrated circuit from the cross-sectional images from the one or more electron of microscopes;

apply the trained neural network to one or more additional samples of the integrated circuit produced at the fabrication facility according to a set of processing parameters to generate pixel level coordinate locations of the features of the one or more additional samples of the integrated circuit;

analyze results of the applying of the trained neural network to the one or more additional samples of the integrated circuit;

determine adjusted processing parameters for fabrication of the integrated circuit based upon the analyzing of the results of applying the trained neural network to the one or more additional samples of the integrated circuit; and provide the adjusted processing parameters to the fabrication facility for subsequent fabrication of the integrated circuit.

* * * * *